United States Patent [19]

Hashimoto et al.

[11] 4,306,294
[45] Dec. 15, 1981

[54] COMBINED ELECTRONIC CALCULATOR AND ELECTRONICALLY TUNING RADIO RECEIVER

[75] Inventors: Shintaro Hashimoto, Ikoma; Junji Aoki; Hideo Yoshida, both of Kashihara; Shigenobu Yanagiuchi, Tenri; Kunio Yoshida, Nara, all of Japan

[73] Assignee: Sharp Kabushiki Kaisha, Osaka, Japan

[21] Appl. No.: 75,841

[22] Filed: Sep. 14, 1979

[30] Foreign Application Priority Data

Sep. 14, 1978 [JP] Japan ............................. 53-113302

[51] Int. Cl.³ .................... G06F 15/02; H04B 1/06
[52] U.S. Cl. .............................. 364/705; 455/154; 455/158; 455/165; 455/344
[58] Field of Search .............. 364/705; 455/150, 154, 455/158, 165, 182, 183, 216, 260, 344

[56] References Cited

U.S. PATENT DOCUMENTS

| | | | |
|---|---|---|---|
| 4,092,594 | 5/1978 | Baker | 455/158 |
| 4,097,810 | 6/1978 | Aschwanden | 455/158 |
| 4,120,036 | 10/1978 | Maeda et al. | 364/705 |
| 4,120,037 | 10/1978 | Sato | 364/705 |
| 4,156,281 | 5/1979 | Hirano et al. | 364/705 |
| 4,161,708 | 7/1979 | Friberg et al. | 455/154 X |

*Primary Examiner*—Jerry Smith
*Attorney, Agent, or Firm*—Birch, Stewart, Kolasch & Birch

[57] ABSTRACT

A new and effective combination is disclosed wherein both a calculator and an electronically tuning radio receiver are governed by common control circuitry and a microprocessor implements the major portion of the calculator and also implements or governs the electronically tuning radio receiver and a digital timekeeper. For example, it is possible for the operator to listen to a radio program of a desired frequency and continue operating the calculator whenever he likes, while the calculator is in use. If the radio receiver is provided with a time switch function, then it is possible to obtain on-time information and immediately execute calculations on the one-time information obtained, thus enhanceing maneuverability.

22 Claims, 32 Drawing Figures

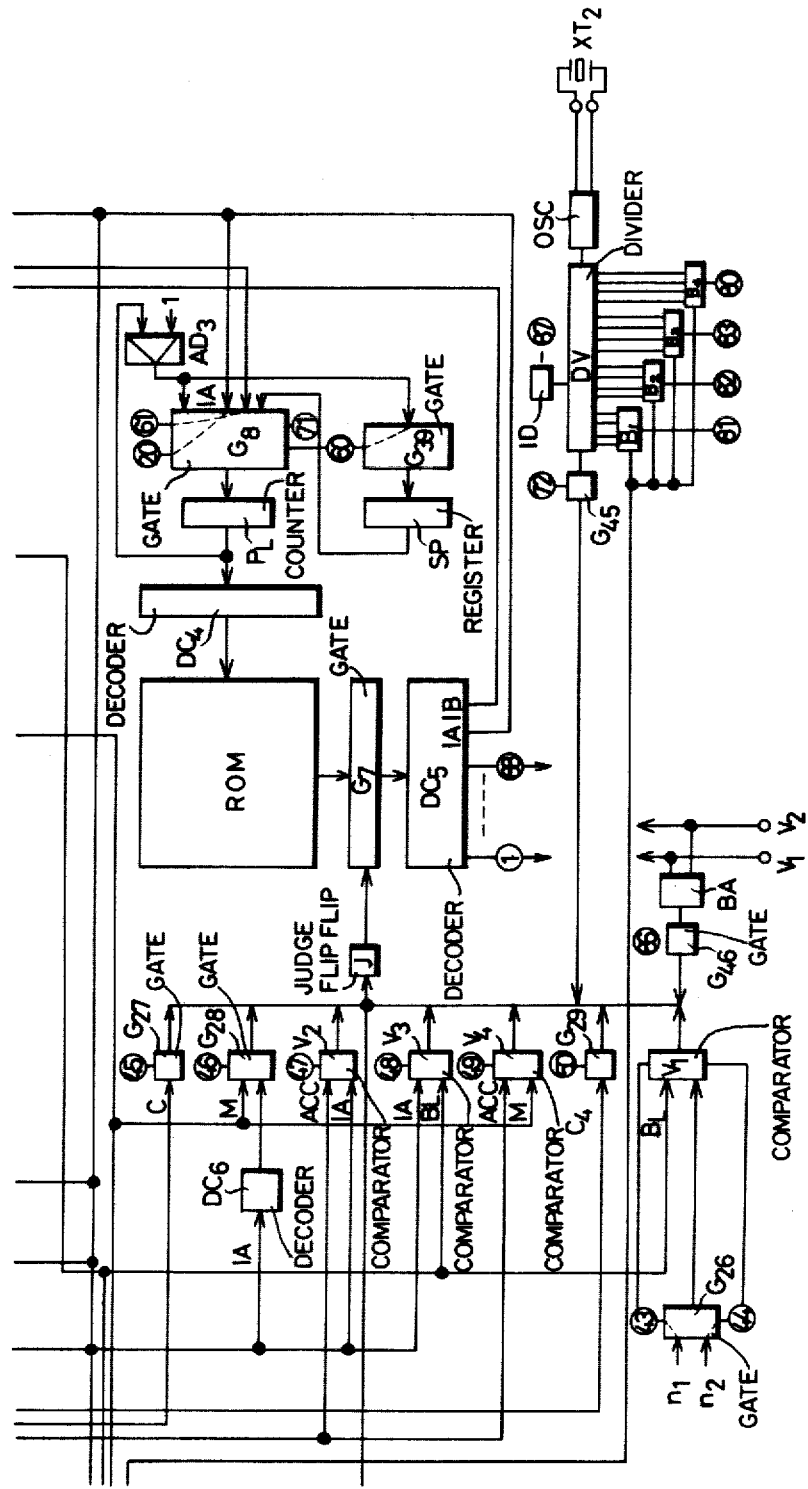

FIG. 5

| | 000 | 001 | (l) 010 | 011 | (m) 1×0 | 1×T |
|---|---|---|---|---|---|---|
| 0 | X 1 | Y 1 | down | Z 1 | down | M 1 |
| 1 | 2 | 2 | CH₁ md | 2 | CH₃ md | 2 |
| 2 | 3 | 3 | up | 3 | up | 3 |
| 3 | 4 | 4 | down | 4 | down | 4 |
| 4 | 5 | 5 | CH₂ md | 5 | CH₆ md | 5 |
| 5 | 6 | 6 | up | 6 | up | 6 |
| 6 | 7 | 7 | down | 7 | TIMR 1(CH) | 7 |
| 7 | 8 | 8 | CH₃ md | 8 | 2(M) | 8 |
| 8 | 9 | 9 | up | 9 | 3(10M) | 9 |
| 9 | Xₛ x | Y₃ y | down Zₛ | z | 4(H) Mₛ | M_D |
| A | KL | KU | CH₄ md | STORE | 5(10H) | T 1(S) |
| B | CHANGE | SLEEP B | up | STACK | ALM 1(CH) | 2(10S) |
| C | Snund Sup Sdwn | SLEEP A | fr₁ fr_Q | j | 2(M) | 3(M) |
| D | A R B D | Auto on Search W TIMER | E_r SET | down | 3(10M) | 4(10M) |
| E | f₄ f₃ f₂ f₁ | cL M ⓟ | HX ALM PD PR | f_Q md | 4(H) | 5(H) |
| F | C P S MUTE CPS alm m CH | % Me ⓗ | EQ PA A₁ B₁ | FM up | 5(10H) | 6(10H) |

DECB / INCB / INCB

| KU/KL | 1 K₁ | 2 K₂ | 4 K₃ | 8 K₄ |
|---|---|---|---|---|
| 0 | O₄₈ |  | 0 | C/CE | SLEEP |
| 1 | O₄₇ | ROCK | 1 | RC M | → |
| 2 | O₄₆ | 9-100 | 2 | % | ← |
| 3 | O₄₅ | 9-50 | 3 | PM = | AUTO SEARCH |
| 4 | O₄₄ | 10-100 | 4 | AM + | AM |
| 5 | O₄₃ | 10-200 | 5 | ▶ M− | FM |
| 6 | O₄₂ |  | 6 | ▶▮ M+ | Freq |
| 7 | O₄₁ |  | 7 | SEC − | CH1 |
| 8 | O₃₂ |  | 8 | MIN × | 2 |
| 9 | O₃₈ |  | 9 | HOUR ÷ | 3 |
| A | O₃₇ |  | • | CLK | 4 |
| B | O₃₆ |  | PRESET SCAN | TIMER | 5 |
| C | O₃₅ |  | ON/OFF | ALM | 6 |
| D | O₃₄ |  |  | ♪ |  |

4,306,294

COMBINED ELECTRONIC CALCULATOR AND ELECTRONICALLY TUNING RADIO RECEIVER

BACKGROUND OF THE INVENTION

This invention relates to a multi-purpose electronic apparatus and more particularly an electronic apparatus with calculator functions and electronically tuning radio receiver functions and, if desirable, timekeeper functions.

It is an object of the present invention to provide electronics which enable an integral and efficient combination of an electronic calculator and an electronically tuning radio receiver and/or an electronic timekeeper. More particularly, the object of the present invention is achieved by a microprocessor semiconductor LSI chip.

The functions of an electronic calculator are generally focused on the conventional four-rule calculations and executed in an interrupted manner of key actuations→arithmetic operations→displays. A display mode occupies a substantial amount of time while the calculator is in use, whereas a calculation mode is available for only a very limited length of time per day, for example. A pause period for the control circuitry of the calculator is therefore relatively very long. It is desirable to take advantage of operability of the control circuitry of the calculator for other than continuous calculator use. For example, provided that the calculation mode is interrrupted at the time when such interruption has no influence on arithmetic operations, for example, a display mode after the completion of calculations, it would be possible to realize real-time multiplexing of the control circuitry.

A conventional radio receiver, on the other hand, is tunable by varying the capacitance or inductance of a tuning circuit, for example, by a mechanical device. The conventional radio receiver could be expected only to serve as a special-purpose device. In recent years, a new tuning method, a so-called electronically designed digital tuning method has been developed to exploit new fields of the radio receiver. The digital tuning method replaces the conventional tuning circuit by a phase locked loop ("PLL") which essentially consists of a variable (programmable) divider, a phase detector, a low pass filter and a reference frequency oscillator. The reception frequency of the PLL tuning circuit is determined by input data applied to the programmable divider as digital codes which makes it possible to put digital tuning into practical use.

In addition, recently developed electronic timekeepers have been designed to operate in a digital fashion.

OBJECTS AND SUMMARY OF THE INVENTION

In the light of the advanced development of technology as discussed above, the present invention is to provide a new and effective combination wherein both a calculator and an electronically tuning radio receiver are governed by common control circuitry and wherein a microprocessor implements the major portion of the calculator and also implements or governs an electronically tuning radio receiver and a digital timekeeper. For example, the present invention makes it possible for the operator to listen to a radio program of a desired frequency and continue operating the calculator whenever he likes, while the calculator is in use. If the radio receiver is provided with a time switch function, then it is possible to obtain on-time information and immediately execute calculations on the one-time information obtained, thus enhanceing maneuverability. Combined time switch, alarm, reception and calculation functions are very effective to catch on-time information such as news, stock quotations, rates of foreign exchange, the outcomes of government managed horse races, etc., and to execute immediate calculations associated with the on-time information, correct deviations of the digital timekeeper in comparison with time announcements from the radio receiver, and implement digital tuning and enable programmed tuning.

Various features of the present invention are as follows:

(1) As briefly described above, calculations can be executed while the operator is listening to stock quotations, for example, through the use of the calculator and radio receiver functions. The radio receiver can also be turned ON and OFF at any desired time through the case of the timekeeper functions.

(2) The digitally tuning radio receiver is easily controllable by the microprocessor and more particularly by microinstructions similar to those governing the calculator and the timekeeper. In other words, the radio receiver is controlled by sequentially fetching from a fixed memory (say, a read only memory ROM) as in the calculation and the timekeeper.

(3) Once a specific divider value has been sent to the PLL tuning circuit of the radio receiver to select a desired broadcasting program, a storage means (register) becomes unnecessary for calculating the divider value and is thus available for other purposes, for example, as a working register of the calculator. It follows that a considerable reduction of the capacity of a memory is possible, thus reducing the size and cost of the overall apparatus. Data concerning received broadcasting program can be loaded into a storage position of a register which is not in use in the calculator mode. The operator can operate the calculator while listening to the radio. The above described register may be implemented with a random access memory (RAM).

(4) Moreover, the divider value indicative of a desired tuning frequency which is to be sent to the PLL can be calculated in the same manner as in arithmetic operations of the calculator such as the four-rule calculations. Devices associated with arithmetic operations, for example, an adder, an accumulator, address counters for the RAM and ROM and address decoders are useful for the calculator as well as the radio receiver. Both the calculator and the radio receiver may be governed by the common microprocessor.

(5) Provided that the radio receiver and the calculator are governed by substantially the same sequence of operations, only a single ROM is needed for storing various instructions and all that is necessary to control the radio receiver and the calculator is to fetch in sequence the instructions from the ROM. No particular instruction is required for the radio receiver.

(6) The reception frequency of the radio is preselectable via digit keys and a decimal point key both of which are conventionally used in the calculator mode. As a result, only a reduced number of keys are necessary with an accompanying reduction of the size of the overall apparatus.

(7) It is possible to display data concerning the radio receiver on a display, for example, channels received in the form of numerals and bands received in the form of symbols, the display being further capable of displaying calculation results or keyed information in the calculator mode. This provides simplicity of control of the circuitry for the display and the display per se.

(8) A counter not only counts the number of shifts of a register in the calculator in the progress of calculations but also serves as a counter in the radio receiver for counting the number of words being transferred into the PLL. This facilitates control circuitry for various counters and keeps the capacity of the RAM from increasing for storing counts of the various counters.

(9) Whether the reception of any radio program is possible is determined by a register contained within the calculator. If impossible, a display of error is provided. The reception disable condition occurs when digits outside the AM reception serviceable frequencies, 522–1610 KHz, for example, 1700 kHz and 500 kHz are introduced or digit keys including a decimal key, for example, 630.5 kHz are entered (it is noted that the comparison frequency of the PLL tuning circuit is scaled in a unit of 1 kHz).

(10) Data entered for the calculator or for the radio receiver can be stored into a common register provided that key actuations for the calculator and tuning operations are carried out at a different point in time and the entered data is stored for only a brief period of time. This eliminates the need for increasing the capacity of the RAM and enables key entry for the calculator and the radio receiver by a common routine to thus eliminate the need for any increase in the capacity of the ROM.

(11) Calculation results and tuning frequencies are displayed on the same display panel.

(12) At a given period of time after a preset time, the calculator operation terminates and the updated output of the timekeeper appears on the display. The operation of the radio receiver also comes into a stop after the passage of a given period subsequent to a preselectable point in time. This reduces power dissipation within the system.

(13) A preselectable time for an alarm and a timer can be sensed during the non-arithmetic period of the calculator by recalling data already stored within the RAM and render the radio receiver operative upon the arrival at the preselectable time stored therein. In the event that the preselectable time is reached during the use of the calculator for calculations and displays, the operator can continue the calculations without being anxious about time.

(14) If the digit keys or a [C/CE] key is actuated while updated time is being displayed, then the display comes to display the calculated results or entered data of the calculator. On the other hand, upon the actuation of any keys associated with the radio receiver, for example, a channel scan key

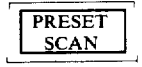

an auto search key

an up key [→] or a down key [←] the display is then devoted to a radio receiver display mode and provides a display of "4ch 1310^AM". for example. Moreover, if any key associated with the radio receiver is actuated during the calculator display period, the display provides a display associated with the radio receiver. Upon the actuation of a time recall key (real time and preset time) the display is then devoted to a timekeeper display.

The display also turns from the radio display mode to the calculator display mode upon the actuation of a digit key or the clear key [C/CE] and into the timekeeper display mode upon actuation of the time recall key. In this way the display is automatically switchable to the calculator display mode, or the timekeeper display mode selector.

(15) In association with (14) without actuation of the time recall key, the display is further automatically switchable from the calculator display mode to the real time display mode upon the passage of a given period of time. During the operation of the radio receiver the display can change from the channel and frequency display mode into the real time or preset time display mode upon the passage of a given period of time. The calculator and radio receiver functions are not influential in executing the timekeeper functions.

(16) In connection with (15), the calculator display mode and the timekeeper display mode may be executed while the operator is listening to the radio receiver.

(17) After an alarm sound is released at a preset point in time, the radio receiver becomes operative to enhance the effects of the alarm.

(18) Characters, signs and symbols on the display can be used commonly for the calculator, the radio receiver and the timekeeper. For example, an "A" of an "AM" sign for the radio use can also be useful in providing a battery alarm and an "M" of an "AM or FM" sign useful in displaying a memory display. Such common use reduce the number of necessary display segments and terminals of the display.

(19) Preset mode switches are provided to preset radio channels and alarm times and correct deviations of the timekeeper.

(20) When a [SLEEP] key is actuated when the radio is in the ON state, the length of time until the turning OFF of the radio receiver can be varied (say, 60 min), that length of time being extended as long as the [SLEEP] key is kept actuated.

(21) Only broadcasting frequencies can be selected and for example a channel having a frequency higher than that currently displayed can be selected by either successive actuation of the UP key [→] or continued actuation of the UP key resulting in a continuous scan. Accordingly, if the operator desires to listen to a specific radio program, he has only to release the key when the proper frequency is displayed.

(22) All of preset channels (for example, CH₁ through CH₆) can be scanned every a few seconds.

(23) The channel identifying numbers are distinct from updated time or frequency by interposing a channel sign such as "ch" therebetween on the display. For example, 2ch 12–28. 6ch 106.85 FM.

(24) An error display is provided during key actuations for the radio receiver. Error is visually displayed, for example, when [8] [5] [.] [1] [AM] are actuated in sequence with the erroneous entry of [AM] in tuning 85.1 MHz of the FM band.

(25) A mute signal is supplied to a sound amplifier circuit to remove harsh noises in the power OFF state immediately before a radio power is turned OFF.

(26) A radio battery alarm is visually displayed on the common display to notify the operator of when to exchange the radio battery.

(27) If the reception frequency is not in agreement with one of correct broadcasting frequencies, then it is corrected and search operation is started. In the event that a non-serviceable broadcasting frequency is selected by actuations of the digit keys or a manual operation or automatic search operation, the reception frequency is incremented or decremented at every 10 kHz without being brought into exact agreement with serviceable broadcasting frequency. This results in failure to receive any radio stations.

(28) The radio receiver section is self adjustable to different broadcasting frequency allocations in different geographical areas. While the AM frequency band is of the same range of 522 kHz to 1620 kHz all over the world, the channel-to-channel frequency is 10 kHz in the United States and Japan and 9kHz in Europe.

In the case of FM broadcasting, the frequency range and the channel-to-channel frequency are as follows:

| Japan: | 75.0–90.0 MHz, 100kHz |
| U.S.: | 87.0–109.4 MHz, 200 kHz |
| Europe: | 87.0–109.49 MHz, 50kHz |

(29) There are provided various keys associated with the radio receiver such as the auto search key, the channel scan key, the channel key, the |AM| key, on the keyboard different from the digit keys and the functional keys for the calculator functions. This allows a higher degree of manipulation of the various keys.

(30) The alarm function not only generate an alarm sound at a preselectable alarm time but also sends a mute signal to the sound amplifier circuit within the radio receiver to prevent simultaneous generation of the alarm sound and the radio program sound.

(31) After the alarm sound continues generating for a given period of time, the radio receiver becomes operative the alarm sound is interrupted by the actuation of the radio [ON/OFF] key. When it is desired to shut off sounds from the radio receiver, this can be accomplished by two actuations of the [ON/OFF] key.

(32) A frequency display (say, "F" of FM reception) and a time display (say, "p" of "PM") are provided in part by enabling or disabling a combination of segments of the display.

(33) The overall device can serves as an antenna detector since the operator can operate the calculator while listening to the radio receiver.

BRIEF DESCRIPTION OF THE DRAWINGS

For a more complete understanding of the present invention and for further objects and advantages thereof, reference is now made to the following description taken in conjunction with the accompanying drawings, in which:

FIGS. 3A through 3D are logical wiring diagrams of an example of a microprocessor used in the apparatus;

FIG. 5 is a layout of a RAM contained within the microprocessor;

DETAILED DESCRIPTION OF THE PREFERRED EMBODIMENTS

A specific embodiment of the present invention will now be described in detail with reference to the accompanying drawings.

APPEARANCE OF THE APPARATUS AND KEYBOARD

Figure 1:
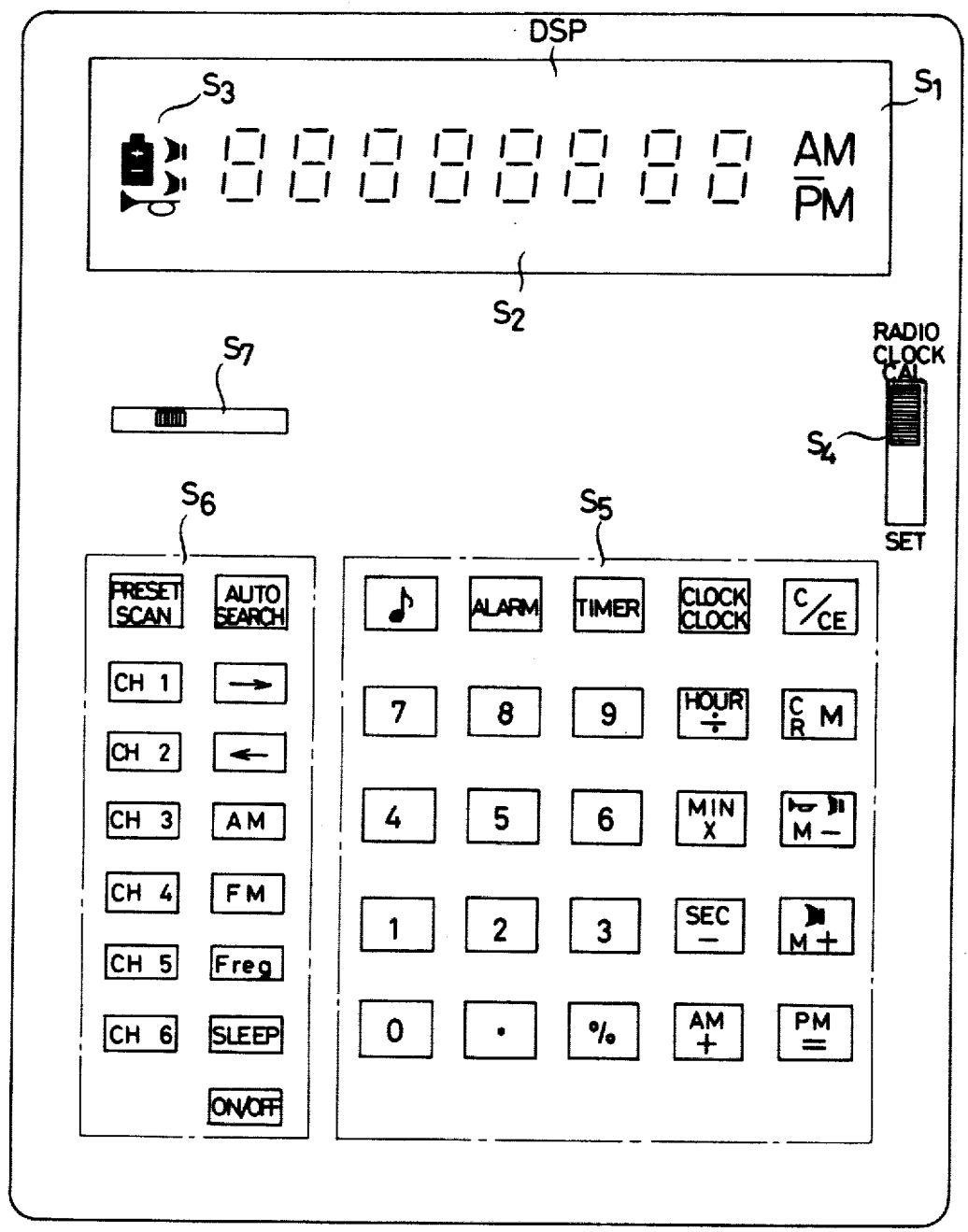
FIG. 1 is a plan view of an electronic apparatus according to one embodiment of the present invention.

Referring to FIG. 1, there is illustrated an electronic apparatus according to a specific embodiment of the present invention wherein a first display section $S_1$ is capable of displaying an AM or PM time system, an AM or FM reception band, the presence of information in memory M, a battery alarm M and a minus sign. A second display section $S_2$ is adapted to provide a display of calculated results, time, channels, and reception frequencies. A third display section $S_3$ provides an alarm display when generating an alarm sound, an indication that the radio receiver is functional a preset point in time, a timer display of a timer which will enable the radio receiver at a preset point in time, or a voltage drop display for the radio receiver. A symbol

is the radio battery alarm which disappears when a battery voltage lower than a predetermined value disables an oscillator. A mode selector $S_4$ is provided for selection of a realtime, alarm, timer or channel set mode and a radio, timekeeper or calculator mode. Keys $S_5$ contain digit keys, functional keys and time set keys. Operational keys $S_6$ associated with the radio receiver contain an [ON/OFF] key, a [SLEEP] key, a frequency display key, an up [→] key, a down [←] key, an auto search key, a channel key, a channel scan key, etc. A radio volume adjustment knob is labeled $S_7$ and the whole of a display DSP.

| ACTUATION OF KEYS | | |
|---|---|---|
| ① Time Correction | | |
| Key actuation | Display | Remarks |
| 10 [HOUR] | 10 - 00 00 | 24 hour system |
| 30 [MIN] | 10 - 30 00 | |
| 25 [SEC] | 10 - 30 25 | |
| [CLK] | 10 - 30 25 | |
| 10 [HOUR] | 10 - 00 00 | 12 hour system |
| 30 [MIN] | 10 - 30 00 | [AM] [FM] keys are actuable at any desirable time. |
| 25 [SEC] | 10 - 30 25 | |
| [AM] | 10 - 30 25$^{AM}$ | |
| [CLK] | | |
| ② Alarm, Timer setting | | |
| 11 [HOUR] | 11 - 00 00 | hours, minutes and hour system are preset in the same way as above |
| 27 [MIN] | 11 - 27 00 | |
| [CH3] | 3ch 11 - 27 ■► | (real time display in 8 seconds) |
| [ALARM] | 3ch 11 - 27 | |
| 9 [HOUR] | 9 - 00 00 | |
| 12 [MIN] | 9 - 12 00 | |
| [PM] | 9 - 12 00$^{PM}$ | |
| [CH5] | 5ch 9 - 12$^{PM}$ ■► | |
| [TIMER] | 5ch 9 - 12$^{PM}$ | |
| ③ Radio Operation and Preset by Digit Keys | | |
| [ON/OFF] | 522$^{AM}$ | (immediately after the exchange of a battery) |
| 830 | 830 | |
| [kHz] | 830$^{AM}$ | receives 830 kHz (real time display in 8 seconds) |
| SET MODE 1310 [kHz] | 1310$^{AM}$ | |
| [CH1] | 1ch 1310$^{AM}$ | |
| ④ Sleep Key | | |
| [SLEEP] | 60 - 00 | |
| release key | | timekeeper display in 1 second |
| [SLEEP] | 60 - 00 | |
| . | 50 - 00 | 1 second later |
| remain depressed | 40 - 00 | " |
| . | 30 - 00 | " |
| release key | | timekeeper display in |

-continued

| ACTUATION OF KEYS | | |
|---|---|---|
| | | 1 second |
| ⑤ Radio Operation and Preset by Digit Keys | | |
| [ON/OFF] | 1010$^{AM}$ | receives a previous channel |
| 830 | 830 | |
| [AM] | | 830$^{AM}$ receives 830 kHz (timekeeper display in 8 seconds) |
| 85.1 | 85.1 | |
| [FM] | | 85.1$^{FM}$ receives 85.1 MHz(FM) |
| SET MODE 1310 [AM] | 1310$^{AM}$ | |
| [CH1] | 1ch 1310$^{AM}$ | 1310 kHz in channel 1 preset (AM) |
| ⑥ Tuning by Auto Search | | |
| [ON/OFF] | 1310$^{AM}$ | receives a previous channel |
| [AUTO SEARCH] | 1310 → 1420$^{AM}$ | increases frequency |
| [AUTO SEARCH] | 1420 → 1480$^{AM}$ | stops as soon as correct frequency is received |
| ⑦ Tuning by [→](up) . [←](down) keys | | |
| [ON/OFF] | 1480$^{AM}$ | receives a previous channel |
| [DOWN] | 1470$^{AM}$ | channel-to-channel frequency (10 kHz) down |
| release key | | 1 second later |
| [DOWN] | 1460$^{AM}$ | |
| . | 1450$^{AM}$ | 1 second later |
| . | 1440$^{AM}$ | 1 second later |
| remain depressed | | |
| . | 1430$^{AM}$ | |
| release key | | |
| [UP] | 1440$^{AM}$ | 10 kHz up |
| ⑧ Tuning by Channel Keys | | |
| [ON/OFF] | 1440$^{AM}$ | receives a previous channel |
| [CH1] | 1ch 1310$^{AM}$ | receives a preset channel |
| [CH4] | 4ch 1010$^{AM}$ | |
| ⑨ Tuning by Channel Key | | |
| [ON/OFF] | 1010$^{AM}$ | receives a previous channel |
| [CH SCAN] | 6ch 85.1$^{FM}$ 5ch 1310$^{AM}$ | 5 second later 5 second later |
| [CH SCAN] | 4ch 1010$^{AM}$ | selects a channel |

Respective channels can be preset by not only the use of the digit keys but also the set mode after selection through any of the courses ⑥-⑨.

GENERAL DESCRIPTION OF THE APPARATUS

Figure 2:
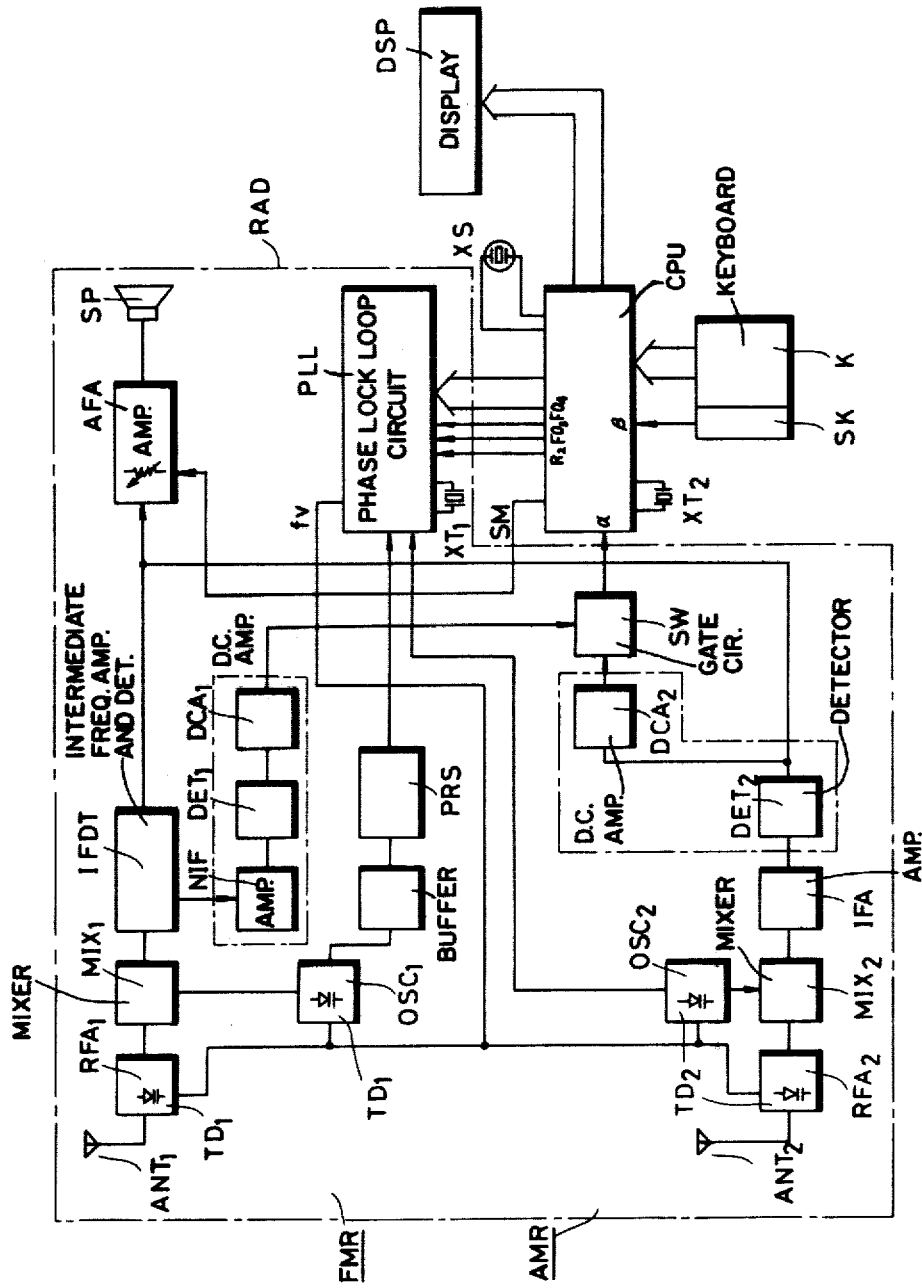
FIG. 2 is a block diagram of the overall apparatus of FIG. 1.

FIG. 2 illustrates a block diagram of the overall apparatus which primarily comprises a microprocessor CPU adapted to divide a time standard from a quartz oscillator $XT_2$ into a one-second signal for timekeeper and timer functions, execute arithmetic operations on data entered via a keyboard K and provide operation results for the display DSP for calculator functions, and provide a PLL (phase locked loop) with division values indicative of respective reception frequencies. There are further provided a mode selector SK (corresponding to $S_4$ of FIG. 1), a sound generating element XS for providing a key actuation sound and an alarm sound and a radio receiver section RAD. The PLL circuit decides the tuning frequency of the radio receiver section according to the division values supplied from the CPU. The radio receiver section RAD is divided into an AM receiver section AMR and an FM receiver section FMR each having a high frequency amplifier $RFA_1$ and $RFA_2$, a mixer $MX_1$ and $MX_2$, an oscillator $OSC_1$ and $OSC_2$ and a variable capacitance diode $TD_1$ and $TD_2$. The radio receiver section further includes an FM intermediate frequency amplifier and detector IFDT, narrow band intermediate frequency amplifier NIF, a detector $DET_1$, a direct current amplifier $DCA_1$ whose output goes to "1" upon the receipt of any FM broadcasting program, a buffer amplifier BUF, and a frequency divider PRS. The oscillation frequency of the $OSC_1$ is supplied to the PLL. The AM receiver section comprises an intermediate frequency amplifier IFA, a detector $DET_2$, and a direct current amplifier $DCA_2$ whose output goes to "1" upon the receipt of any AM radio program. A gate circuit SW allows the output of the $DCA_1$ and the output of the $DCA_2$ to be supplied to the microprocessor CPU upon the receipt of any FM and AM radio program, respectively. A sound amplifier AFA amplifies a sound signal and enables a loud speaker SP and, when the microprocessor CPU develops a mute signal SM, disables the loud speaker. NIF, DET and $DCA_1$ form a squelch circuit for the FM receiver section and $DET_2$ and $DCA_2$ form a squelch circuit for the AM receiver section. The gate circuit SW is associated with AM/FM selection. If an AM radio program is being received with a higher intensity, then the output of $DCA_2$ or the input to the microprocessor goes into "1" into otherwise "0". This is the case with FM reception.

If the operator desires to listen to a radio program of [AM], 1310 kHz, he manually actuates the associated keys, [ON/OFF], [1], [3], [1], [0] and [AM] so that the microprocessor sends "1765" as the division value to the PLL circuit. Upon the actuation of the [AM] key the microprocessor CPU places the radio receiver into the AM reception mode. The PLL circuit divides the oscillation frequency. If there is an agreement, the local oscillation frequency settles at 1765 kHz. Since the intermediate frequency appears at 455 kHz for AM reception, then an intended frequency of 1310 kHz is received.

CPU ARCHITECTURE

Figure 3A:
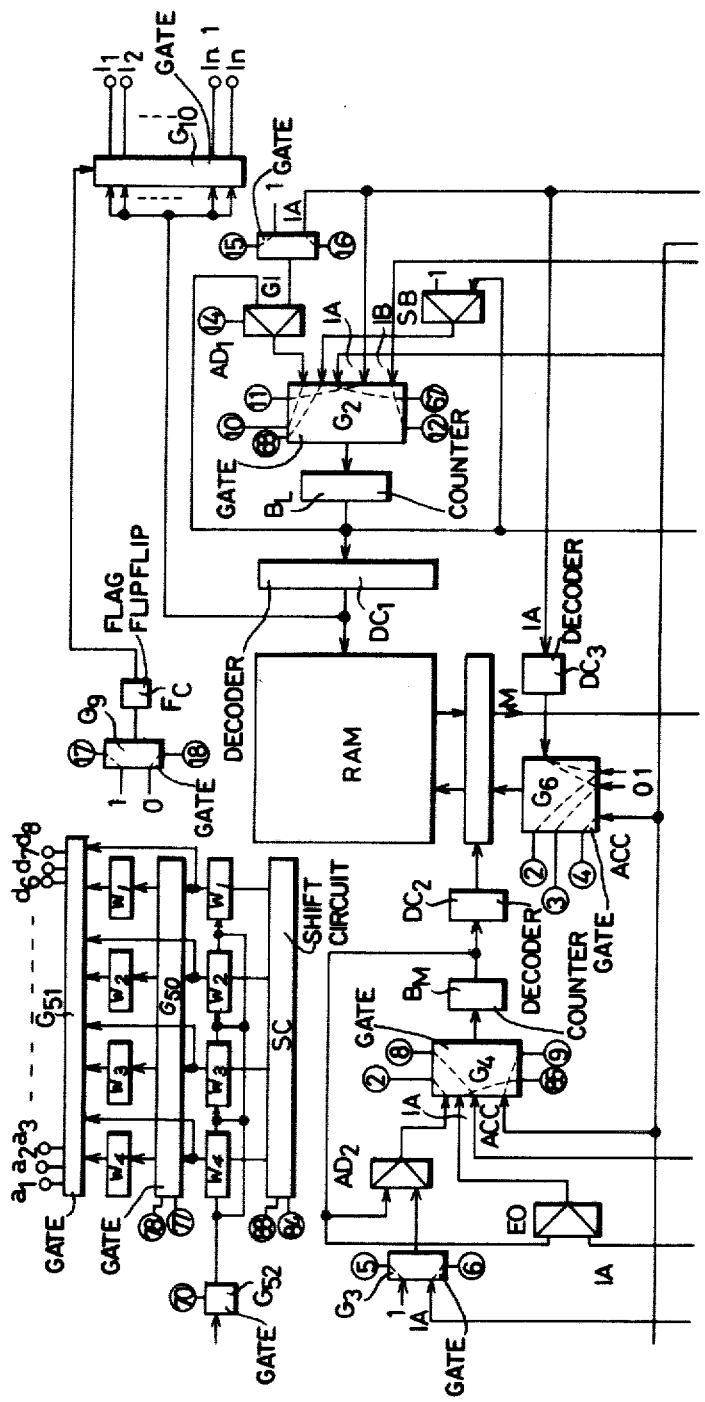
Figure 3C:
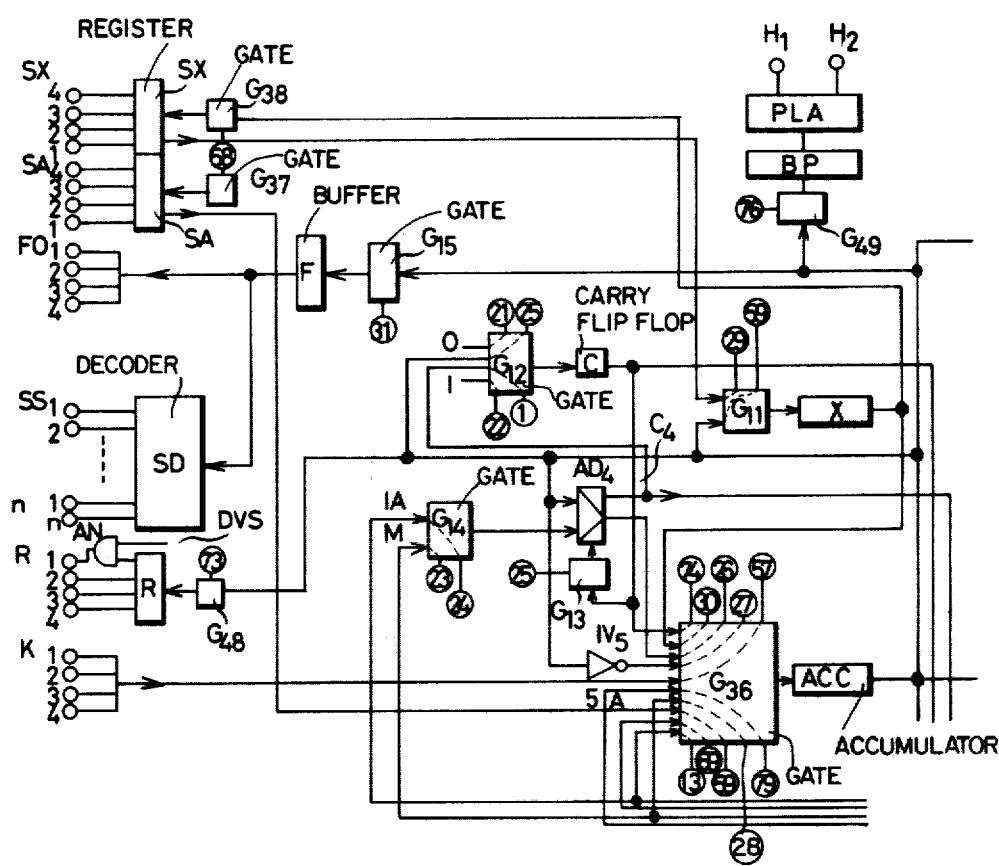
Figure 3D:
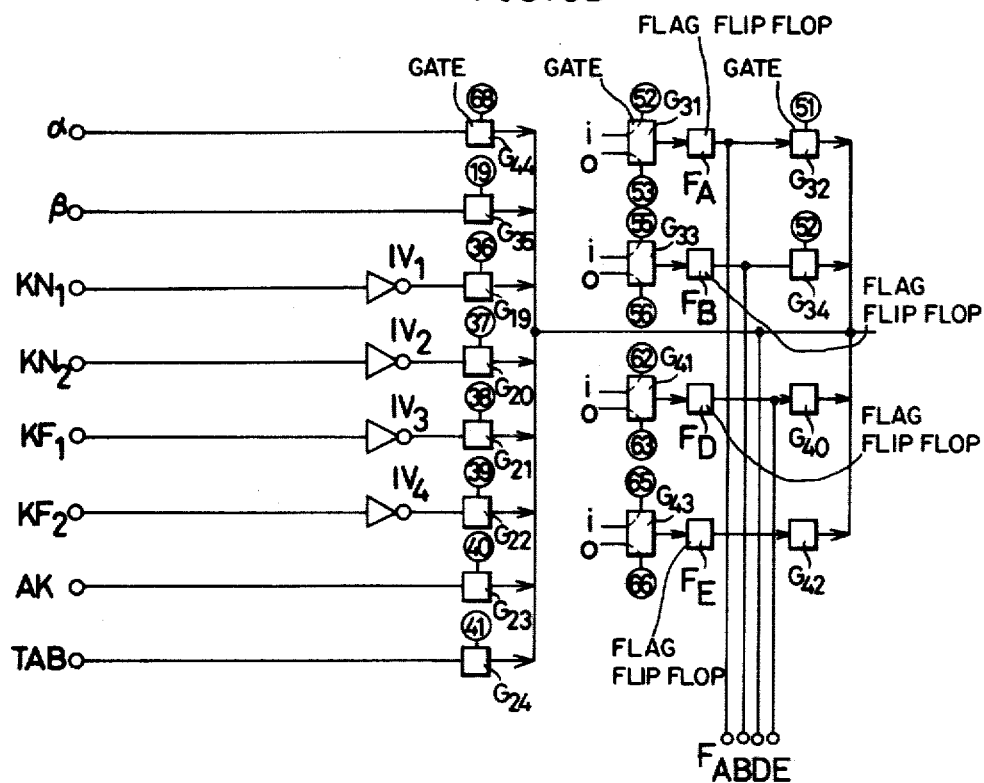
Figure 4:
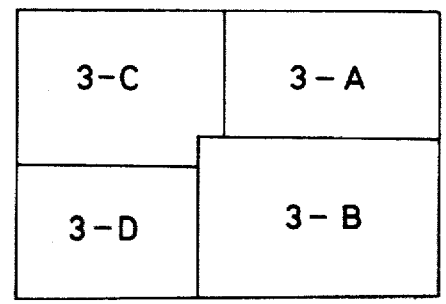
FIG. 4 is an explanation diagram of how to combine FIGS. 3A through 3D.

FIG. 3, a composite diagram of FIGS. 3A–3D, shows a logic wiring diagram of a specific example of the CPU scheme in the apparatus according to the present invention. FIG. 4 shows how to combine FIGS. 3A–3D concerning the CPU. The following will set forth a logic structure of the CPU.

A random access memory RAM is of a 4 bit input and output capacity and accessible to a specific digit position thereof as identified by a digit address and a file address. The RAM includes a digit address counter BL, a digit address decoder $DC_1$, a file address counter BM, a file address decoder $DC_2$ and an adder $AD_1$ which serves as an adder and a subtractor respectively in the absence and presence of a control instruction (14). It further includes a second adder $AD_2$ and a gate $G_1$ for providing either a digit "1" or an operand $I_A$ to an input to the adder/subtractor $AD_1$ and delivering I or $I_A$ when a control instruction (15) or (16) is developed, respectively. An input gate $G_2$ is provided for the memory digit address counter BL. The input gate $B_2$ enables the output of the adder/subtractor $AD_1$, the operand $I_A$ and another operand $I_B$ to pass therethrough respectively when control instructions (10), (11) and (12) are developed. A gate $G_3$ is disposed to provide a digit "1" or the operand $I_A$ to an input to the adder/subtractor, the former being provided upon the development of an instruction (5) and the latter upon the development of an instruction (6). A gate $G_4$ is an input gate to the memory file address BM which enables the output of the adder $AD_2$, the operand $I_A$ and the contents of an accumulator ACC to pass upon the development of instructions (7), (8) and (9). A file selection gate $G_5$ is further provided for the memory RAM. A decoder $DC_3$ translates the operand $I_A$ and supplies a gate $G_6$ with a desired bit specifying signal. The gate $G_6$ contains a circuit arrangement for introducing a binary code "1" into a specific bit position of the memory identified by the operand decoder $DC_3$ and a binary code "0" into a specific bit position identified by $DC_3$, respectively, when a control instruction (2) or (3) is developed. Upon the development of an instruction (4) the contents of the accumulator ACC are read out.

A read only memory ROM has its associated program counter PL which specifies a desired step in the read only memory ROM. The read only memory ROM further contains a step access decoder $DC_4$ and an output gate $G_7$ which shuts off transmission of the output of the ROM to an instruction decoder $DC_5$ when a judge flip flop F/F J is set. The instruction decoder $DC_5$ is adapted to decode instruction codes derived from the ROM and divide them into an operation code area $I_O$ and operand areas $I_A$ and $I_B$, the operation code being decoded into any control instruction (1)– 88. The decoder $DC_5$ is further adapted to output the operand $I_A$ or $I_B$ as it is when sensing an operation code accompanied by an operand. An adder $AD_3$ increments by one the contents of the program counter PL. An input gate $G_8$ associated with the program counter PL provides the operand $I_A$ and transmits the contents of a program stack register SP when the instructions (20) and (61) are developed, respectively. When the instructions (20), (61) and (60) are being processed, any output of the adder $AD_3$ is not transmitted. Otherwise the $AD_3$ output is transmitted to automatically load "1" into the contents of the program counter PL. A flag flip flop FC has an input gate $G_9$ therefor which introduces binary codes "1" and "0" into the flag flip flop FC when the instructions (17) and (18) are developed, respectively. A key signal generating gate $G_{10}$ allows the memory digit address decoder $DC_1$ to pass the output therethrough without any change when the flag F/F FC is in the reset state (0), and renders all outputs $I_1$–$I_n$ "1" when flag F/F FC is in the set state (1). The accumulator ACC is 4 bits long and a temporary register X is also 4 bits long. An input gate G₁₁ for the temporary register X transmits the contents of the accumulator ACC and the stack register SX respectively upon the development of the instructions ㉙ and ㉙.

An adder AD₄ executes a binary addition on the contents of the accumulator ACC and other data. The output C₄ of the adder AD₄ assumes "1" when the fourth bit binary addition yields a carry. A carry F/F C has its associated input gate G₁₂ which sets "1" into the carry F/F C in the presence of "1" of the fourth bit carry C₄ and "0" into the same in the absence of C₄(0). "1" and "0" are set into C upon the development of ㉑ and ㉒, respectively. A carry (C) input gate G₁₃ enables the adder AD₄ to perform binary additions with a carry and thus transmits the output of the carry F/F C into the adder AD₄ in response to the instruction ㉕. An input gate G₁₄ is provided for the adder AD₄ and transfers the output of the memory RAM and the operand I_A upon the development of ㉓ and ㉔, respectively. An output buffer register F has a 4 bit capacity and an input gate which enables the contents of the accumulator ACC to enter into F upon the development of ㉛. An output decoder SD decodes the contents of the output buffer F into display segment signals SS₁-SS_n. An output buffer register W has a shift circuit SC which shifts the overall bit contents of the output buffer register W one bit to the right at a time in response to ㉜ or ㉝. An input gate G₁₆ for the output buffer register W enters "1" and "0" into the first bit position of W upon ㉜ and ㉝, respectively. Immediately before "1" or or "0" enters into the first bit position of W the output buffer shift circuit SHC becomes operative.

An output control flag F/F N_p has an input gate G₁₇ for receiving "1" and "0" upon the development of ㉞ and ㉟, respectively.

The buffer register W is provided with an output control gate G₁₈ for providing the respective bit outputs thereof at one time only when the flag F/F N_p is in the set state (1). There are further provided a judge F/F J, inverters IV₁-IV₄ and an input gate G₁₉ for the judge F/F J for transferring the state of an input KN₁ into J upon the development of ㊱. In the case where KN₁=0, J=1 because of intervention of the inverter IV₁. An input gate G₂₀ for the judge F/F J is adapted to transfer the state of an input KN₂ into J upon ㊳. When KF₁=0, J=1 because of intervention of the inverter IV₃. An input gate G₂₂ for the judge F/F J is adapted to transfer the state of the input KF₂ into J upon ㊴. When KF₂=0, J=1 because of the intervened inverter IV₄. An input gate G₂₃ is provided for the judge flip flop J for transmission of the state of an input AK into J upon the development of ㊵. When AK=1, J=1. An input gate G₂₄ is provided for the judge flip flop J to transmit the state of an input TAB into J pursuant to ㊶. When TAB=1, J=1. A gate G₂₅ is provided for setting the judge F/F J upon the development of ㊷. A comparator V₁ compares the contents of the memory digit address counter BL with preselected data and provides an output "1" if there is agreement. The comparator V₁ becomes operative when ㊸ or ㊹ is developed. The data to be compared are derived from a gate G₂₆ which is an input gate to the comparator V₁. The data n₁ to be compared are a specific higher address value which is often available in controlling the RAM. n₁ and n₂ are provided for comparison purposes upon the development of ㊸ and ㊹, respectively.

An input gate G₂₇ is provided for the decision F/F J to enter "1" into J when the carry F/F C assumes "1" upon the development of ㊺.

A decoder DC₆ decodes the operand I_A and helps decisions as to whether or not the contents of a desired bit position of the RAM are "1". A gate G₂₈ transfers the contents of the RAM as specified by the operand decoder DC₆ into the judge F/F when ㊻ is derived. When the specified bit position of the RAM assumes "1", J=1. A comparator V₂ decides whether or not the contents of the accumulator ACC are equal to the operand I_A and provides an output "1" when the affirmative answer is provided. The comparator V₂ becomes operative according to ㊼. A comparator V₃ decides under ㊽ whether the contents of the memory digit address counter BL are equal to the operand I_A and provides an output "1" when the affirmative answer is obtained. A comparator V₄ decides whether the contents of the accumulator ACC agree with the contents of the RAM and provides an output "1" in the presence of the agreement. A gate G₂₉ transfers the fourth bit carry C₄ occurring during additions into the judge F/F J. Upon the development of ㊾ is sent to F/F J. J=1 in the presence of C₄. A flag flip flop FA has an input gate G₃₁ which provides outputs "1" and "0" upon the development of ㊿ and ㋍, respectively. An input gate G₃₂ is provided for setting the judge F/F J when the flag flip flop FA assumes "1". A flag flip flop F_B also has an input gate G₃₃ which provides outputs "1" and "0" upon ㋍ and ㋎, respectively. An input gate G₃₄ for the judge flip flop J is adapted to transfer the contents of the flag flip flop F_B into the F/F J upon the development of ㋏. An input gate G₃₅ associated with the judge F/F J is provided for transmission of the contents of an input B upon ⑲. When B=1, J=1. An input gate G₃₆ associated with the accumulator ACC is provided for transferring the output of the adder AD₄ upon ㉖ and transferring the contents of the accumulator ACC after inverted via an inverter IV₅ upon ㉗. The contents of the memory RAM are transferred upon ㉘, the operand I_A upon ⑬, the 4 bit input contents K₁-k₄ upon ㋐, and the contents of the stack register SA upon ㋑. A stack register SA provides the output outside the present system. A stack register SX also provides the output outside the system. An input gate G₃₇ associated with the stack register SA transfers the accumulator ACC upon ㋒. An input gate G₃₈ associated with the stack register SX transfers the contents of the temporary register X. A program stack register SP has an input gate G₃₉ for loading the contents of the program counter PL incremented by "1" through the adder into the program stack register.

An illustrative example of the instruction codes contained within the ROM of the CPU structure, the name and function of the instruction codes and the control instructions developed pursuant to the instruction codes will now be tabulated in Table 1 wherein A: the instruction codes, B: the instruction name, C: the instruction description and D: the CPU control instructions.

TABLE 1

| | A | B | D |
|---|---|---|---|
| 1 | l_o | SKIP | ㊷ ㊸ |
| 2 | l_o | AD | ㉓ ㉔ |
| 3 | l_o | ADC | ㉓ ㉕ ㉒ ㉑ |
| 4 | l_o | ADCSK | ㉓ ㉔ ㉕ ㊾ ① |

TABLE 1-continued

| | A | B | | D |
|---|---|---|---|---|
| 5 | $I_O$ | | $I_4$ | ADI |  |
| 6 | $I_O$ | | $I_4$ | DC |  |
| 7 | | $I_O$ | | SC |  |
| 8 | | $I_O$ | | RC |  |
| 9 | $I_O$ | | $I_4$ | SM |  |
| 10 | $I_O$ | | $I_4$ | RM |  |
| 11 | | $I_O$ | | COMA |  |
| 12 | $I_O$ | | $I_4$ | LDI |  |
| 13 | $I_O$ | | $I_4$ | L |  |
| 14 | $I_O$ | | $I_4$ | LI |  |
| 15 | $I_O$ | | $I_4$ | LXD |  |
| 16 | $I_O$ | | $I_4$ | X |  |
| 17 | $I_O$ | | $I_4$ | XI |  |
| 18 | $I_O$ | | $I_4$ | XD |  |
| 19 | $I_O$ | | $I_4$ | LBLI |  |
| 20 | $I_O$ | $I_4$ | $I_B$ | LB |  |
| 21 | $I_O$ | | $I_4$ | ABLI |  |
| 22 | $I_O$ | | $I_4$ | ABMI |  |
| 23 | $I_O$ | | $I_4$ | T |  |
| 24 | | $I_O$ | | SKC |  |
| 25 | $I_O$ | | $I_4$ | SKM |  |
| 26 | $I_O$ | | $I_4$ | SKBI |  |
| 27 | $I_O$ | | $I_4$ | SKAI |  |
| 28 | | $I_O$ | | SKAM |  |
| 29 | | $I_O$ | | $SKN_1$ |  |
| 30 | | $I_O$ | | $SKN_2$ |  |
| 31 | | $I_O$ | | $SKF_1$ |  |
| 32 | | $I_O$ | | $SKF_2$ |  |
| 33 | | $I_O$ | | SKAK |  |
| 34 | | $I_O$ | | SKTAB |  |
| 35 | | $I_O$ | | SKFA |  |
| 36 | | $I_O$ | | SKFB |  |
| 37 | | $I_O$ | | WIS |  |
| 38 | | $I_O$ | | WIR |  |
| 39 | | $I_O$ | | NPS |  |
| 40 | | $I_O$ | | NPR |  |
| 41 | | $I_O$ | | ATF |  |
| 42 | | $I_O$ | | LXA |  |
| 43 | | $I_O$ | | XAX |  |
| 44 | | $I_O$ | | SFA |  |
| 45 | | $I_O$ | | RFA |  |
| 46 | | $I_O$ | | SFB |  |
| 47 | | $I_O$ | | RFB |  |
| 48 | | $I_O$ | | SFC | 17 |
| 49 | | $I_O$ | | RFC | 18 |
| 50 | | $I_O$ | | SKB | 19 |
| 51 | | $I_O$ | | KTA | 57 |
| 52 | | $I_O$ | | STPO | 58 |
| 53 | | $I_O$ | | EXPO | 58, 59 |
| 54 | $I_O$ | | $I_4$ | TML | 62, 20 |
| 55 | | $I_O$ | | RIT | 61 |

Instruction Description (C)

(1) SKIP

Only the program counter PL is incremented without executing a next program step instruction, thus skipping a program step.

(2) AD

A binary addition is effected on the contents of the accumulator ACC and the contents of the RAM, the addition results being loaded back into the accumulator ACC.

(3) ADC

A binary addition is effected on the contents of the accumulator ACC, the memory RAM and the carry F/F C, the results being loaded back to the accumulator ACC.

(4) ADCSK

A binary addition is effected on the contents of the accumulator ACC, the memory RAM and the carry flip flop C, the results being loaded into the accumulator ACC. If the fourth bit carry $C_4$ occurs in the results, then a next program step is skipped.

(5) ADI

A binary addition is achieved upon the contents of the accumulator ACC and the operand $I_4$ and the results are loaded into the accumulator ACC. If the fourth bit carry $C_4$ is developed in the addition results, then a next program step is skipped.

(6) DC

The operand $I_4$ is fixed as "1010" (a decimal number "10") and a binary addition is effected on the contents of the accumulator ACC and the operand $I_4$ in the same way as in the ADI instruction. The decimal number 10 is added to the contents of the accumulator ACC, the results of the addition being loaded into ACC.

(7) SC

The carry F/F C is set ("1" enters into C).

(8) RC

The carry F/F C is reset ("0" enters into C).

(9) SM

The contents of the operand $I_4$ are decoded to give access to a desired bit position of the memory specified by the operand ("1" enters).

(10) RM

The contents of the operand $I_4$ are interpreted to reset a desired bit position of the memory specified by the operand ("0" enters).

(11) COMA

The respective bits of the accumulator ACC are inverted and the resulting complement to "15" is introduced into ACC.

(12) LOI

The operand $I_4$ enters into the accumulator ACC.

(13) L

The contents of the memory RAM are sent to the accumulator ACC and the operand $I_4$ to the file address counter BM.

(14) LI

The contents of the memory RAM are sent to the accumulator ACC and the operand $I_4$ to the memory file address counter BM. At this time the memory digit address counter BL is incremented. If the contents of BL agree with the preselected value $n_1$, then a next program step is skipped.

(15) XD

The contents of the memory RAM are exchanged with the contents of ACC and the operand $I_4$ is sent to the memory file address counter BM. The memory digit address counter BL is decremented. In the event that the contents of BL agree with the preselected value $n_2$, then a next program step is skipped.

(16) X

The contents of the memory RAM are exchanged with the contents of the accumulator ACC and the operand $I_4$ is loaded into the memory file address counter BM.

(17) XI

The contents of the memory RAM are exchanged with the contents of the accumulator ACC and the operand $I_4$ is sent to the memory file address counter BM. The memory digit address counter BL is incremented. In the event that BL is equal to the preselected value $n_1$, a next program step is skipped.

(18) XD

The contents of the memory RAM replace the contents of the accumulator ACC, the operand $I_4$ being sent to the memory file address counter BM. The memory digit address counter BL at this time is incremented. If the contents of BL are equal to $n_2$, then a next program step is skipped.

(19) LBLI

The operand $I_A$ is loaded into the memory digit address counter BL.

(20) LB

The operand $I_A$ is loaded into the memory file address counter BM and the operand B to the memory digit address counter BL.

(21) ABLI

The operand $I_A$ is added to the contents of the memory digit address counter BL in a binary addition fashion, the results being loaded back to BL. If the contents of BL are equal to $n_1$, then no next program step is carried out.

(22) ABMI

The operand $I_A$ is added to the contents of the memory file address counter BM in a binary fashion, the results being loaded into BM.

(23) T

The operand $I_A$ is loaded into the program step counter PL.

(24) SKC

If the carry flip flop C is "1", then no next program step is taken.

(25) SKM

The contents of the operand $I_A$ are decoded and a next program step is skipped as long as a specific bit position of the memory specified by the operand $I_A$ assumes "1".

(26) SKBI

The contents of the memory digit address counter BL are compared with the operand $I_A$ and a next succeeding program step is skipped when there is agreement.

(27) SKAI

The contents of the accumulator ACC are compared with the operand $I_A$ and if both are equal to each other a next program step is skipped.

(28) SKAM

The contents of the accumulator ACC are compared with the contents of the RAM and if both are equal a next program step is skipped.

(29) $SKN_1$

When the input $KN_1$ is "0", a next program step is skipped.

(30) $SKN_2$

When the input $KN_2$ is "0", a next program step is skipped.

(31) $SKF_1$

When the input $KF_1$ is "0", a next program step is skipped.

(32) $SKF_2$

When the input $KF_2$ is "0", a next program step is skipped.

(33) SKAK

When the input AK is "1", a next program step is skipped.

(34) SKTAB

When the input TAB is "1", a next program step is skipped.

(35) SKFA

When the flag flip flop F/A assumes "1" a next program step is skipped.

(36) SKFB

When the flag flip flop $F_B$ assumes "1", a next program step is skipped.

(37) WIS

The contents of the output buffer register W are one bit right shifted, the first bit position (the most significant bit position) receiving "1".

(38) WIR

The contents of the output buffer register W are one bit right shifted, the first bit position (the most significant bit position being loaded with "0".

(39) NPS

The output control F/F $N_p$ for the buffer register W is set ("1" enters).

(40) NPR

The buffer register output control flip flop $N_p$ is reset ("0" enters therein).

(41) ATF

The contents of the accumulator ACC are transferred into the output buffer register F.

(42) LXA

The contents of the accumulator ACC are unloaded into the temporary register X.

(43) XAX

The contents of the accumulator ACC are exchanged with the contents of the temporary register X.

(44) SFA

The flag F/F FA is set (an input of "1").

(45) RFA

The flag F/F FA is reset (an input of "0").

(46) SFB

The flag flip flop $F_B$ is set (an input of "1").

(47) RFB

The flag flip flop $F_B$ is reset (an input of "0").

(48) SFC

An input testing flag F/F $F_C$ is set (an input of "1").

(49) RFC

The input testing flag F/F $F_C$ is reset (an input of "0").

(50) SKB

When an input $\beta$ is "1", a next program step is skipped.

(51) KTA

The inputs $k_1$–$k_4$ are introduced into the accumulator ACC.

(52) STPO

The contents of the accumulator ACC are sent to the stack register SA and the contents of the temporary register X are sent to the stack register SX.

(53) EXPO

The contents of the accumulator ACC are exchanged with the stack register SA and the contents of the temporary register X with the stack register SX.

(54) TML

The contents of the program counter $P_L$ are incremented by one and are transferred into the program stack register SP and the operand $I_A$ is loaded into the program counter $P_L$.

(55) RIT

The contents of the program stack register SP are transmitted into the program counter $P_L$.

Table 2 sets forth the relationship between the operation codes contained within the ROM of the CPU structure and the operand.

TABLE 2

AD → 0 0 0 1 0 1 1 0 0 0 ($I_O$)

COMA → 0 0 0 1 0 1 1 1 1 1 ($I_O$)

TABLE 2-continued

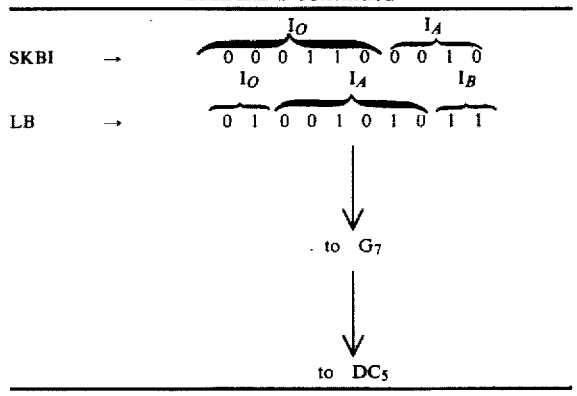

wherein $I_O$: the operation codes and $I_A$, $I_B$: the operands

Taking an example wherein the output of the read only memory ROM is 10 bit long, the instruction decoder $DC_5$ decides whether the instruction AD or COMA (see Table 1) assumes "0001011000" or "0001011111" and develops the control instructions ㉓, ㉖, or ㉗. SKBI is identified by the fact that the upper six bits assume "000110", the lower 4 bits "0010" being treated as the operand $I_A$ and the remaining ninth and tenth bits "11" as the operand $I_B$. The operand forms part of instruction words and specifies data and addresses for next succeeding instructions and can be called an address area of an instruction.

Major processing operations (a processing list) of the CPU structure will now be described in sufficient detail.

[PROCESSING LIST]

(I) A same numeral N is loaded into a specific region of the memory RAM (NNN→X)

(II) A predetermined number of different numerals are loaded into a specific region of the memory ($N_1$, $N_2$, $N_3$, ... →X)

(III) The contents of a specific region of the memory are transferred into a different region of the memory (X→Y)

(IV) The contents of a specific region of the memory are exchanged with that of a different region (XθY)

(V) A given numeral N is added or substracted in a binary fashion from the contents of a specific region of the memory (X±N)

(VI) The contents of a specific region of the memory are added in a decimal fashion to the contents of a different region (X±Y)

(VII) The contents of a specific region of the memory are one digit shifted (X right, X left)

(VIII) A one bit conditional F/F associated with a specific region of the memory is set or reset (F set, F reset)

(IX) The state of the one bit conditional F/F associated with a specific region of the memory is sensed and a next succeeding program address is changed according to the results of the state detection.

(X) It is decided whether the digit contents of a specific region of the memory reach a preselected numeral and a next succeeding program step is altered according to the results of such decision.

(XI) It is decided whether the plural digit contents of a specific region of the memory are equal to a preselected numeral and a program step is altered according to the results of the decision.

(XII) It is decided whether the digit contents of a specific region of the memory are smaller than a given value and a program step to be next executed is changed according to the decision.

(XIII) It is decided whether the contents of a specific region of the memory are greater than a given value and the results of such decision alter a program step to be next executed.

(XIV) The contents of a specific region of the memory are displayed.

(XV) What kind of a key switch is actuated is decided.

The above processing events in (1)-(15) above are executed according to the instruction codes step by step in the following manner.

---

(I) PROCEDURE OF LOADING A SAME VALUE N INTO A SPECIFIC REGION OF THE MEMORY (NNN→X)

(Type 1)

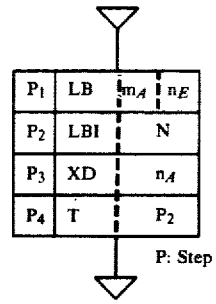

P: Step $P_1$ ..... The first digit position of the memory to be processed is specified by a file address $m_A$ and a digit address $n_E$.
$P_2$ ..... The value N is loaded into ACC.
$P_3$ ..... The value N is loaded into the specified region of the memory by exchange between the memory and ACC. With no change in the file address of the memory, $m_A$ is specified and the digit address is decremented to determine a digit to be next introduced. By determining $n_2$ as the final digit value $n_A$ to be introduced, the next step $P_4$ is skipped to complete the processing of the Type 1 since BL = $n_2$ under the condition that the value N has been completely loaded into the specific region.
$P_4$ ..... LDI and XD are carried out repeatedly from the program address $P_2$ up to BL = V.

(Type 2)

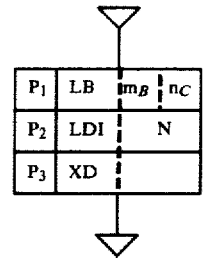

$P_1$ ..... The digit of the memory to be processed is determined by the file address $m_B$ and the digit address $n_C$.
$P_2$ ..... The ACC is loaded with the value N.
$P_3$ ..... By exchange between the memory and ACC the value N is loaded into the above specified region of the memory. This completes the processing of Type 2. An operand area of $X_D$ is necessary to address -continued (I) PROCEDURE OF LOADING A SAME VALUE N INTO A SPECIFIC REGION OF THE MEMORY (NNN→X)

the next succeeding process and is not necessary for this step.

(Type 3)

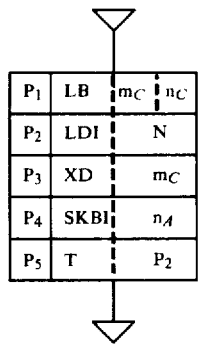

P₁ . . . . . The first digit of the memory to be processed is specified by the file address $m_C$ and the digit address $n_O$.
P₂ . . . . . The ACC is loaded with the value N.
P₃ . . . . . By exchange between the memory and ACC the value N is loaded into that specified region of the memory. With no change in the file address of the memory $m_C$ is specified and the digit address is decremented in order to determine the digit to be next loaded therein.
P₄ . . . . . It is decided whether the digit processed during the step P₃ is the final digit $n_B$. If it is $n_B$, then the digit address is decremented to $n_A$. An operand area of the SKI instruction is occupied by $n_A$, thus loading the final digit with the value N. In reaching P₄, conditions are fulfilled and the next step P₅ is skipped, thereby terminating the type 3 operation. If the conditions are not fulfilled, P₅ is then reached.
P₅ . . . . . The program address P₂ is specified and P₂–P₄ are repeated until BL = $n_A$.

(II) PROCEDURE OF LOADING A PREDETERMINED NUMBER OF DIFFERENT VALUES INTO A SPECIFIC REGION OF THE MEMORY
(N₁, N₂, N₃, . . . . . →X)

(Type 1) For example, four digit values N₄N₃N₂N₁ are loaded into arbitrary digit positions in the same manner as above.

(II) PROCEDURE OF LOADING A PREDETERMINED NUMBER OF DIFFERENT VALUES INTO A SPECIFIC REGION OF THE MEMORY
(N₁, N₂, N₃, . . . . . →X)

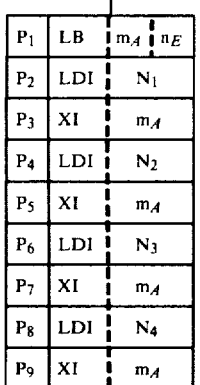

P₁ . . . . . The first processed digit position of the memory is specified by the file address $m_A$ and the digit address $n_E$.
P₂ . . . . . A constant N₁ is loaded into ACC.
P₃ . . . . . Through exchange between the memory and the ACC the value N₁ is loaded into the above specified region of the memory. The file address of the memory remains unchanged as $m_A$, whereas the digit address is up for introduction of the next digit.
P₄ . . . . . A second constant N₂ is loaded into ACC.
P₅ . . . . . Since the second digit of the memory has been specified during P₃, the second constant N₂ is loaded into the second digit position of the memory through exchange between the memory and ACC.
P₆–P₉ . . The same as in the above paragraph.

(Type 2)
Any value of 0–15 is loaded into a predetermined register.

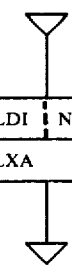

P₁ . . . . . The value N is loaded into ACC.
P₂ . . . . . The value N is transmitted from ACC into the register X.

(III) PROCEDURE OF TRANSFERRING THE CONTENTS OF A SPECIFIC REGION OF THE MEMORY TO A DIFFERENT REGION OF THE MEMORY (X → Y)

(Type 1)

(III) PROCEDURE OF TRANSFERRING THE CONTENTS OF A SPECIFIC REGION OF THE MEMORY TO A DIFFERENT REGION OF THE MEMORY (X → Y)

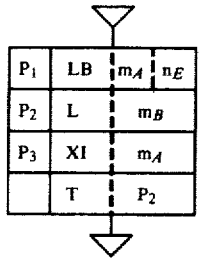

P$_1$ ..... The first memory file address is specified as m$_A$ and the first digit address as n$_E$.

P$_2$ ..... The contents of the first digit position of the memory are loaded into ACC and its designation, the second memory file address is specified as m$_B$ prior to the transmission step P$_3$.

P$_3$ ..... The first digit memory contents loaded into the ACC are replaced by the same second memory digit contents so that the first memory contents are transmitted into the second memory. In order to repeat the above process, the first memory file address m$_A$ is again set. The value of the final digit n$_A$ to be transmitted is previously selected to be n$_1$. Since BL → n$_1$ after the overall first memory contents have been sent to the second memory, the next step P$_4$ is skipped to complete the processing of Type 1. The digit address is progressively incremented until BL = V (the final digit). Through the step P$_4$ the file address is set up at m$_A$ to lead back to P$_2$, thereby specifying the first memory.

P$_4$ ..... The program address is set at the step P$_2$ and the instructions P$_2$ and P$_3$ are repeatedly executed until BL = n$_1$. The transmission step is advanced digit by digit.

(Type 2)

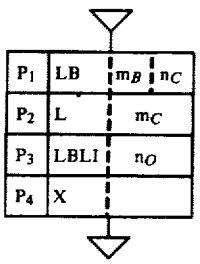

P$_1$ ..... The region of the memory to be processed is determined by the file address m$_A$ and the digit address n$_C$.

P$_2$ ..... The contents of the memory as specified above are unloaded into ACC and the memory file address is set at m$_C$ prior to the next transmission step P$_4$.

P$_3$ ..... The digit address of the memory, the destination for the transmission process, is specified as m$_C$. The selected region of the memory is specified via the steps P$_2$ and P$_3$.

P$_4$ ..... The contents of ACC are exchanged with the contents of the regions of the memory specified as P$_2$ and P$_3$. The operand of X has no connection with the present process.

(Type 3)

(III) PROCEDURE OF TRANSFERRING THE CONTENTS OF A SPECIFIC REGION OF THE MEMORY TO A DIFFERENT REGION OF THE MEMORY (X → Y)

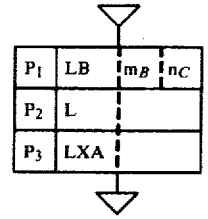

P$_1$ ..... The region of the memory to be processed is identified by the file address m$_A$ and the digit address n$_C$.

P$_2$ ..... The contents of the memory region specified during P$_1$ are unloaded into ACC.

P$_3$ ..... The contents of the memory transmitted from ACC are sent to the register X, completing the type 3 processing.

(IV) PROCEDURE OF EXCHANGING CONTENTS BETWEEN A SPECIFIC REGION OF THE MEMORY AND A DIFFERENT REGION (X → Y)

(Type 1)

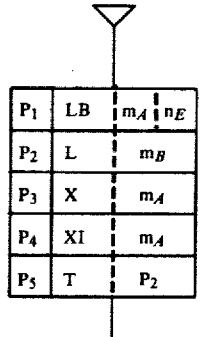

P$_1$ ..... The first memory file address to be processed is specified as m$_A$ and the first digit address as n$_E$.

P$_2$ ..... The specific digit contents of the first memory are loaded into ACC and the second memory file address is specified as m$_B$ for preparation of the next step.

P$_3$ ..... The specific digit contents of the first memory contained within ACC are exchanged with the same digit contents of the second memory specified by P$_2$. The file address of the first memory is specified as m$_A$ in order to load the contents of the memory now in ACC into the first memory.

P$_4$ ..... The contents of the second memory now in ACC are exchanged with the contents of the first memory at the corresponding digit positions so that the contents of the second memory are transferred to the first memory. Exchanges are carried out during the steps P$_2$–P$_4$. The first memory is specified on by the file address m$_A$, while the digit address is incremented to select a next address. Exchange is carried out progressively digit by digit. The final digit value n$_A$ is previously set at n$_1$ such that B$_L$ = n$_1$ after the exchange operation between the first memory and the second has been

(IV) PROCEDURE OF EXCHANGING CONTENTS BETWEEN A SPECIFIC REGION OF THE MEMORY AND A DIFFERENT REGION (X → Y) -continued

|  | | |
|---|---|---|
| | | effected throughout the all digit positions, thus skipping the next step $P_5$ and completing the processing of Type 1. |
| $P_5$ | . . . . . | The program address $P_2$ is selected and the instructions for $P_2$ to $P_4$ are executed repeatedly until $B_L = n_1$. The exchange operation is advanced digit by digit. |

(Type 2)

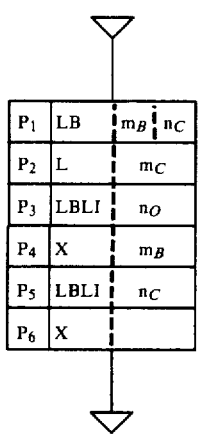

| $P_1$ | LB | $m_B$ | $n_C$ |
| $P_2$ | L | | $m_C$ |
| $P_3$ | LBLI | | $n_O$ |
| $P_4$ | X | | $m_B$ |
| $P_5$ | LBLI | | $n_C$ |
| $P_6$ | X | | |

$P_1$ . . . . . The file address of the first memory to be processed is specified as $m_A$ and the digit address as $n_C$.
$P_2$ . . . . . The contents of the specific digit position of the first memory are unloaded into ACC and the file address of the second memory is specified as $m_C$ and ready to exchange.
$P_3$ . . . . . The digit address of the second memory, the destination for the exchange process, is specified as $n_O$ to determine the destinated memory address.
$P_4$ . . . . . The contents of the first memory now within ACC are exchanged with that of the second memory. At the same time the file address $m_B$ of the first memory is again specified to transfer the contents of the first memory to the first memory.
$P_5$ . . . . . The digit address $n_C$ of the first memory is specified to determine the destination address of the first memory.
$P_6$ . . . . . The contents of the second memory now within ACC are exchanged with the contents of the first memory.

(Type 3)

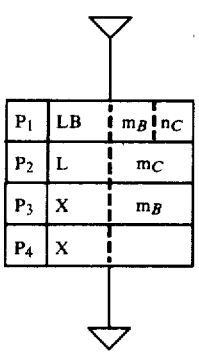

| $P_1$ | LB | $m_B$ | $n_C$ |
| $P_2$ | L | | $m_C$ |
| $P_3$ | X | | $m_B$ |
| $P_4$ | X | | |

$P_1$ . . . . . The file address $m_A$ of the first memory to be processed is specified and the digit address $n_C$ is specified.
$P_2$ . . . . . The contents of the first memory are loaded into ACC and the file address $m_C$ of the second memory is selected.

(IV) PROCEDURE OF EXCHANGING CONTENTS BETWEEN A SPECIFIC REGION OF THE MEMORY AND A DIFFERENT REGION (X → Y) -continued $P_3$ . . . . . The exchange is carried out between the first and second memory so that the contents of the first memory are loaded into the second memory. Prior to the step $P_4$ the file address $m_B$ of the first memory is selected again.
$P_4$ . . . . . The exchange is effected between the contents of the second memory and the first memory.

(Type 4)

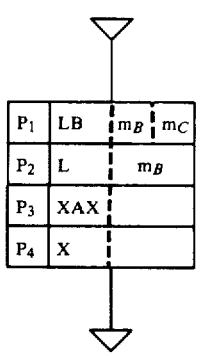

| $P_1$ | LB | $m_B$ | $m_C$ |
| $P_2$ | L | | $m_B$ |
| $P_3$ | XAX | | |
| $P_4$ | X | | |

$P_1$ . . . . . The region of the memory to be processed is specified by the file address $m_A$ and the digit address $n_C$.
$P_2$ . . . . . The contents of the memory region specified in $P_1$ above are loaded into ACC. The file address $m_B$ is kept being selected prior to the exchange with the contents of the register X.
$P_3$ . . . . . The exchange is effected between ACC and the register X so that the contents of the memory are shifted to the register X.
$P_4$ . . . . . Through the exchange between ACC containing the contents of the register X and the memory, the contents of the register X are substantially transferred into the memory, thus accomplishing the Type 4 processing.

(V) PROCEDURE OF EFFECTING A BINARY ADDITION OR SUBTRACTION OF A GIVEN VALUE N ONTO A SPECIFIC REGION OF THE MEMORY (Type 1) $M_1 + N → M$

| $P_1$ | LB | $m_B$ | $n_C$ |
| $P_2$ | L | | $m_B$ |
| $P_3$ | ADI | | N |
| $P_4$ | X | | |

$P_1$ . . . . . The region of the memory to be processed is specified by the file address $m_B$ and the digit address $n_C$.
$P_2$ . . . . . The contents of the memory specified by the step $P_1$ are unloaded into ACC. The memory file address is set again at $m_B$ to specify the same memory.
$P_3$ . . . . . The operand specifies the value N to be added and the contents of the memory contained within ACC are added with the value N, the results being loaded back

(V) PROCEDURE OF EFFECTING A BINARY ADDITION OR SUBTRACTION OF A GIVEN VALUE N ONTO A SPECIFIC REGION OF THE MEMORY to ACC.
P$_4$ . . . . . The sum contained with ACC is exchanged with the contents of the memory specified by the step P$_2$, thus completing the Type 1 processing.

(Type 2) X + N → X

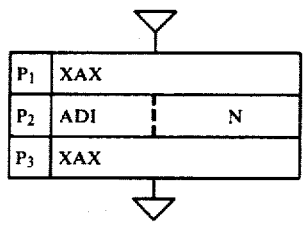

P$_1$ . . . . . The exchange is effected between the register X and ACC.
P$_2$ . . . . . The operand specifies the value N to be added and an addition is carried out on the contents of the register X now within ACC and the value N. The results back to the ACC.
P$_3$ . . . . . Through the exchange between the resulting sum within ACC and the contents of the register X, the processing of Type 2 (X + N → X) is performed.

(Type 3) M$_1$ + N → M$_2$

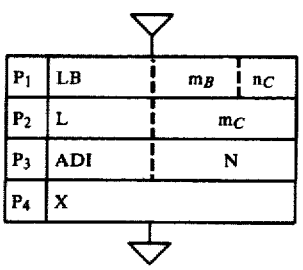

P$_1$ . . . . . The region of the first memory to be processed is decided by the file address m$_B$ and the digit address n$_C$.
P$_2$ . . . . . The contents of the memory specified by P$_1$ are loaded into ACC. The file address m$_C$ of the second memory is specified to return addition results to the second memory.
P$_3$ . . . . . The operand specifies the value N to be added and the value N is added to the contents of the memory now within ACC, with the results being loaded into ACC.
P$_4$ . . . . . The resulting sum within ACC is exchanged with the contents of the second memory as specified by P$_2$, thus completing the processing of Type 3.

(Type 4) M$_1$ − N → M$_1$

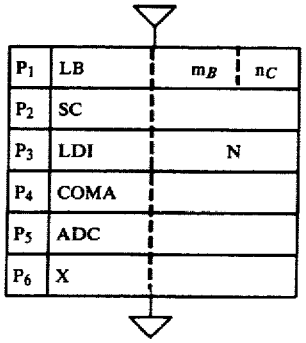

P$_1$ . . . . . There are specified the file address m$_B$ and the digit address n$_C$ of the memory to be processed.

(V) PROCEDURE OF EFFECTING A BINARY ADDITION OR SUBTRACTION OF A GIVEN VALUE N ONTO A SPECIFIC REGION OF THE MEMORY

P$_2$ . . . . . Subtraction is carried out in such a way that the complement of a subtrahend is added to a minuend and the F/F C remains set because of the absence of a borrow from a lower digit position.
P$_3$ . . . . . ACC is loaded with the subtrahend N.
P$_4$ . . . . . The complement of the subtrahend to "15" is evaluated and loaded into ACC.
P$_5$ . . . . . In the event that any borrow occurs during the subtraction, the complement of the subtrahend to "16" is added to the minuend. If a borrow free state is denoted as C = 1, then a straight binary subtraction of $\overline{ACC}$ + C + M → ACC is effected.
P$_6$ . . . . . The resulting difference during P$_5$ is returned to the same memory through the exchange between ACC and that memory.

(Type 5) M$_1$ − N → M$_2$

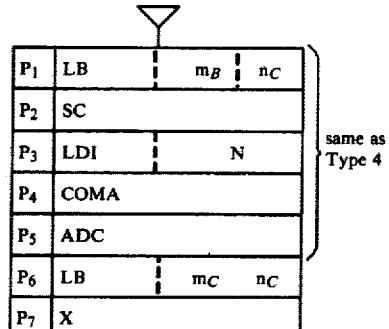

P$_6$ . . . . . To load the resulting difference during P$_5$ into the second memory, the file address m$_C$ and the digit address n$_C$ of the second memory are selected.
P$_7$ . . . . . Through exchange the resulting difference is transferred from ACC into the second memory as specified by the step P$_6$.

(Type 6)

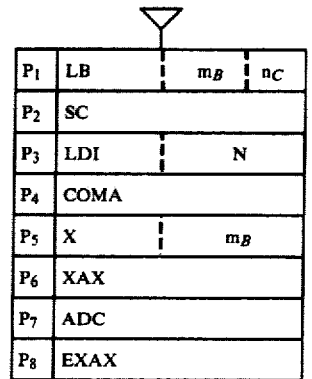

P$_1$ . . . . . The file address m$_B$ and the digit address n$_C$ of the memory ready for the step P$_5$ are selected.
P$_2$ . . . . . Subtraction is carried out in the manner of adding the complement of a subtrahend to a minuend and the F/F C remains set because of the absence of a borrow from a lower digit position.
P$_3$ . . . . . ACC is loaded with the subtrahend N.
P$_4$ . . . . . The complement of the subtrahend to "15" is evaluated and loaded into ACC.
P$_5$ . . . . . To accomplish calculations with the contents

| (V) PROCEDURE OF EFFECTING A BINARY ADDITION OR SUBTRACTION OF A GIVEN VALUE N ONTO A SPECIFIC REGION OF THE MEMORY |
| --- |
| of the register X, the memory as specified by P₁ is loaded with the contents of ACC.
P₆ . . . . . The contents of the register X are transmitted into ACC through the exchange process. After this step the memory contains the complement of the subtrahend to "15" and ACC contains the contents of X.
P₇ . . . . . ACC + M + C corresponds to X − N and the results of a binary subtraction are loaded into ACC.
P₈ . . . . . The contents of ACC are exchanged with the contents of X and the value of X − N is transmitted into X, thereby completing the processing of Type 6. |

(Type 7) $N - M_1 \rightarrow M_1$

| P₁ | LB  | m_B | n_C |
|----|-----|-----|-----|
| P₂ | SC  |     |     |
| P₃ | LDI | N   |     |
| P₄ | X   | m_B |     |
| P₅ | COMA |    |     |
| P₆ | ADC |     |     |
| P₇ | X   |     |     |

P₁ . . . . . The file address $m_B$ and the digit address $n_C$ of the memory to be processed are selected.
P₂ . . . . . One-digit subtraction is effected in the manner of adding the complement of a subtrahend to a minuend, in which case F/F C remains set.
P₃ . . . . . ACC is loaded with a minuend.
P₄ . . . . . The exchange is effected between the memory (the subtrahend) and ACC and the memory file address remains as $m_B$ for preparation of P₇.
P₅ . . . . . The complement of a subtrahend in ACC to "15" is evaluated and loaded into ACC.
P₆ . . . . . In the event that there is no borrow from a lower digit position, the complement of a subtrahend to "16" is added to a minuend. If a borrowless state is denoted as C = 1, then N − M is substantially executed by $\overline{ACC} + C + M$, the resulting difference being loaded into ACC.
P₇ . . . . . Since the memory file address remains unchanged during P₄, the difference is unloaded from ACC back to the memory, thus completing the processing of Type 7.

(Type 8) $N - M_1 \rightarrow M_2$

| P₁ | LB   | m_B | n_C |
|----|------|-----|-----|
| P₂ | L    | m_C |     |
| P₃ | COMA |     |     |
| P₄ | ADI  | N + 1 |   |
| P₅ | X    |     |     |

P₁ . . . . . The file address $m_B$ and the digit address $n_C$ of the memory to be processed are

| (V) PROCEDURE OF EFFECTING A BINARY ADDITION OR SUBTRACTION OF A GIVEN VALUE N ONTO A SPECIFIC REGION OF THE MEMORY |
| --- |
| selecteed.
P₂ . . . . . The contents specified by the step P₁ and corresponding to a subtrahend are loaded into ACC. The file address $m_C$ of the second memory is specified for preparation of a step P₅.
P₃ . . . . . The complement of the subtrahend to "15" is evaluated and loaded into ACC.
P₄ . . . . . The operand is made a minuend plug "1". This subtraction is one digit long and accomplished by adding the complement of the subtrahend to the minuend. A conventional complementary addition is defined as $\overline{ACC} + C + M$ as in the Type 7 processing in the absence of a borrow as defined by C = 1. Since the ADI instruction carries C, $\overline{ACC} + 1$ is processed in advance. This completes the processing of Type 8 of N − M, the results being stored within ACC.
P₅ . . . . . The difference obtained from the step P₄ is transmitted into the second memory specified by P₂. |

(Type 9) $M \pm 1 \rightarrow M$

| P₁  | LDI | 1   |     |
|-----|-----|-----|-----|
| P₁' | LDI | F   |     |
| P₂  | LB  | m_B | n_C |
| P₃  | AD  |     |     |
| P₄  | X   |     |     |

P₁ . . . . . (When M + 1) ACC is loaded with a binary number "0001" (= 1).
P₁' . . . . . (When M − 1) ACC is loaded with a binary number "1111" (= 15).
P₂ . . . . . The file address $m_B$ and the digit address $n_C$ of the memory to be processed are selected.
P₃ . . . . . The contents of the memory specified by P₂ are added to the contents contained within ACC during P₁ or P₁', the sum thereof being loaded into ACC. In the case of P₁ ACC + 1 and in the case of P₁' ACC − 1.
P₄ . . . . . The results are unloaded from ACC to the original memory position, thus completing the processing fashion of Type 9.

| (VI) PROCEDURE OF EFFECTING A DECIMAL ADDITION OR SUBTRACTION BETWEEN A SPECIFIC REGION OF THE MEMORY AND A DIFFERENT REGION |
| --- |
| (Type 1) $X + W \rightarrow X$ |

-continued (VI) PROCEDURE OF EFFECTING A DECIMAL ADDITION OR SUBTRACTION BETWEEN A SPECIFIC REGION OF THE MEMORY AND A DIFFERENT REGION

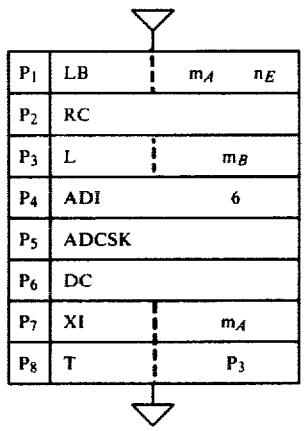

| $P_1$ | LB | $m_A$ | $n_E$ |
| --- | --- | --- | --- |
| $P_2$ | RC | | |
| $P_3$ | L | | $m_B$ |
| $P_4$ | ADI | 6 | |
| $P_5$ | ADCSK | | |
| $P_6$ | DC | | |
| $P_7$ | XI | | $m_A$ |
| $P_8$ | T | | $P_3$ |

$P_1$ ..... The first digit position of the first memory to be processed is identified by the file address $m_A$ and the digit address $n_E$.

$P_2$ ..... The carry F/F C is reset because of a carry from a lower digit position in effecting a first digit addition.

$P_3$ ..... The contents of the specific digit position of the first memory are loaded into ACC and the file address $m_B$ of the second memory is selected in advance of additions with the contents of the second memory during $P_4$.

$P_4$ ..... "6" is added to the contents of the specific digit position of the first memory now loaded into ACC for the next succeeding step $P_5$ wherein a decimal carry is sensed during addition.

$P_5$ ..... ACC already receives the contents of the first memory compensated with "6" and a straight binary addition is effected upon the contents of ACC and the contents of the second memory at the corresponding digit positions, the results being loaded back to ACC. In the event a carry is developed during the binary addition at the fourth bit position, $P_7$ is reached without passing $P_6$. The presence of the carry during the fourth bit addition implies the development of a decimal carry.

$P_6$ ..... In the event the decimal carry failed to develop during the addition $P_5$, the addition of "6" for the processing of $P_4$ is overridden. An addition of "10" is used and is the same as a subtraction of "6".

$P_7$ ..... The one-digit decimal sum is unloaded from ACC into the second memory and the digit address is incremented for a next digit addition and the file address $m_A$ of the first memory is selected. The final digit to be added is previously set at $n_1$. Since BL = $n_1$ after the overall digit addition is effected upon the first and second memory, the next succeeding step $P_8$ is skipped to thereby complete the processing of Type 1.

$P_8$ ..... The program address $P_3$ is selected and the instructions $P_3$-$P_7$ are repeatedly executed until BL = $n_1$. A decimal addition is effected digit by digit.

(Type 2) X − W → X

-continued (VI) PROCEDURE OF EFFECTING A DECIMAL ADDITION OR SUBTRACTION BETWEEN A SPECIFIC REGION OF THE MEMORY AND A DIFFERENT REGION

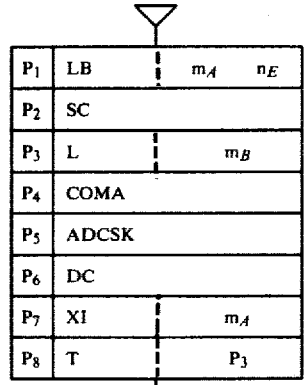

| $P_1$ | LB | $m_A$ | $n_E$ |
| --- | --- | --- | --- |
| $P_2$ | SC | | |
| $P_3$ | L | | $m_B$ |
| $P_4$ | COMA | | |
| $P_5$ | ADCSK | | |
| $P_6$ | DC | | |
| $P_7$ | XI | | $m_A$ |
| $P_8$ | T | | $P_3$ |

$P_1$ ..... The first digit position of the first memory to be processed is specified by the file address $m_A$ and the digit address $n_E$.

$P_2$ ..... Subtraction is performed in the manner of adding the complement of a subtrahend to a minuend and F/F C is set because of the absence of a borrow from a lower digit position during the first digit subtraction.

$P_3$ ..... The contents of the specific digits in the first memory, the subtrahend, are loaded into ACC and the file address $m_B$ of the second memory is specified in advance of the step $P_7$ with the second memory.

$P_4$ ..... The complement of the subtrahend to "15" is evaluated and loaded into ACC.

$P_5$ ..... In the event that there is no borrow from a lower digit place, the complement of the subtrahend is added to the minuend to perform a subtraction. On the contrary, in the presence of a borrow, the complement of the subtrahend is added to the minuend. If a borrowless state is denoted as C = 1, then a binary addition of $\overline{ACC} + C + M \to ACC$ is effected. The development of a carry, as a consequence of the execution of the ADSCK instruction, implies failure to give rise to a borrow and leads to the step $P_7$ without the intervention of the step $P_6$. Under these circumstances the addition is executed with the second memory, thus executing substantially subtraction between the first and second memories.

$P_6$ ..... In the case where no carry is developed during the execution of the ADCSK instruction by the step $P_5$, the calculation results are of the sexadecimal notation and thus converted into a decimal code by subtraction of "6" (equal to addition of "10").

$P_7$ ..... The resulting difference between the first and second memories is transmitted from ACC into the second memory. The digit address is incremented and the file address $m_A$ of the first memory is specified in advance of a next succeeding digit subtraction. The final digit to be subtracted is previously determined as $n_1$. Since BL = $n_1$ after the overall-digit subtraction has been completed, the next step $P_8$ is skipped to thereby conclude the processing of Type 2.

$P_8$ ..... After selection of the program address $P_3$ the instructions $P_3$-$P_7$ are repeatedly executed until BL = $n_1$. The decimal sub-

(VI) PROCEDURE OF EFFECTING A DECIMAL ADDITION OR SUBTRACTION BETWEEN A SPECIFIC REGION OF THE MEMORY AND A DIFFERENT REGION traction is advanced digit by digit.

(VII) PROCEDURE OF SHIFTING ONE DIGIT THE CONTENTS OF A SPECIFIC REGION OF THE MEMORY (Type 1) Right Shift

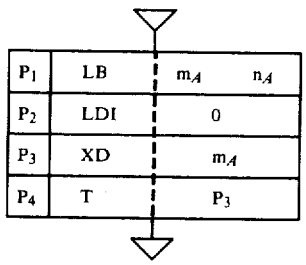

| $P_1$ | LB  | $m_A$ | $n_A$ |
| --- | --- | --- | --- |
| $P_2$ | LDI | 0 | |
| $P_3$ | XD  | $m_A$ | |
| $P_4$ | T   | $P_3$ | |

$P_1$ ..... The file address $m_A$ and the digit address $n_A$ of the memory to be processed are determined.

$P_2$ ..... ACC is loaded with "0" and ready to introduce "0" into the most significant digit position when the right shift operation is effected $P_3$ ..... The exchange is carried out between XCC and the memory and the digit address is decremented to specific a one digit lower position. The memory address is still at $m_A$. XD is repeated executed through $P_4$ and $P_3$. By the step ACC ⟵⟶ M "0" is transmitted from ACC to the most significant digit position of the memory which in turn provides its original contents for ACC. When the digit address is down via B and XD is about to be executed at $P_3$ via $P_4$, the second most significant digit is selected to contain the original content of the most significant digit position which has previously been contained within ACC. At this time ACC is allowed to contain the contents of the second most significant digit position. The least significant digit is previously selected as $n_2$. If the transmission step reaches the least significant digit position BL = $n_2$ is satisfied and $P_4$ is skipped. In other words, the digit contents are shifted down to thereby conclude the processing of Type 1.

$P_4$ ..... XD is repeated at $P_3$ until BL = V.

(Type 2) Left Shift

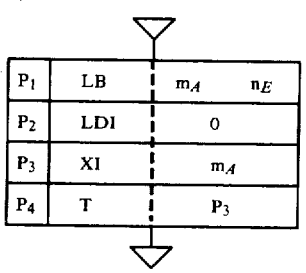

| $P_1$ | LB  | $m_A$ | $n_E$ |
| --- | --- | --- | --- |
| $P_2$ | LDI | 0 | |
| $P_3$ | XI  | $m_A$ | |
| $P_4$ | T   | $P_3$ | |

$P_1$ ..... The file address $m_A$ and the least significant digit $n_E$ of the memory to be processed are determined.

$P_2$ ..... ACC is loaded with "0" and ready to introduce "0" into the least significant digit position when the left shift operation is started.

$P_3$ ..... The exchange is carried out between ACC and the memory and the digit address is

(VII) PROCEDURE OF SHIFTING ONE DIGIT THE CONTENTS OF A SPECIFIC REGION OF THE MEMORY incremented to specify a one digit upper position. The memory address is still at $m_A$. XD is repeated executed through $P_4$ and $P_3$. By the step ACC ⟶ M "0" is transmitted from ACC to the least significant digit position of the memory which in turn provides its original contents for ACC. When the digit address is up via $P_3$ and XD is about to be executed at $P_3$ via $P_4$, the second least significant digit is selected to contain the original content of the least significant digit position which has previously been contained within ACC. At this time ACC is allowed to contain the contents of the second least significant digit position. The most significant digit is previously selected as $n_1$. If the transmission step reaches the most significant digit position, BL = $n_1$ is satisfied and $P_4$ is skipped. In other words, the digit contents are shifted up to thereby conclude the processing of Type 2.

$P_4$ ..... XI is repeated at $P_3$ until BL = V.

(VIII) PROCEDURE OF SETTING OR RESETTING A ONE-BIT CONDITION F/F ASSOCIATED WITH A SPECIFIC REGION OF THE MEMORY (Type 1)

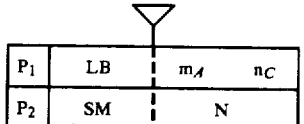

| $P_1$ | LB | $m_A$ | $n_C$ |
| --- | --- | --- | --- |
| $P_2$ | SM | N | |

$P_1$ ..... The file address $m_B$ and the digit address $n_C$ of a region of the memory to be processed are determined.

$P_2$ ..... "1" is loaded into a desired bit N within the digit position of the memory specified by $P_1$, thus concluding the processing of Type 1.

(Type 2)

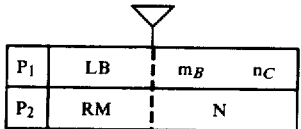

| $P_1$ | LB | $m_B$ | $n_C$ |
| --- | --- | --- | --- |
| $P_2$ | RM | N | |

$P_1$ ..... The file address $m_B$ and the digit address $n_C$ of a region of the memory to be processed are determined.

$P_2$ ..... "0" is loaded into a desired bit N within the digit position of the memory specified by $P_1$, thus concluding the processing of Type 2.

(IX) PROCEDURE OF SENSING THE STATE OF THE ONE-BIT CONDITIONAL F/F ASSOCIATED WITH A SPECIFIC REGION OF THE MEMORY AND CHANGING A NEXT PROGRAM ADDRESS (STEP) AS A RESULT OF THE SENSING OPERATION

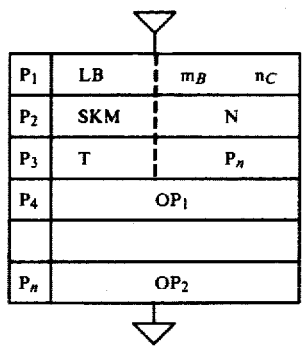

| $P_1$ | LB | $m_B$ | $n_C$ |
|---|---|---|---|
| $P_2$ | SKM | | N |
| $P_3$ | T | | $P_n$ |
| $P_4$ | $OP_1$ | | |
| | | | |
| $P_n$ | $OP_2$ | | |

$P_1$ ..... There are specified the file address $m_B$ and the digit address $n_C$ where a desired one-bit conditional F/F is present.
$P_2$ ..... In the case where the contents of the bit position (corresponding to the conditional F/F) specified by N within the memory region as selected during $P_1$ assume "1", the step proceeds to $P_4$ with skipping $P_3$, thus executing the operation $OP_1$. In the event that the desired bit position bears "0", the next step $P_3$ is skipped.
$P_3$ ..... When the foregoing $P_2$ has been concluded as the conditional F/F in the "0" state, the program step $P_n$ is selected in order to execute the operation $OP_2$.

(X) PROCEDURE OF DECIDING WHETHER THE DIGIT CONTENTS OF A SPECIFIC REGION OF THE MEMORY REACH A PRESELECTED NUMERAL AND ALTERING A NEXT PROGRAM ADDRESS (STEP) ACCORDING TO THE RESULTS OF THE DECISION

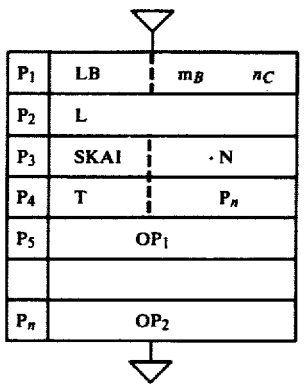

| $P_1$ | LB | $m_B$ | $n_C$ |
|---|---|---|---|
| $P_2$ | L | | |
| $P_3$ | SKAI | | ·N |
| $P_4$ | T | | $P_n$ |
| $P_5$ | $OP_1$ | | |
| | | | |
| $P_n$ | $OP_2$ | | |

$P_1$ ..... The region of the memory which contains contents to be decided is identified by the file address $m_B$ and the digit address $n_C$.
$P_2$ ..... The contents of the memory as identified during $P_1$ are unloaded into ACC.
$P_3$ ..... The contents of ACC are compared with the preselected value N and if there is agreement the step advances toward $P_5$ without executing $P_4$ to perform the operation $OP_1$. $P_4$ is however reached if the contents of ACC are not equal to N.
$P_4$ ..... The program address (step) $P_n$ is then selected to perform the operation $OP_2$.

(XI) PROCEDURE OF DECIDING WHETHER THE PLURAL DIGIT CONTENTS OF A SPECIFIC REGION OF THE MEMORY ARE EQUAL TO A PRESELECTED NUMERAL AND ALTERING A PROGRAM STEP ACCORDING TO THE RESULTS OF THE DECISION

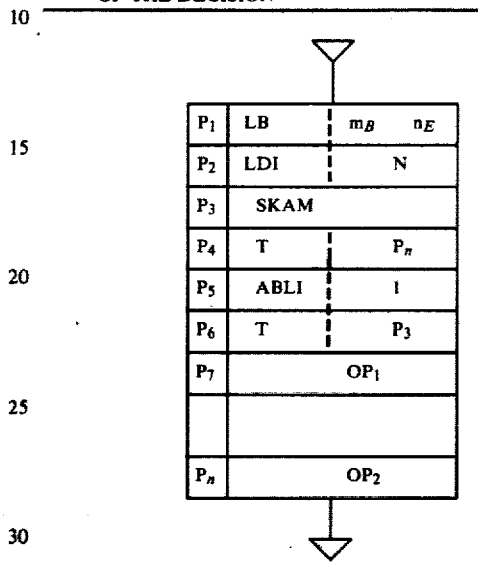

| $P_1$ | LB | $m_B$ | $n_E$ |
|---|---|---|---|
| $P_2$ | LDI | | N |
| $P_3$ | SKAM | | |
| $P_4$ | T | | $P_n$ |
| $P_5$ | ABLI | | 1 |
| $P_6$ | T | | $P_3$ |
| $P_7$ | $OP_1$ | | |
| | | | |
| $P_n$ | $OP_2$ | | |

$P_1$ ..... The region of the memory to be judged is identified by the file addresss $m_B$ and the first digit address $n_E$.
$P_2$ ..... The value N is loaded into ACC for comparison.
$P_3$ ..... The value V within ACC is compared with the digit contents of the specific region of the memory and if there is agreement $P_5$ is reached without passing $P_4$ to advance the comparison operation toward the next succeeding digit. $P_4$ is selected in a non-agreement.
$P_4$ ..... In the case of a non-agreement during $P_3$ the program address (step) $P_n$ is specified to execute the operation forthwith.
$P_5$ ..... The digit address is incremented by adding "1" thereto. This step is aimed at evaluating in sequence a plurality of digits within the memory. The ultimate digit to be evaluated is previously determined as (V). The comparison is repeated throughout the desired digit positions. If a non-agreement state occurs on the way, the operation $OP_2$ is accomplished through $P_4$. In the case where the agreement state goes on till BL = V, there is selected $P_7$ rather than $P_6$ to perform the operation $OP_1$.
$P_6$ ..... When the agreement state goes on during $P_5$, $P_3$ is reverted for evaluation.

(XII) PROCEDURE OF DECIDING WHETHER THE CONTENTS OF A SPECIFIC REGION OF THE MEMORY ARE SMALLER THAN A GIVEN VALUE AND DECIDING WHICH ADDRESS (STEP) IS TO BE EXECUTED

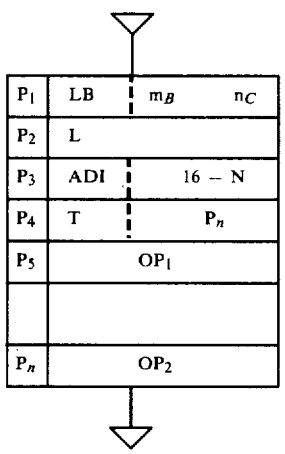

| $P_1$ | LB | $m_B$ | $n_C$ |
| --- | --- | --- | --- |
| $P_2$ | L | | |
| $P_3$ | ADI | | $16 - N$ |
| $P_4$ | T | | $P_n$ |
| $P_5$ | $OP_1$ | | |
| | | | |
| $P_n$ | $OP_2$ | | |

$P_1$ ..... The file address $m_B$ and the digit address $n_C$ of the memory are decided.
$P_2$ ..... The contents of the memory as specified during $P_1$ are unloaded into ACC.
$P_3$ ..... N is the value to be compared with the contents of the memory and the operand area specifies $16 - N$ which in turn is added to the contents of ACC, the sum thereof being loaded back to ACC. The occurrence of a fourth bit carry during the addition suggests that the result of the binary addition exceeds 16, that is, $M + (16 - N) \geq 16$ and hence $M \geq N$. The step is progressed toward $P_4$.
$P_4$ ..... When $M \geq N$ is denied, the program step $P_n$ is selected to carry out the operation $OP_2$.

(XIII) PROCEDURE OF DECIDING WHETHER THE CONTENTS OF A SPECIFIC REGION OF THE MEMORY ARE GREATER THAN A GIVEN VALUE AND DECIDING WHICH ADDRESS (STEP) IS TO BE EXECUTED

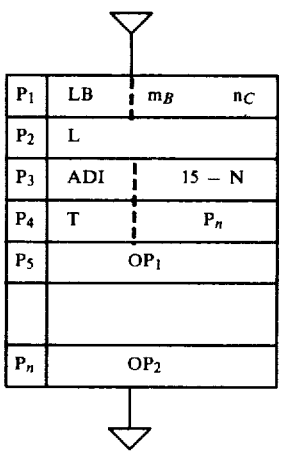

| $P_1$ | LB | $m_B$ | $n_C$ |
| --- | --- | --- | --- |
| $P_2$ | L | | |
| $P_3$ | ADI | | $15 - N$ |
| $P_4$ | T | | $P_n$ |
| $P_5$ | $OP_1$ | | |
| | | | |
| $P_n$ | $OP_2$ | | |

$P_1$ ..... The file address $m_B$ and the digit address $n_C$ of the memory are decided.
$P_2$ ..... The contents of the memory as specified during $P_1$ are unloaded into ACC.
$P_3$ ..... N is the value to be compared with the contents of the memory and the operand area specifies $15 - N$ which in turn is added to the contents of ACC, the sum thereof being loaded back to ACC. The occurrence of a fourth bit carry during the addition suggests that the results of binary addition exceeds 16, that is, $M + (15 - N) \geq 16$ and hence $M \geq N + 1$ and $M > N$. The step is progressed toward $P_5$ with skipping $P_4$, thus performing the operation $OP_1$. In the absence of a carry (namely, $M > N$) the step $P_4$ is reached.
$P_4$ ..... When $M \geq N$ is denied, the program address (Step) $P_n$ is selected to carry out the operation $OP_2$.

(XIV) PROCEDURE OF DISPLAYING THE CONTENTS OF A SPECIFIC REGION OF THE MEMORY (Type 1)

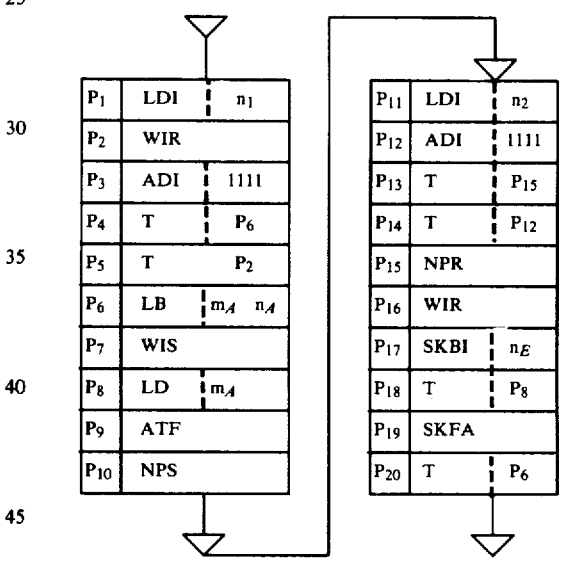

| $P_1$ | LDI | $n_1$ |
| --- | --- | --- |
| $P_2$ | WIR | |
| $P_3$ | ADI | 1111 |
| $P_4$ | T | $P_6$ |
| $P_5$ | T | $P_2$ |
| $P_6$ | LB | $m_A$  $n_A$ |
| $P_7$ | WIS | |
| $P_8$ | LD | $m_A$ |
| $P_9$ | ATF | |
| $P_{10}$ | NPS | |

| $P_{11}$ | LDI | $n_2$ |
| --- | --- | --- |
| $P_{12}$ | ADI | 1111 |
| $P_{13}$ | T | $P_{15}$ |
| $P_{14}$ | T | $P_{12}$ |
| $P_{15}$ | NPR | |
| $P_{16}$ | WIR | |
| $P_{17}$ | SKBI | $n_E$ |
| $P_{18}$ | T | $P_8$ |
| $P_{19}$ | SKFA | |
| $P_{20}$ | T | $P_6$ |

$P_1$ ..... The bit number $n_1$ of the buffer register W is loaded into ACC to reset the overall contents of the buffer register W for generating digit selection signals effective to drive a display panel on a time sharing basis.
$P_2$ ..... After the overall contents of the register W are one bit shifted to the right, its first bit is loaded with "0". This procedure is repeated via $P_4$ until $C_4 = 1$ during $P_3$, thus resetting the overall contents of W.
$P_3$ ..... The operand $I_A$ is decided as "1111" and $AC + 1111$ is effected (this substantially corresponds to ACC-1). Since ACC is loaded with $n_1$ during $P_1$, this process is repeated $n_1$ times. When the addition of "1111" is effected following ACC = 0, the fourth bit carry $C_4$ assumes "0". When this occurs, the step is advanced to $P_4$. Otherwise the step is skipped up to $P_5$.
$P_4$ ..... When the fourth bit carry $C_4 = 0$ during ACC + 1111, the overall contents of W are reduced to "0" to thereby complete all the pre-display processes. The first address $P_6$ is set for the memory display steps.

(XIV) PROCEDURE OF DISPLAYING THE CONTENTS OF A SPECIFIC REGION OF THE MEMORY $P_5$ ..... In the event that the fourth bit carry $C_4 = 1$ during ACC + 1111, the overall contents of W have not yet reduced to "0". Under these circumstances $P_2$ is reverted to repeat the introduction of "0" into W.

$P_6$ ..... The first digit position of the memory region which contains data to be displayed is identified by the file address $m_A$ and the digit address $n_A$.

$P_7$ ..... After the contents of the register W for generating the digit selection signals are one bit shifted to the right, its first bit position is loaded with "1" and thus ready to supply the digit selection signal to the first digit position of the display.

$P_8$ ..... The contents of the specific region of the memory are unloaded into ACC. The file address of the memory still remains at $m_A$, whereas the digit address is decremented for the next succeeding digit processing.

$P_9$ ..... The contents of the memory is shifted from ACC to the buffer register F. The contents of the register F are supplied to the segment decoder SD to generate segment display signals.

$P_{10}$ ..... To lead out the contents of the register W as display signals, the conditional F/F $N_p$ is supplied with "1" and placed into the set state. As a result of this, the contents of the memory processed during $P_9$ are displayed on the first digit position of the display.

$P_{11}$ ..... A count initial value $n_2$ is loaded into ACC to determine a one digit long display period of time.

$P_{12}$ ..... ACC-1 is carried out like $P_3$. When ACC does not assume "0" (when $C_4 = 1$) the step is skipped up to $P_{14}$.

$P_{13}$ ..... A desired period of display is determined by counting the contents of ACC during $P_{12}$. After the completion of the counting $P_{15}$ is reached from $P_{13}$. The counting period is equal in length to a one-digit display period of time.

$P_{14}$ ..... Before the passage of the desired period of display the step is progressed from $P_{12}$ to $P_{14}$ with skipping $P_{13}$ and jumped back to $P_{12}$. This procedure is repeated.

$P_{15}$ ..... $N_p$ is reset to stop supplying the digit selection signals to the display. Until $N_p$ is set again during $P_{10}$, overlapping display problems are avoided by using the adjacent digit signals.

$P_{16}$ ..... The register W is one bit shifted to the right and its first bit position is loaded with "0". "1" introduced during $P_7$ is one bit shifted down for preparation of the next succeeding digit selection.

$P_{17}$ ..... It is decided whether the ultimate digit of the memory to be displayed has been processed and actually whether the value $n_E$ of the last second digit has been reached because the step $P_8$ of $B_L - 1$ is in effect.

$P_{18}$ ..... In the event that ultimate digit has not yet been reached, $P_8$ is reverted for the next succeeding digit display processing.

$P_{19}$ ..... For example, provided that the completion of the display operation is conditional by the flag F/F FA, FA = 1 allows $P_{20}$ to be skipped, thereby concluding all the displaying steps.

$P_{20}$ ..... If FA = 1 at $P_{19}$, the display steps are reopened from the first display and the step is jumped up to $P_6$.

(Type 2)

(XIV) PROCEDURE OF DISPLAYING THE CONTENTS OF A SPECIFIC REGION OF THE MEMORY

| $P_1$ | LDI | $n_1$ |
|---|---|---|
| $P_2$ | WIR | |
| $P_3$ | ADI | 1111 |
| $P_4$ | T | $P_6$ |
| $P_5$ | T | $P_2$ |
| $P_6$ | LB | $m_A$  $n_A$ |
| $P_7$ | LD | $m_A$ |
| $P_8$ | LXA | |
| $P_9$ | LD | $m_A$ |
| $P_{10}$ | STPO | |

| $P_{11}$ | WIS | |
|---|---|---|
| $P_{12}$ | NPS | |
| $P_{13}$ | LDI | $n_2$ |
| $P_{14}$ | ADI | 1111 |
| $P_{15}$ | T | $P_{17}$ |
| $P_{16}$ | T | $P_{14}$ |
| $P_{17}$ | NPR | |
| $P_{18}$ | WIR | |
| $P_{19}$ | SKBI | |
| $P_{20}$ | T | $P_7$ |

$P_1$ ..... The bit number $n_1$ of the buffer register W is loaded into ACC to reset the overall contents of the buffer register W for generating digit selection signals effective to drive a display panel on a time sharing basis.

$P_2$ ..... After the overall contents of the register W are one bit shifted to the right, its first bit is loaded with "0". This procedure is repeated via $P_4$ until $C_4 = 1$ during $P_3$, thus resetting the overall contents of W.

$P_3$ ..... The operand $I_A$ is decided as "1111" and AC + 1111 is effected (this substantially corresponds to ACC-1). Since ACC is loaded with $n_1$ during $P_1$, this process is repeated $n_1$ times. When the addition of "1111" is effected following ACC = 0, the fourth bit carry $C_4$ assumes "0". When this occurs, the step is advanced to $P_4$. Otherwise the step is skipped up to $P_5$.

$P_4$ ..... When the fourth bit carry $C_4 = 0$ during ACC + 1111, the overall contents of W are reduced to "0" to thereby complete all the pre-display processes. The first address $P_6$ is set for the memory display steps.

$P_5$ ..... In the event that the fourth bit carry $C_4 = 1$ during ACC + 1111, the overall contents of W have not yet reduced to "0". Under these circumstances $P_2$ is reverted to repeat the introduction of "0" into W.

$P_6$ ..... The upper four bits of the first digit position of the memory region which contains data to be displayed are identified by the file address $m_A$ and the digit address $m_A$.

$P_7$ ..... The contents of the specific region of the memory are unloaded into ACC. The file address of the memory still remains at $m_A$, whereas the digit address is decremented to specify the lower four bits.

$P_8$ ..... The contents of ACC, the upper four bits, are transmitted into the temporary register X.

$P_9$ ..... The contents of the specific region of the memory are unloaded into ACC. The file address of the memory still remains at $m_A$, whereas the digit address is decremented to specify the upper four bits of the next succeeding digit.

$P_{10}$ ..... The contents of ACC are unloaded into

(XIV) PROCEDURE OF DISPLAYING THE CONTENTS OF A SPECIFIC REGION OF THE MEMORY

| | |
|---|---|
| | the stack register SA and the contents of the temporary register X into the stack register SX. |
| $P_{11}$ | After the contents of the register W for generating the digit selection signals are one bit shifted to the right, its first bit position is loaded with "1" and thus ready to supply the digit selection signal to the first digit position of the display. |
| $P_{12}$ | To lead out the contents of the register W as display signals, the conditional F/F $N_p$ is supplied with "1" and placed into the set state. As a result of this, the contents of the memory processed during $P_{10}$ are displayed on the first digit position of the display. |
| $P_{13}$ | A count initial value $n_2$ is loaded into ACC to determine a one digit long display period of time. |
| $P_{14}$ | ACC − 1 is carried out like $P_3$. When ACC assumes "0" $P_{15}$ is reached and when ACC ≠ 0 (when $C_4$=1) the step is skipped up to $P_{16}$. This procedure is repeated. |
| $P_{15}$ | A desired period of display is determined by counting the contents of ACC during $P_{14}$. After the completion of the counting $P_{17}$ is reached from $P_{15}$. The counting period is equal in length to a one-digit display period of time. |
| $P_{16}$ | Before the passage of the desired period of display the step is progressed from $P_{14}$ to $P_{16}$ with skipping $P_{15}$ and jumped back to $P_{14}$. This procedure is repeated. |
| $P_{17}$ | $N_p$ is reset to stop supplying the digit selection signals to the display. Until $N_p$ is set again during $P_{10}$, overlapping display problems are avoided by using the adjacent digit signals. |
| $P_{18}$ | The register W is one bit shifted to the right and its first bit position is loaded with "0". "1" introduced during $P_7$ is one bit shifted down for preparation of the next succeeding digit selection. |
| $P_{19}$ | It is decided whether the ultimate digit of the memory to be displayed has been processed and actually whether the value $n_E$ of the last second digit has been reached because the step $P_9$ of $B_L$ − 1 is in effect. |
| $P_{20}$ | In the event that ultimate digit has not yet been reached, $P_7$ is reverted for the next succeeding digit display processing. |

(XV) PROCEDURE OF DECIDING WHICH KEY SWITCH IS ACTUATED (SENSING ACTUATION OF ANY KEY DURING DISPLAY)

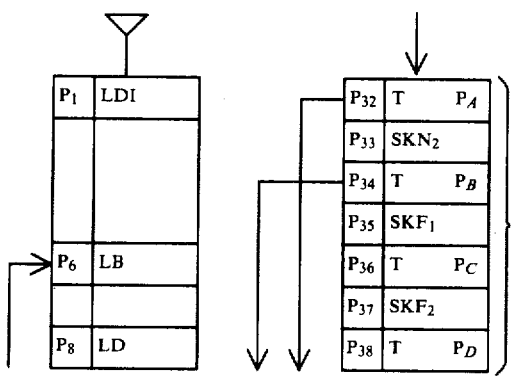

(XV) PROCEDURE OF DECIDING WHICH KEY SWITCH IS ACTUATED (SENSING ACTUATION OF ANY KEY DURING DISPLAY)

| | |
|---|---|
| $P_1$–$P_{18}$ | The display processes as discussed in (XIV) above. |
| $P_{19}$ | After the overall digit contents of the register W are displayed, the flag F/F FC is set to hold all the key signals $I_1$–$I_n$ at a "1" level. |
| $P_{20}$ | The step is jumped to $P_{30}$ as long as any one of the keys connected to the key input $KN_1$ is actuated. |
| $P_{22}$–$P_{27}$ | It is decided whether any one of the keys each connected to the respective key inputs $KN_2$–$KF_2$ and in the absence of any actuation the step is advanced toward the next succeeding step. To the contrary, the presence of the key actuation leads to $P_{30}$. |
| $P_{28}$ | When any key is not actuated, F/F FC is reset to thereby complete the decision as to the key actuations. |
| $P_{29}$ | The step is jumped up to $P_6$ to reopen the display routine. |
| $P_{30}$ | When any key is actually actuated, the memory digit address is set at $n_1$ to generate the first key strobe signal $I_1$. |
| $P_{31}$ | It is decided the if the first key strobe signal $I_1$ is not applied to the key input $KN_1$ then the step is advanced toward $P_{33}$. |
| $P_{32}$ | When the first key strobe signal $I_1$ is applied to the key input $KN_1$, which kind of key actuated is decided. Thereafter, the step is jumped to $P_A$ to provide proper controls according to the key decision. After the completion of the key decision the step is returned directly to $P_1$ to commence the displaying operation |

| | -continued |
|---|---|
| (XV) | PROCEDURE OF DECIDING WHICH KEY SWITCH IS ACTUATED (SENSING ACTUATION OF ANY KEY DURING DISPLAY) |
| | again ($P_Z$ is to jump the step to $P_1$) |
| $P_{33}$-$P_{38}$ | It is sequentially decided whether the keys coupled with the first key strobe signal $I_1$ are actuated. If a specific key is actuated, the step jumps to $P_B$-$P_D$ for providing appropriate controls for that keys. |
| $P_{39}$ | This step is executed when no key coupled with the first key strobe signal $I_1$. This step is to increment the digit address of the memory for the developments of the key strobe signals. |
| $P_{41}$ and up | The appropriate key strobe signals are developed and $KN_1$-$KF_2$ are sequentially monitored to decide what kind of the keys are actuated. Desired steps are then selected to effects control steps for those actuated keys. |
| $P_A$ and up | Control steps for the first actuated keys. |
| $P_X$ | $P_1$ is returned to reopen the display operation after the control steps for the first key. |

The foregoing is the description of the respective major processing events in the CPU architecture.

FIG. 5 is a layout of the RAM contained within the microprocessor CPU of FIG. 3 with the operation thereof described below.

Figure 6A:
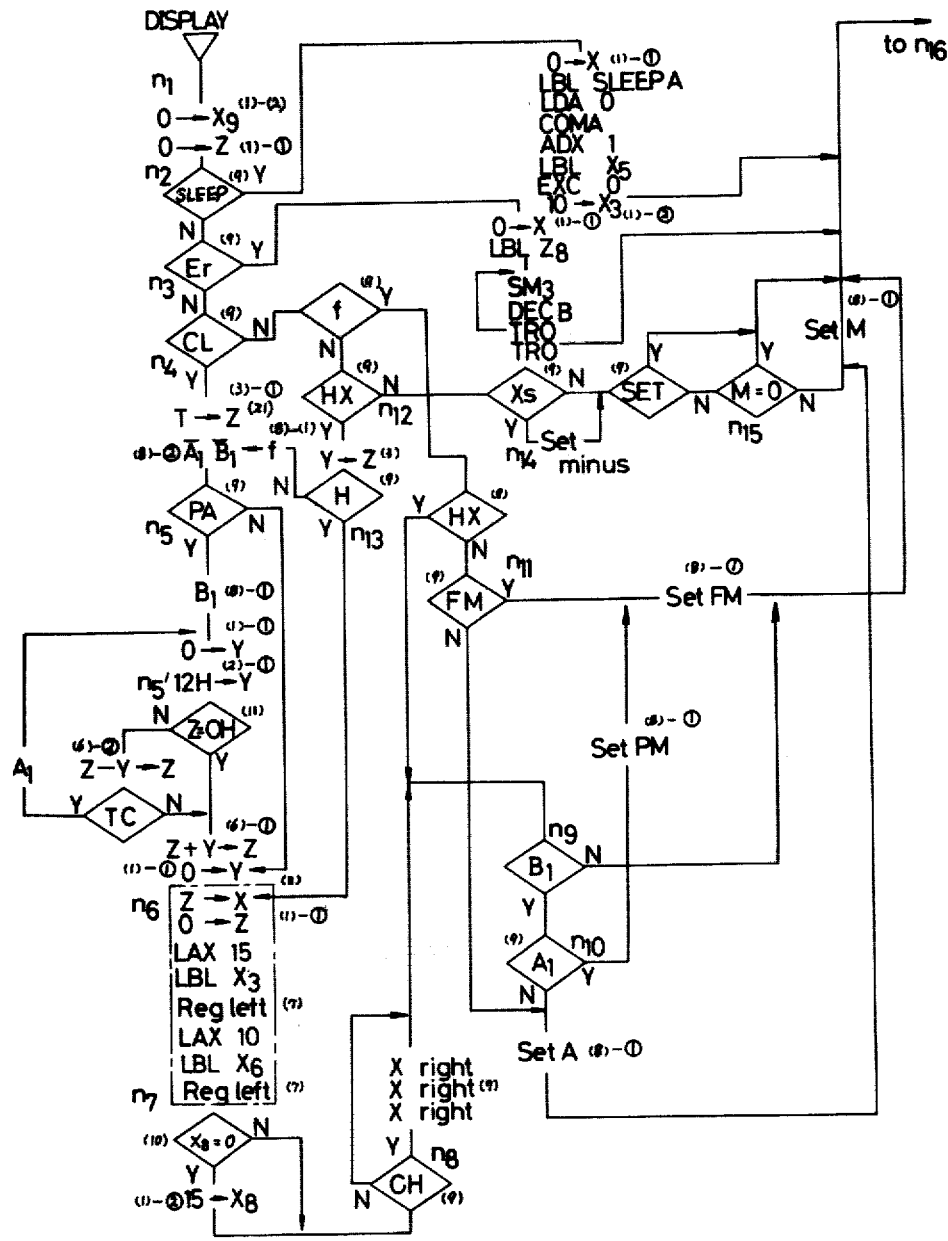
FIGS. 6A through 12B are flow charts showing the operation of the apparatus.
Figure 6B:
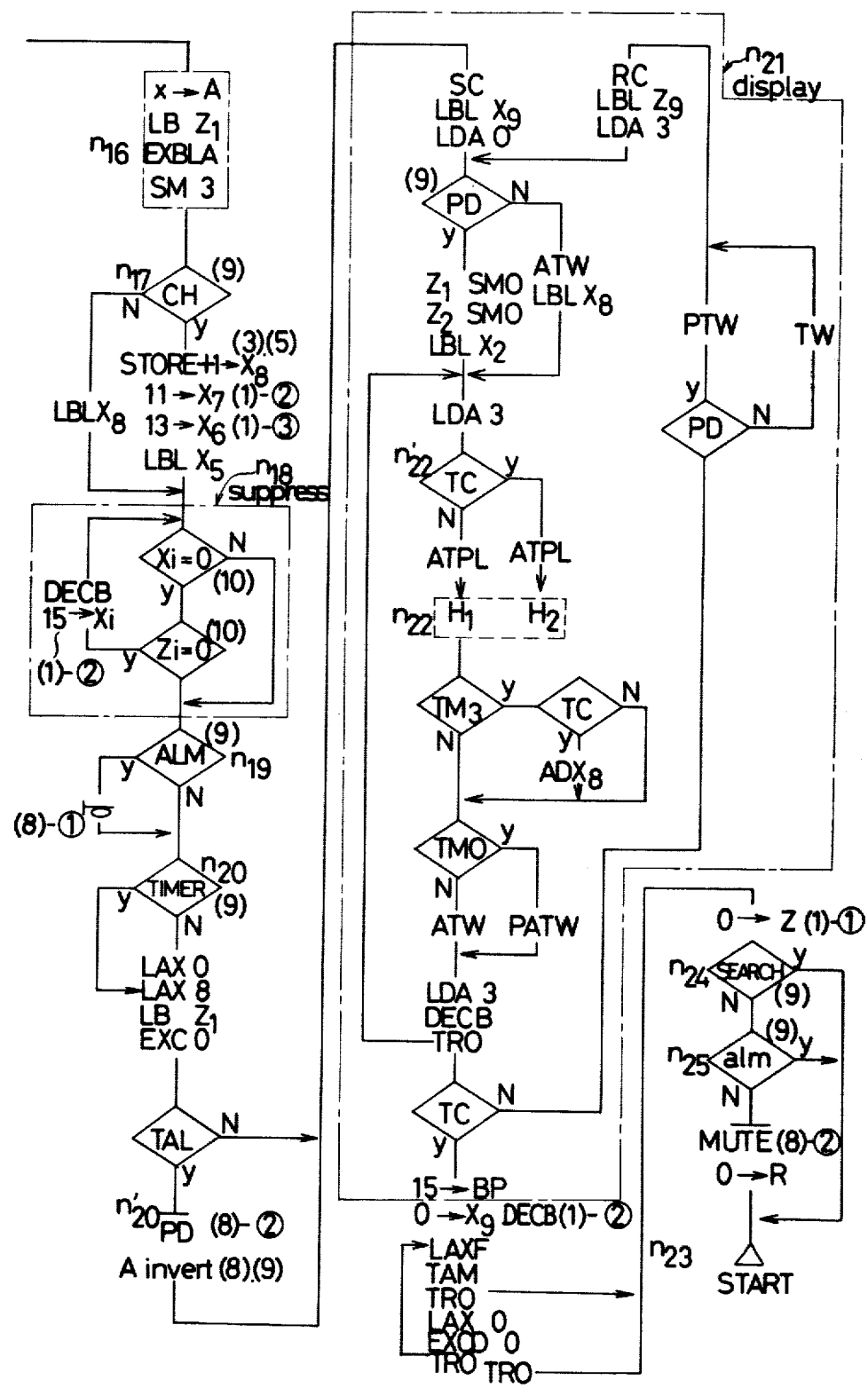
Figure 7A:
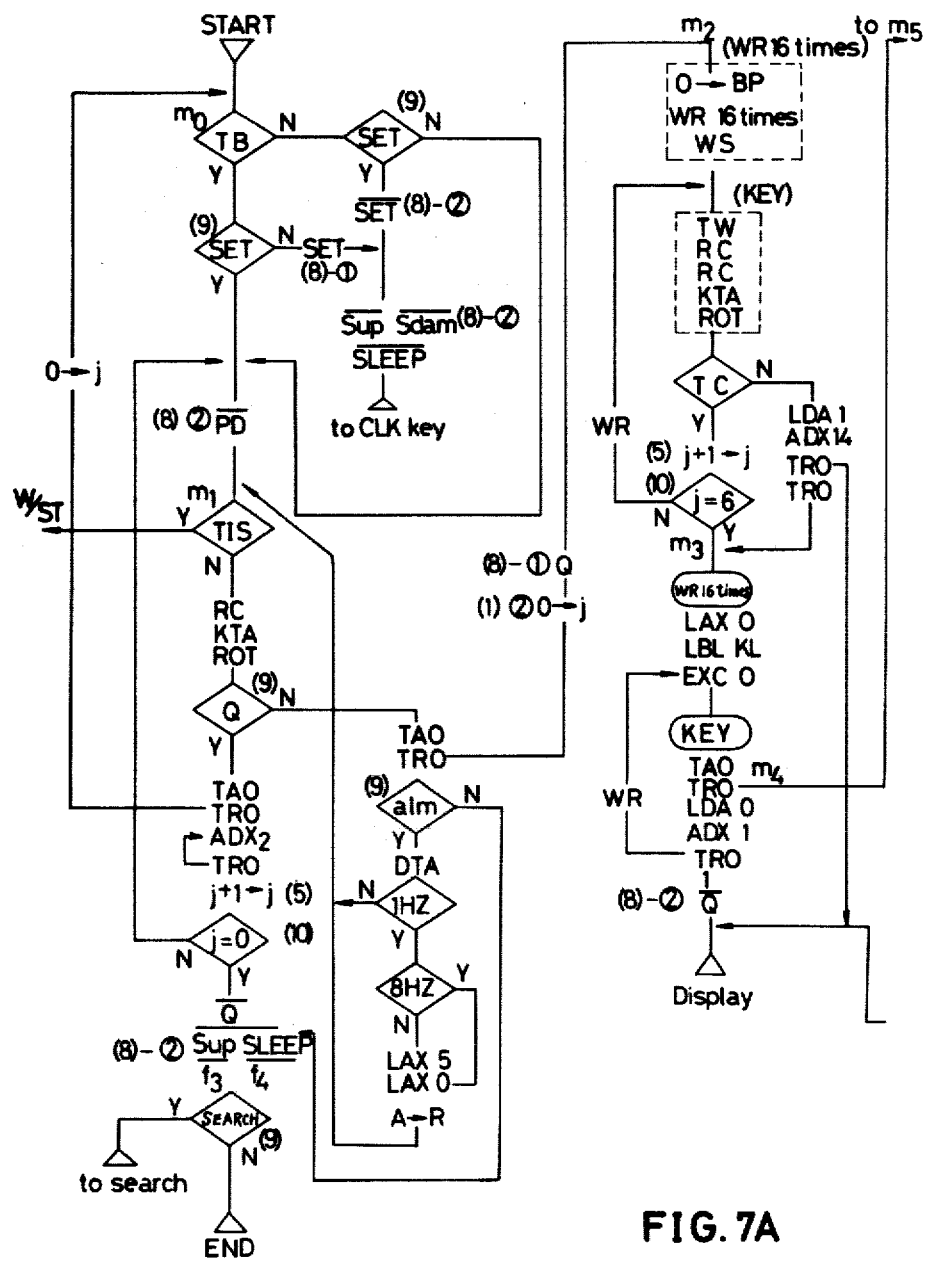
Figure 7B:
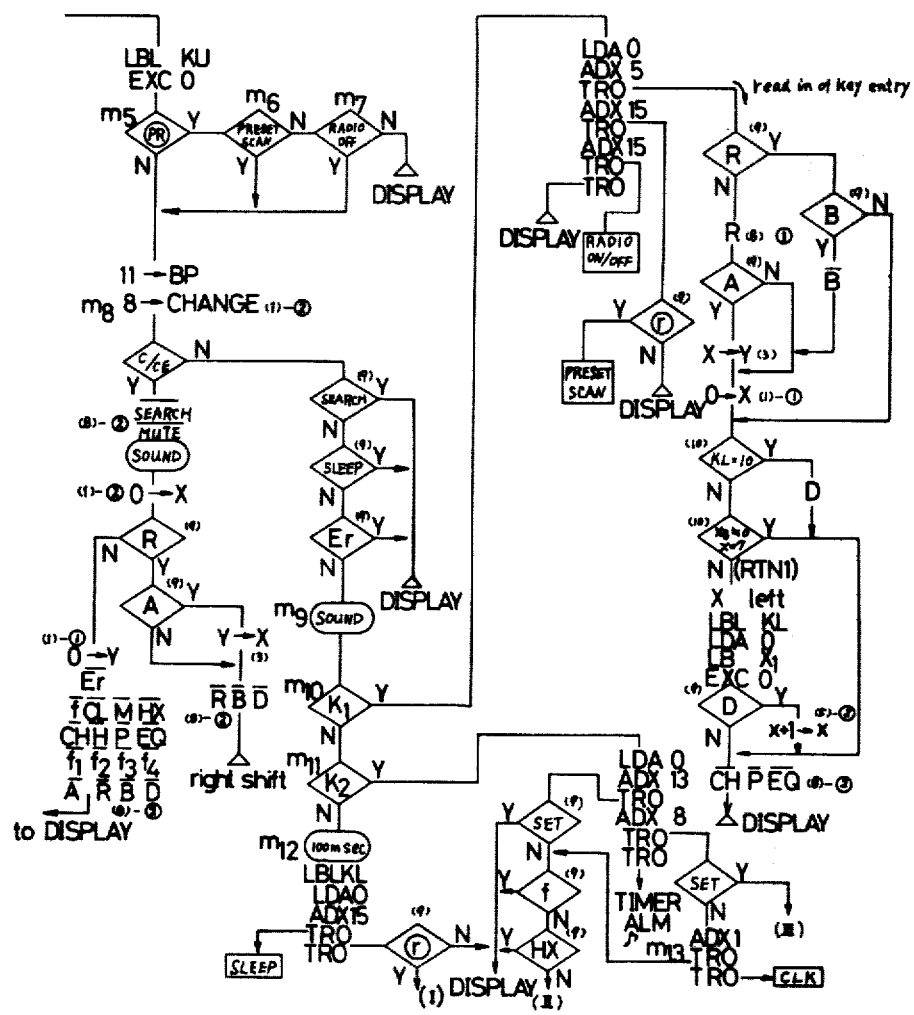
Figure 8A:
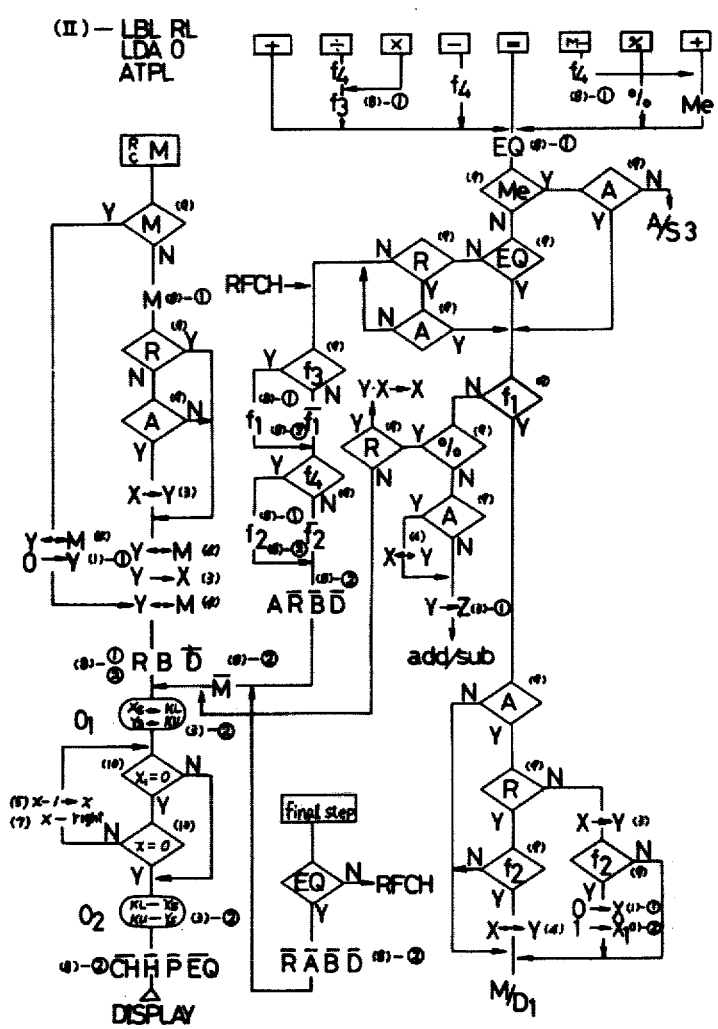
Figure 8B:
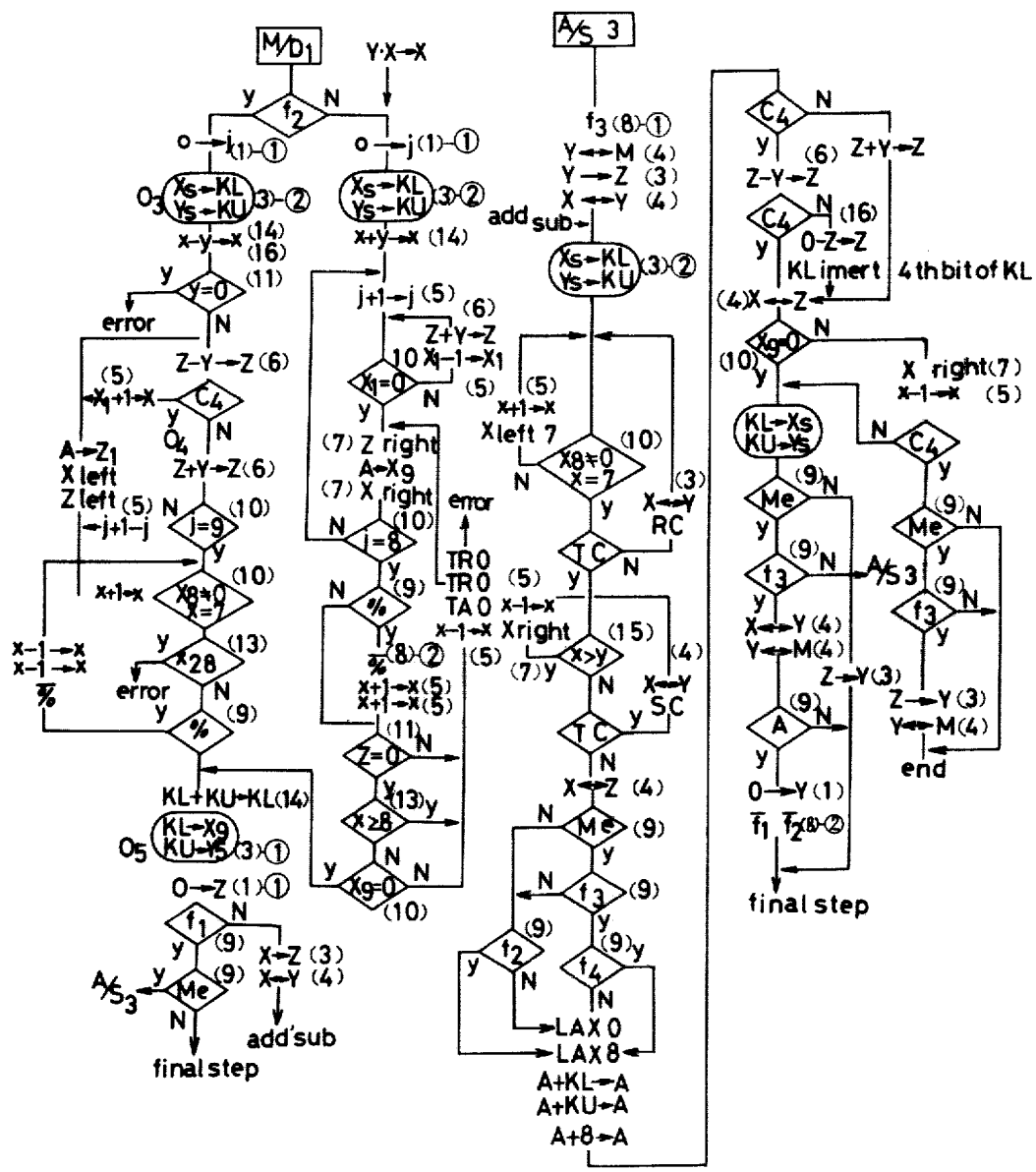

The electronic apparatus according to the above illustrated embodiment of the present invention operates as follows: Flow charts of FIGS. 6 through 12 give a better understanding of the operation of the electronic apparatus, wherein FIGS. 6(A) and 6(B) show a display routine; FIGS. 7(A) and 7(B) show a routine for introducing keyed information into the apparatus and detecting a one-second signal; FIGS. 8(A) and 8(B) show a routine initiated by the actuation of a functional key for the calculator; FIG. 9 shows a timekeeper control routine; FIGS. 10(A), 10(B), 11(A) and 11(B) show routines associated with the radio receiver and FIGS. 12(A) and 12(B) show time setting and time correction routines.

The reference numbers in ( )-0 throughout the flow charts correspond to the numbers of the processing list of the microprocessor. For example, (1)-②represents the process of the type 2 of the processing list (I).

DISPLAY ROUTINE (FIGS. 6A and 6B)

The step $n_1$ is carried out to clear the ninth digit position $X_9$ of the register X in the RAM and the whole of the register Z therein (see FIG. 5). The step $n_2$ decides whether to display SLEEP and, if YES, unloads a sleep timer period from a region SLEEPA of the RAM into $X_5$ of a displaying register X, $X_3$ being loaded with "10" for bar displaying purposes at the same time. SLEEPA contains "t" in the form of "16-t" as specified by the [SLEEP] key. Data to be displayed are obtained by calculating the complement thereof and adding "1" thereto. $n_3$ senses the occurrence of any error and enables all zero's and a decimal to be displayed if YES. $n_4$ decides whether to execute the realtime display mode. $n_5$ also decides whether the 24 hour system or the 12 hour system should be adopted. It will be, however, noted that the 12 hour system requires the time conversion from the 24 hour system to the 12 hour system. At "0" o'clock the step $n_5'$ is effective in loading the register Y in units of hours. The steps $n_6 \rightarrow n_7$ define a display pattern by transferring the contents of the accumulator ACC into the region of the memory addressed and shifting left all the digits more significant than the specified digit. During the step $n_8$ and in the alarm timer time display mode hours and minutes are time display mode hours and minutes are displayed if an YES answer is provided.

If a NO answer is provided at $B_1$ during $n_9$, then no symbol is displayed under the 24 hour system. If a NO answer is provided at $A_1$ during $n_{10}$, then AM is displayed under the 12 hour system and if YES PM is displayed by the segments (e) and (f) of FIG. 13. Those relationships are tabulated as follows:

TABLE 3

| | $A_1$ | $B_1$ |
|---|---|---|
| AM | 0 | 1 |
| PM | 1 | 1 |
| 24 hour | 0 | 0 |

Figures 13, 14:
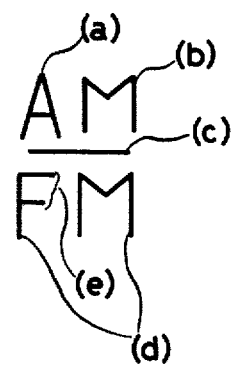
FIG. 13 is a font of displaying segments on the apparatus.
FIG. 14 is a diagram of the relationship between respective keys and their definitions.

In displaying frequency, $n_{11}$ discrimates between AM and PM. In the calculator display mode the decision HX during $n_{12}$ results in a NO answer. When $n_{14}$ senses a negative number, the segment (c) of FIG. 13 is enabled. In the case that the memory is loaded with any number, the decisiom of M=O during $n_{15}$ makes the segment (a) operative.

In the timer and alarm time display mode $n_{13}$ is effected on H and provides a NO answer after a specific point in time is preset or when a preset time is recalled. The hour system of the time to be preset should agree with that in the real time display mode. If NO, the hour system and hours per se remain unchanged. $n_{16}$ placed a decimal point symbol into a position denoted as X. $n_{17}$ established the alarm/timer time display mode or the radio receiver display mode initiated by the channel key. In other word, the channel number contained within STORE is transferred into the most significant digit position of the display register. Since as a matter of fact STORE contains the actual channel number minus 1, a display is provided in the form of +1. The significant digit position $X_7$ stores a value corresponding to "¯|¯" and $X_6$ a value corresponding to "h". As a result, channel numbers are displayed in the form of "3ch 10-10AM", "6ch. 1310AM", etc, during the alarm-/timer display mode. $n_{18}$ effects zero suppressing through the use of suppress codes "15". When ALM is set during $n_{19}$ and thus an alarm sound is to be released at a preset time, an alarm symbol ¦△ is set at the second bit position of $Z_9$. When TIMER is set during $n_{20}$ and thus the radio receiver is to be enabled with a preset channel upon the lapse of a preset time, a timer symbol "▶■" is set. It is preferable that a decimal point segment at the least significant digit position of an 8-digit display be used as the timer symbol. In this case ▶■ is displayed with $Z_1 = 8$.

$n_{21} \rightarrow n_{22}$ generate segment selection codes at points in time for back plates $H_1$ and $H_2$ according to data contained within the registers X and Z, supply the segment selection codes to display segment registers W and W' and load a latch BP connected to the backplates of the display (e.g., a liquid crystal display) with "15" or "111", thus completing the operation of a display decoder. $n_{22}(H_1)$ is follows by $n_{23}'$ which is concluded as YES so that the contents of the accumulator specifies the address of the ROM through the execution of an instruction ATPL. The digit positions subject to the zero suppressing are loaded with "0" through $n_{22} \rightarrow n_{23}$. F implies a zero suppress code "15". An output from an external output terminal ($R_3$) of the microprocessor LSI chip governs the loud speaker of the radio receiver during SEARCH or alarm ON state. The mute signal is supplied to the loud speaker during $n_{24}$ and $n_{25}$. Otherwise the MUTE signal is removed whether the radio power supply is ON or OFF.

KEY ENTRY AND DECISION AS TO ONE-SECOND SIGNAL (FIGS. 7A and 7B)

When the one-second signal is developed or when any key is actuated the microprocessor LSI chip CPU starts being clocked and the ROM is set at the initial address thereof.

The step $m_o$ regarding TB decides whether the slide switch $S_4$ is in the set mode or the normal mode by sensing whether an input terminal $\beta$ of the microprocessor LSI chip is at a high level or a low level. When the mode changes, the timekeeper display is in effect.

The step $m_1$ decides whether the one-second signal has been developed and, if YES, a timekeeper control W/ST becomes operative. $m_2 \rightarrow m_3$ select the frequency band. One of key input common terminals $K_1$-$K_4$ is used as a common side of a frequency band selection switch of which the movable contact side is connected to terminals developing strobe signals in sequence. FIG. 14 depicts the relationship between the respective keys and their definitions. $m_2$-$m_3$ decide when the strobe signal is received by the common terminal, while the respective strobe signals are coupled in sequence with the switch. The respective times when the strobe signals are received are encoded and stored into the RAM in the microprocessor chip, defining the frequency bands and the channel-to-channel frequencies in Japan, United States and other countries. This makes it possible to receive any available radio program all over the world. The steps $m_3$-$m_4$ generate key codes corresponding to the respective keys according to when the strobe signals are received by common terminals other than that as above described.

$m_5$ decides whether the preset scan (channel scan) mode is in progress or whether the channel scan key has been actuated. Key entry is possible except during the preset scan mode, whereas $m_6$ and $m_7$ are in effect and decide whether the

| PRESET SCAN | key and the | ON/OFF | key have been actuated, respectively, during the preset scan mode. Upon the actuation of any other key NONOPE (DISPLAY) becomes operative. In the case that KL=B and KU=1 (the contents of the ACC are circulated during the | KEY | routine), as viewed from FIG. 14 decision as to the

| PRESET SCAN | key by $m_6$ is concluded as YES. Similarly, $m_7$ provides an YES answer when KL=C and KU=1. The next succeeding steps of FIG. 7(B) accomplish key discriminations according to the key codes developed during $m_3$ and $m_4$.

$m_9$ is the touch sound mode which decides whether a conditional F/F is set and, if YES, generates a key touch sound of say 4 kHz at the terminal $R_1$. $m_{10}$ and $m_{11}$ sense key common inputs by the contents of the accumulator ACC. After 100 msec has passed, $m_{12}$ comes into effect as an instruction. $m_{13}$ inverts the conditional F/F.

CALCULATOR ROUTINE (FIGS. 8A and 8B)

Following the key discriminations as viewed from FIG. 7, various operational steps are executed for the calculator functions. FIGS. 8(A) and 8(B) illustrate such operational steps as denoted by II which are to be executed subsequent to the actuations of the functional keys

| R M |
| C   |

| + |, | ÷ |, | × |, | − |, | = |, | M− |, | % | and | M+ |. As is well known in the art of calculators, the display routine is then effected to display the results of calculations. During the routine $O_1$ symbol bits $X_s$ and $Y_s$ of the registers X and Y are placed at the most significant bits of the KL and KU and loaded with "0". $O_4$ decides whether a fourth bit carry occurs in the progress of $Z-Y \rightarrow Z$. In this case the carry occurs if $Z-Y>0$.

Figure 9A:
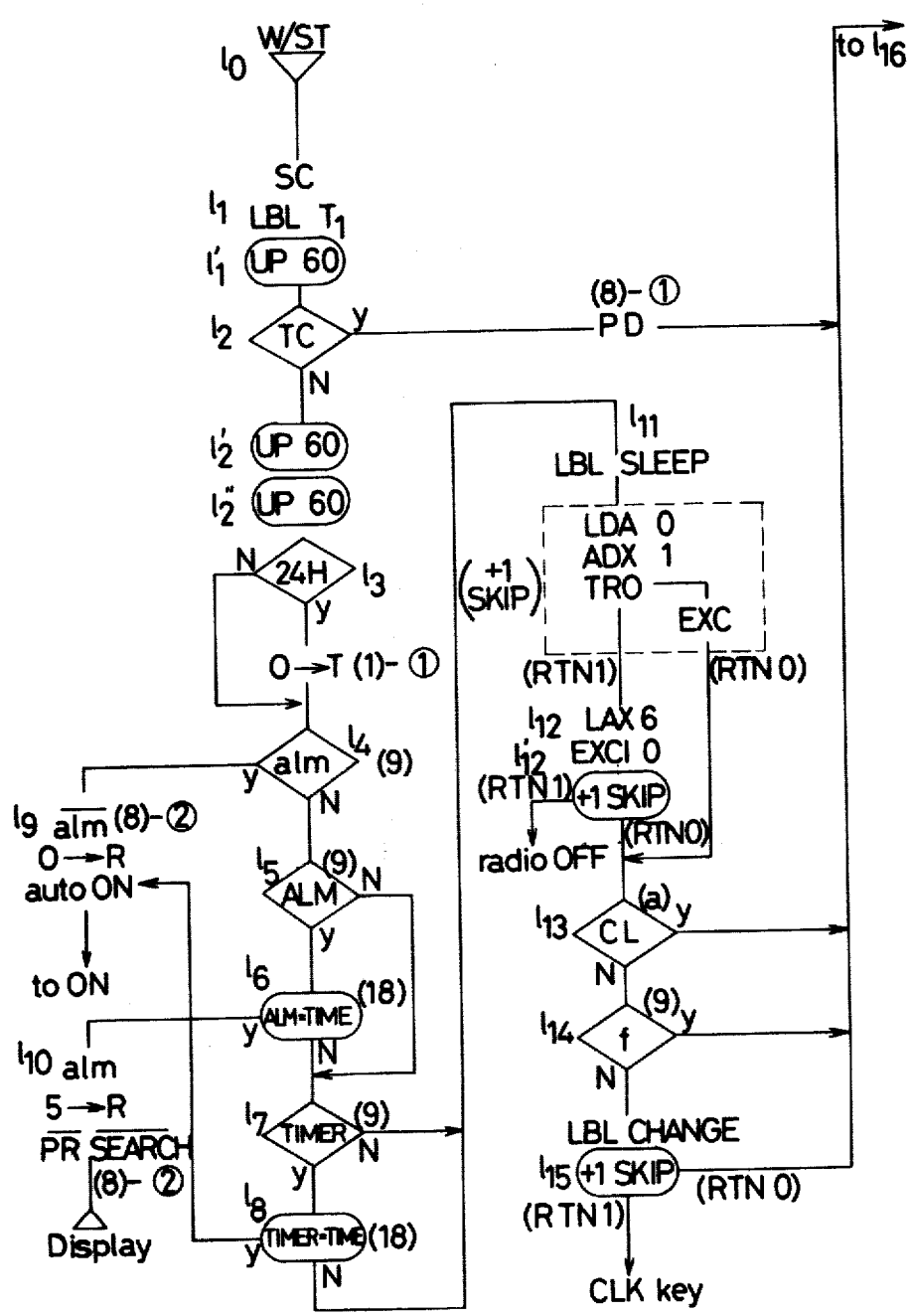
Figure 9B:
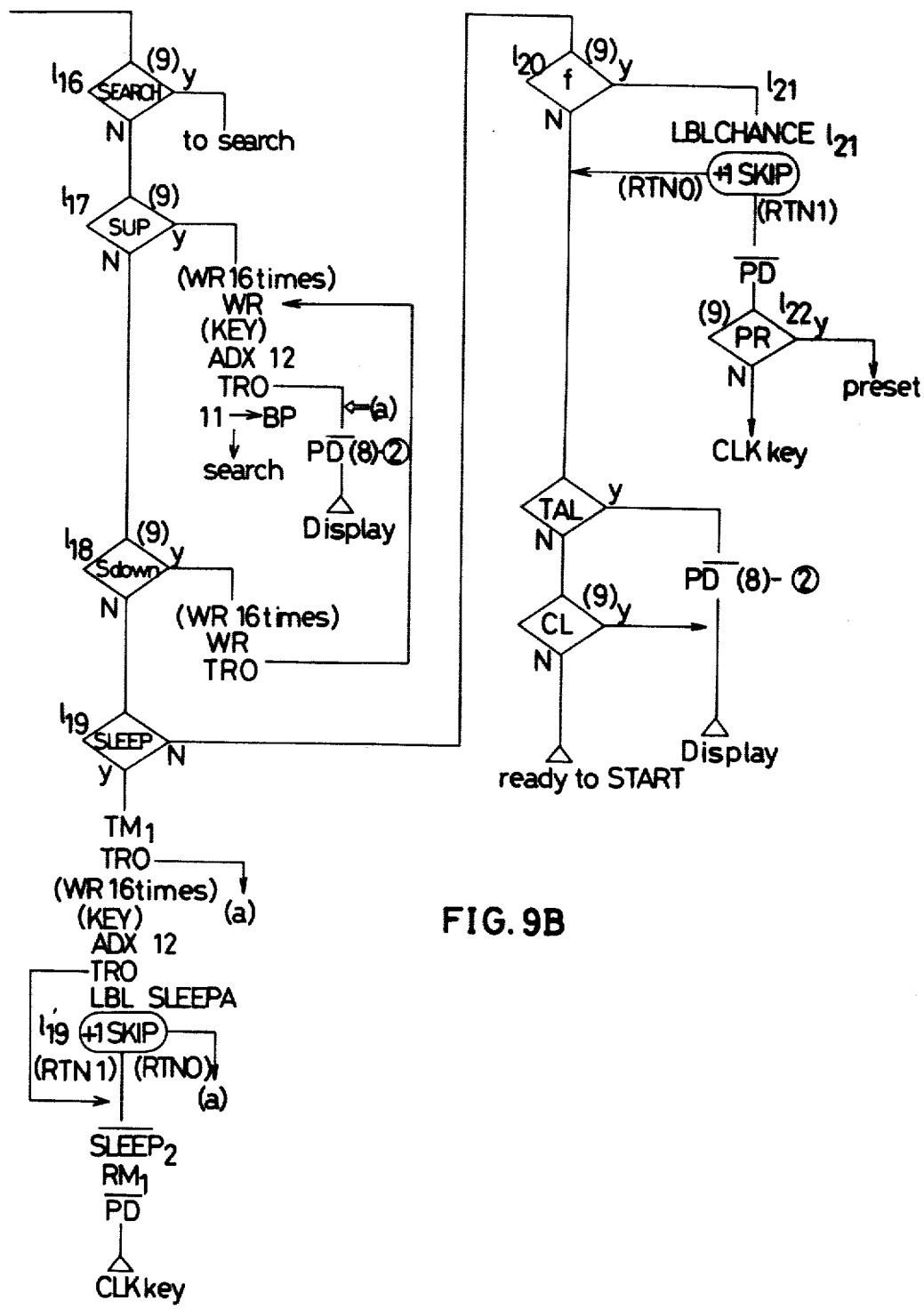

TIMEKEEPER ROUTINE (FIGS. 9A and 9B)

FIGS. 9A and 9B show timekeeper control routines. If the step $m_1$ of FIG. 7 senses the occurrence of the one-second signal, then the W/ST step in FIG. 9 is reached. During the step $l_1$ "1" is added to a second count region (4 bits×2) of a realtime counter in the RAM through sexagesimal calculation. The step $n_2$ provides YES and NO answer in the presence and absence of any carry up to units of minutes, respectively. Sexagesimal addition is executed on minutes and hours counters during the steps $l_2$ and $l_3$. In other words, if "0" appears in units of seconds and carry occurs, sexagesimal addition is effected in units of minutes T through $l_2'$ and in units of tens of minutes through $l_2''$. After sexagesimal addition is completed for the timekeeping counters within the RAM, the timekeeping counters are fully zeroed through $l_3$ as long as they store "24 hours 00 minutes 00 seconds." If an alarm sound has been generated through $l_4$, then the sound is interrupted and the radio receiver is automatically turned ON. $l_5$ provides YES and NO answers when ALM is set and reset, respectively. If ALM is set, $l_6$ decides whether an alarm set time agrees with the information within the timekeeping presence of the agreement. If not $l_7$ becomes operative. The alarm sound is released through $l_{10}$. If the keys ON/OFF and ALARM are not actuated in order to switch OFF the alarm sound, then $l_2$ provides an YES answer and the alarm sound is switched OFF in one minute. Such procedure eliminates the need for a particular counter for controlling the alarm sound. If TIMER is set through $l_7$, then $l_8$ decides whether a TIMER preset time agrees with the information within the timekeeping counters and, if YES, turns automatically ON the radio receiver. On the other hand, $l_{11}$ is reached when TIMER is not set or when the TIMER preset time disagrees with the timekeeping information. During $l_{11}$ the counter SLEEP B within the RAM counts 10 minutes since it contains "6" when the radio receiver is ON. $RTN_1$ is effected when 10 minutes are counted and $RTN_0$ is effected otherwise. Thereafter, the 10 min counter SLEEP B receives "6" and the other counter SLEEPA is incremented one at every ten minutes. SLEEPA decides when to turn OFF the radio receiver. $l_{13}$, $l_{14}$ and $l_{15}$ are the routines which render the timekeeper operative 8 minutes after the completion of the calculator display mode. When the digit keys and the $\boxed{C/CE}$ key are actuated, the calculator display mode becomes operative and CHANGE is loaded with "8" during $m_8$ of FIG. 7 and added with "1" during $l_{15}$ of FIG. 9. CHANGE overflows 8 minutes after the calculator display mode. $l_{13}$ and $l_{14}$ decide whether the calculator display mode is in progress and, if YES, $l_{15}$ allows the display change counter CHANGE to count 8 minutes. After the passage of 8 minutes the CLK key is sensed and the timekeeper display mode is effected. $l_{16}$ decides whether search operation is in progress, followed by $l_{17}$ which decides if the up key $\boxed{\rightarrow}$ is actuated.

"WR 16 times" corresponds to the subroutine WR-16 of FIG. 7. Under these circumstances the strobe signal makes sure whether the $\boxed{\rightarrow}$ key remains actuated. As a result, if the $\boxed{\rightarrow}$ key has been actuated, the search operation takes place with increasing frequency. $l_{18}$ decides whether the key $\boxed{\leftarrow}$ is actuated and, if YES, provides the strobe signal for the purpose of making sure whether the key $\boxed{\leftarrow}$ remains actuated. If so the search operation goes on with decreasing frequency. The above decisions are repeated each time the one-second signal is developed. As long as the key remains actuated, the frequency increases or decreases each second. $l_{19}$ decides with the aid of the strobe signal whether the $\boxed{SLEEP}$ key remains actuated. If YES, the counter SLEEPA is incremented by one. When the $\boxed{SLEEP}$ key is kept actuated, the time to turn OFF the radio receiver after key actuation is presettable at an interval which varies each second (e.g., 60→50→40→30→20→10). The timekeeper display is returned when the $\boxed{SLEEP}$ key is not actuated or after the lapse of one second subsequent to a display of "10-00". When SLEEPA stores "15" (display of 10-00) and the $\boxed{SLEEP}$ key remains actuated for one second, the subroutine $l_{19}$, of $+$1SKIP completes the operation of the calculator and renders the timekeeper display operative through the CLK key. In order to initiate the timekeeper display mode after 8 seconds of the frequency display mode and execute the preset scan operation each 5 seconds, $l_{20}$ decides whether the frequency display mode is in progress. The frequency display mode is still in effect during the preset scan operation, followed by $l_{21}$ which increments the time counting RAM (CHANGE). If $l_{21}$ is executed five times or eight times, then the counter is over, advancing toward $RTN_1$. In the case of the frequency display mode $l_{22}$ is reached after five seconds or 8 seconds. The 4-bit time counter CHANGE in the RAM initially stores "10" and counts five seconds by passing through $l_{21}$ five times. The CHANGE is loaded with "8" except for the frequency display mode in the preset scan operation and can count eight seconds by passing through $l_{21}$ eight times. After five seconds or eight seconds have passed, $l_{22}$ decides whether the preset scan operation is in progress and, if YES, searches for a different channel and, if NO, renders the timekeeper display mode through the CLK key.

Figure 10A:
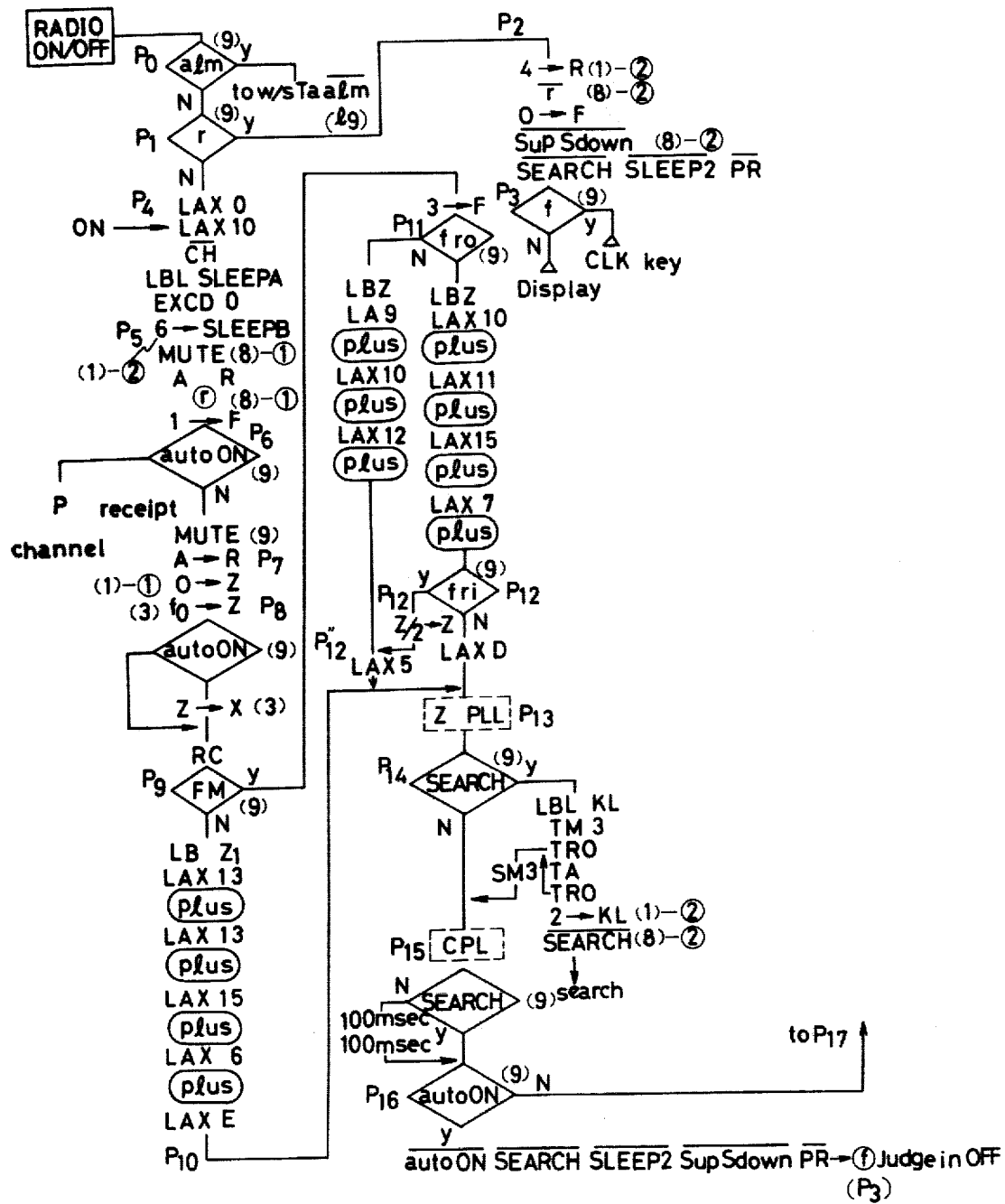
Figure 10B:
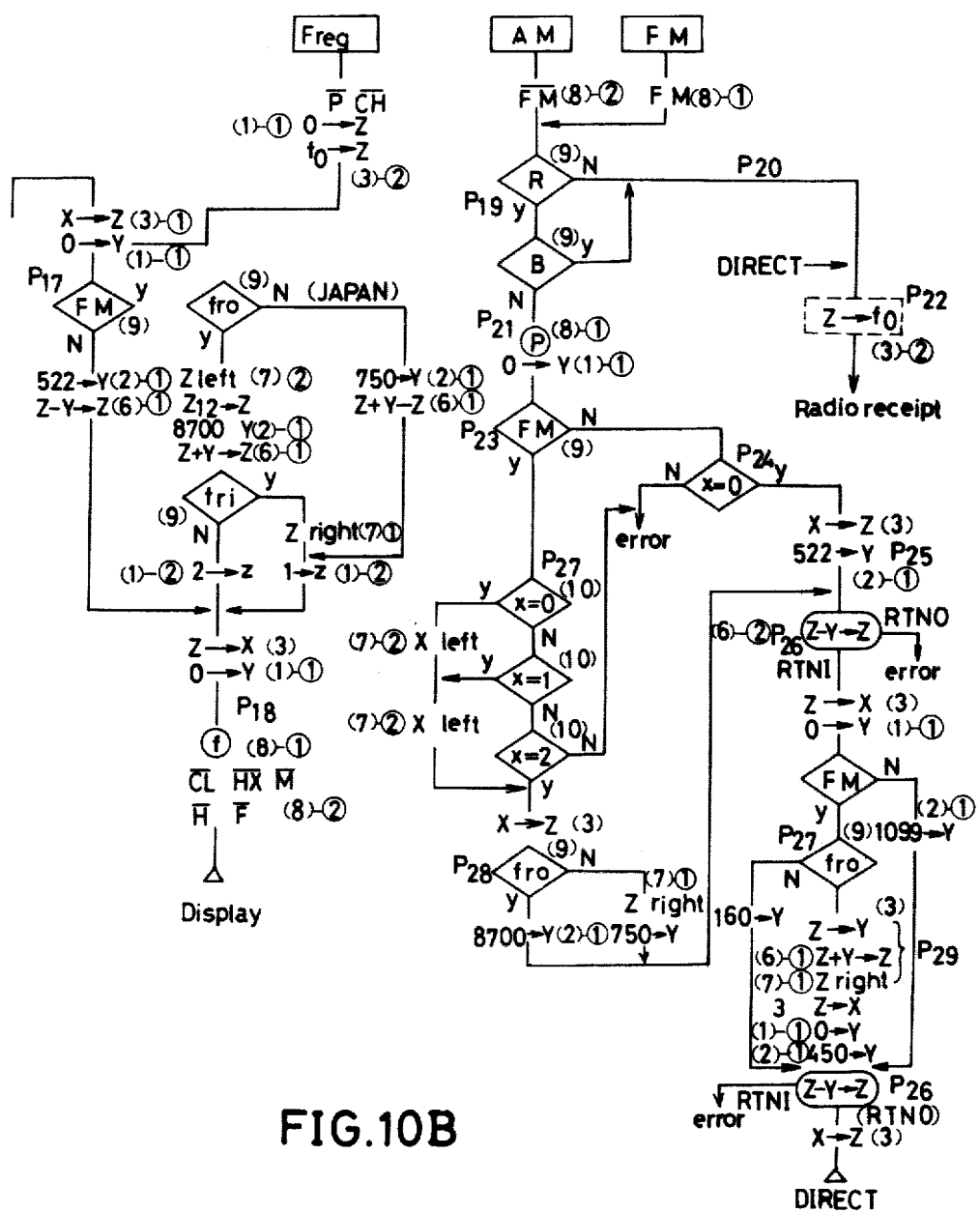

RADIO ON/OFF (FIGS. 10A and 10B)

The ON/OFF key turns ON and OFF the radio power supply and, when the alarm sound is generated, turns OFF the alarm sound and aids in receiving a preset frequency channel.

The actuation of the ON/OFF key initiates the routine RADIO ON/OFF of FIG. 10. If the alarm sound is generated at $P_0$, the steps, alarm sound OFF and radio auto ON are effected, enabling the $\boxed{ON/OFF}$ key to turn OFF the alarm sound and turn ON the radio receiver. $P_1$ decides whether the radio receiver is in the ON state or the OFF state. The step r with a YES answer suggests that the radio receiver is in the ON state. The radio receiver is turned OFF upon $P_2$.

hen being developed from the external output terminal $R_3$ of the LSI chip, the MUTE signal renders the output terminals $FO_1$–$FO_4$ associated with the radio receiver inoperative at $P_2$. This eliminates the possibility of noise from the loud speaker. The decision concerning F at $P_2$ is to change the mode from the frequency display mode to the timekeeper display mode upon the turning OFF of the radio receiver and the actuation of the CLK key and keep the mode unchanged as long as the calculator mode and the timekeeper mode continue. When the radio power supply is OFF with a NO answer at "r", the ON/OFF key is to turn the radio receiver ON during $P_4$–$P_5$, the time counters SLEEPA and SLEEPB are loaded with such values as to turn OFF the radio receiver in 160 minutes. In other words, SLEEPA is loaded with "0" and SLEEPB with "6" such that the former serves as a 10 min counter during $l_{11}$ and the latter turns OFF the radio receiver as soon as it counts 160 minutes. When it is desired to turn ON the radio receiver by the alarm timer and set 60 minutes by the $\boxed{SLEEP}$ key, SLEEPA and SLEEPB are loaded with such values to turn OFF the receiver in 60 minutes. In other words, by loading SLEEPA and SLEEPB with "10" and "6" the radio receiver is turned OFF after 60 minutes have passed as sensed by $l_{12}'$ of FIG. 9. In order to remove noise in turning ON the power supply, the mute signal is supplied to bring the radio power supply ($FO_1$ of the output buffer F) up to a high level via $P_5$ and $P_6$. $P_6$ achieves decision as to the auto ON function and, if YES (the receiver is turned ON by the action of the alarm timer), recalls frequency data indicative of a preset channel which is to be received when the alarm timer is turned ON. Through $P_6$ and $P_7$ the radio receiver jumps into the reception state and receives the mute signal state at the transition of frequency. In this case, the division value $N_p$ indicative of a desired reception frequency is stored within the RAM in terms of the difference from a division value indicative of a minimum receivable frequency. $f_o$ during $P_8$ temporarily stores the difference N of these two division values and transfers it into the PLL controlling register Z. $P_9$ decides whether to receive an AM or FM program. $P_9$ and $P_{10}$ generate the division values for controlling the PLL circuit and receiving any AM program. The division value indicative of the very reception frequency is available from the Z register by adding the division value corresponding to the minimum frequency to the differential division value contained therein. The following table 4 sets forth the frequency band selection codes developed during the steps $m_2$ and $m_3$ of FIG. 7.

TABLE 4

| Frequency Band | | $fr_1$ | $fr_0$ |
|---|---|---|---|
| Japan | 9–100 | 0 | 0 |
| Europe | 9–50 | 0 | 1 |

TABLE 4-continued

| Frequency Band | | $f_{r1}$ | $f_{r0}$ |
|---|---|---|---|
| Japan | 10-100 | 1 | 0 |
| U.S. | 10-200 | 1 | 1 |
| | AM   FM | | |

It is evident from Table 4 that the division values are selectable according to different frequency bands and different channel-to-channel frequencies.

If decision as to $f_{ro}$ provides a NO answer at $P_{11}$, then the respective division values corresponding to the FM frequencies in Japan are provided for the Z register. The subroutine [plus] is for addition on a digit position of the Z register, whereby 643, for example, is added in a decimal notation to the contents of the Z register since $P_{11}$, the results of the addition being loaded into the PLL circuit.

The Z register stores the division values corresponding to the FM broadcasting frequencies in the United States and in Europe, if YES during $P_{11}$ and YES during $P_{12}$ and, if NO during $P_{12}$, respectively. Z/z→Z during $P_{12}'$ divides the contents of the Z register by two and inserts the results back into the Z register. Z→PLL during $P_{13}$ shifts the division value $N_p$ in the Z register into the PLL circuit.

The accumulator is loaded with "0101" during $P_{12}''$ and shifted in contents into $Z_5$ during $P_{13}$ and thereafter 20 bits from $Z_5$ to $Z_1$ are conveyed serially to the PLL circuit. The PLL senses the upper 3 bits of the input data, namely. "010" of $Z_5$, and establishes 5 kHz as the reference frequency (applicable to FM reception in Japan). If further detects "1" at the upper fourth bit position and receives the output of the PRS (prescaler) which divides the local oscillation frequency of the FM receiver section.

Similarly, the accumulator is loaded with "1110" during "1110" and transferred into $Z_5$ during $P_{13}$, the contents of Z being then sent to PLL. PLL senses the upper 3 bits "111" and receives the AM local oscillation frequency $OSC_2$ as the reference frequency of 1 kHz when sensing "0" at the fourth bit position.

Figure 15:
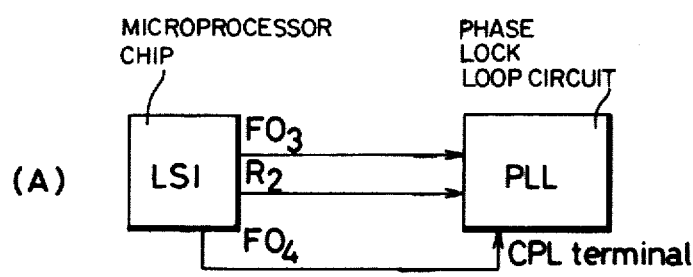
FIG. 15(A) is a diagram of the relationship between the LSI microprocessor and a PLL circuit and FIG. 15(B) is a waveform diagram of output pulses from the PLL circuit.

The division value $N_p$ is transferred into PLL in the following manner. As shown in FIGS. 15(A) and 15(B), the three output terminals $FO_3$, $FO_4$ and $R_2$ of the microprocessor LSI chip are connected to control PLL. The division value $N_p$ in the Z register is delivered from the terminal $FO_3$ bit by bit. When a periodical clock signal is developed at the $R_2$ terminal, PLL holds data supplied from the $FO_3$ terminal for a while. Under these circumstances, however, the PLL clock frequency does not trace an new $N_p$ value and remains unchanged. The new $N_p$ value is stored temporarily within the input buffer SR of PLL.

Figure 16:
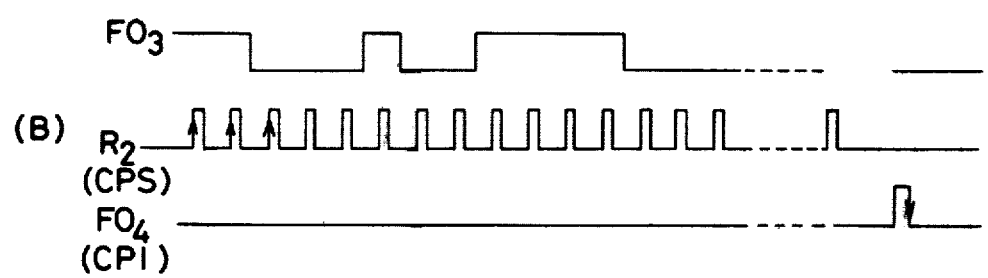
FIG. 16 shows an input buffer register of the PLL circuit.
Figure 16:
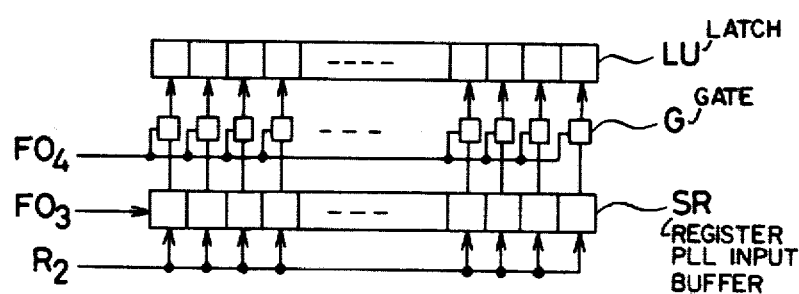

$P_{14}$ decides whether the search operation is in progress and, if YES, detects the receiving intensity at the α terminal. If no radio program is available at the frequency determined by OLL or the input signal to the α terminal is "0", the search operation goes on via $P_{15}$. The search operation stops as soon as any program is received. When this occurs, $f_o$ and PLL receive the division data indicative of the next succeeding or higher frequency channel and convey the same into the register SR in PLL. In order to decide whether a radio program corresponding to the division data in PLL is available or if the input to the α terminal is "1" or "0", the division data are brought into agreement with the division value indicative of that reception frequency by loading KL with "Z" and the operation of the DOWN |←| key. During $P_{15}$ the $FO_4$ terminal (FIG. 15) supplies clock pulses and the frequency corresponding to the division data transferred from the microprocessor LSI chip to PLL during $P_{13}$ is locked. That is, as indicated in FIG. 16, the contents of the shift register SR are shifted to the latch LU via a gate G in response to the input to $FO_4$. The output buffer F is loaded with "1000" during $P_{15}$.

$P_{16}$ decides whether the automatic ON function is in progress and $P_3$ becomes effective when the receiver is turned automatically ON by the alarm timer. Data are held in the arithmetic register to go on calculations when the alarm timer is ON during the calculator display mode.

$P_{17}$ and $P_{18}$ form data in the X register for the frequency display mode by additions of the minimum frequency and the differential division value N.

[FREQ] KEY (FIG. 10B)

The receiving frequency is displayed and the difference N from the division value indicative of the receiving frequency is stored within $f_o$. The data within $f_o$ are unloaded into the Z register, which are obtainable from addition of the minimum frequency. This is same as the ON/OFF routine via $P_{17}$ and $P_{18}$.

AM/FM RECEPTION (FIG. 10B)

After the frequency is set by the actuation of the digit keys, the [AM] key and [FM] key enable an AM radio program and an FM radio program to be received.

As indicated in FIG. 10(B), the [AM] key and the [FM] key lead to the routines [AM] and |FM|, respectively. [AM] resets an FM flag (one bit of RAM) deciding whether FM reception or AM reception is in progress. In the case of FM reception the FM flag is set. $P_{19}$ decides whether the frequency has been set by the digit keys and leads to $P_{21}$ and $P_{20}$ if YES and NO, respectively. Z→$f_o$ during $P_{22}$ shifts the differential division value N into $f_o$. Through $P_{20}$ not only the Z register but also also $f_o$ are cleared. This suggests that the differential division value is reduced to zero and only the minimum frequency remains.

Any AM frequency is introduced during $P_{23}$ which is followed by $P_{24}$. It is understood that any AM broadcasting frequency is represented by an integer rather than a decimal. Any decimal is processed as error by $P_{24}$. The X register stores the frequency entered via the digit keys. When the minimum frequency is selected at 522 kHz, "522" is subtracted from the entered frequency and the entered frequency smaller than "522" is treated as error. The difference between the entered frequency and the minimum frequency remains in the Z register. Since an AM channel is received at an interval of 1 kHz, the differential frequency is equal to the differential division value N. A ceiling of N is selected at 1099 and N greater than 1099 is treated as error. This makes it possible to receive any radio program within a limited range of frequency. The evaluated value N is placed into fo during $P_{22}$ and a program of the frequency corresponding to the value N is received. $P_{23}$ introduces an FM broadcasting frequency, followed by $P_{27}$ whereby up To two digits lower than the decimal point are considered as effective. If YES during $P_{28}$ ($f_{ro}$), the reference frequency is selected at 87.00 MHz for reception in Europe and United States. If NO, the frequency band is determined for Japan. Since the FM frequency is scaled in units of up to 0.1 MHz in Japan, the Z register is shifted right so that the frequency including no more than one digit below the decimal point is treated as effective and the reference minimum frequency is selected at 75.0 MHz. $P_{26}$ defines a lower limit of the FM frequency as in the AM frequency.

$P_{27}$ is concluded as NO since the channel-to-channel frequency is 100 kHz in Japan and the division value N represents accurately the difference from the reference frequency. If YES during $P_{27}$, the operation is carried out for reception in Europe and United States. The channel-to-channel frequency is 50 kHz in Europe and $P_{29}$ divides the differential division value by five to obtain N. As in the case of AM reception $P_{26}$ defines a ceiling of frequency. The division value N for United States is obtained by dividing the counterpart N for Europe by two via $P_{12}'$.

Figure 11A:
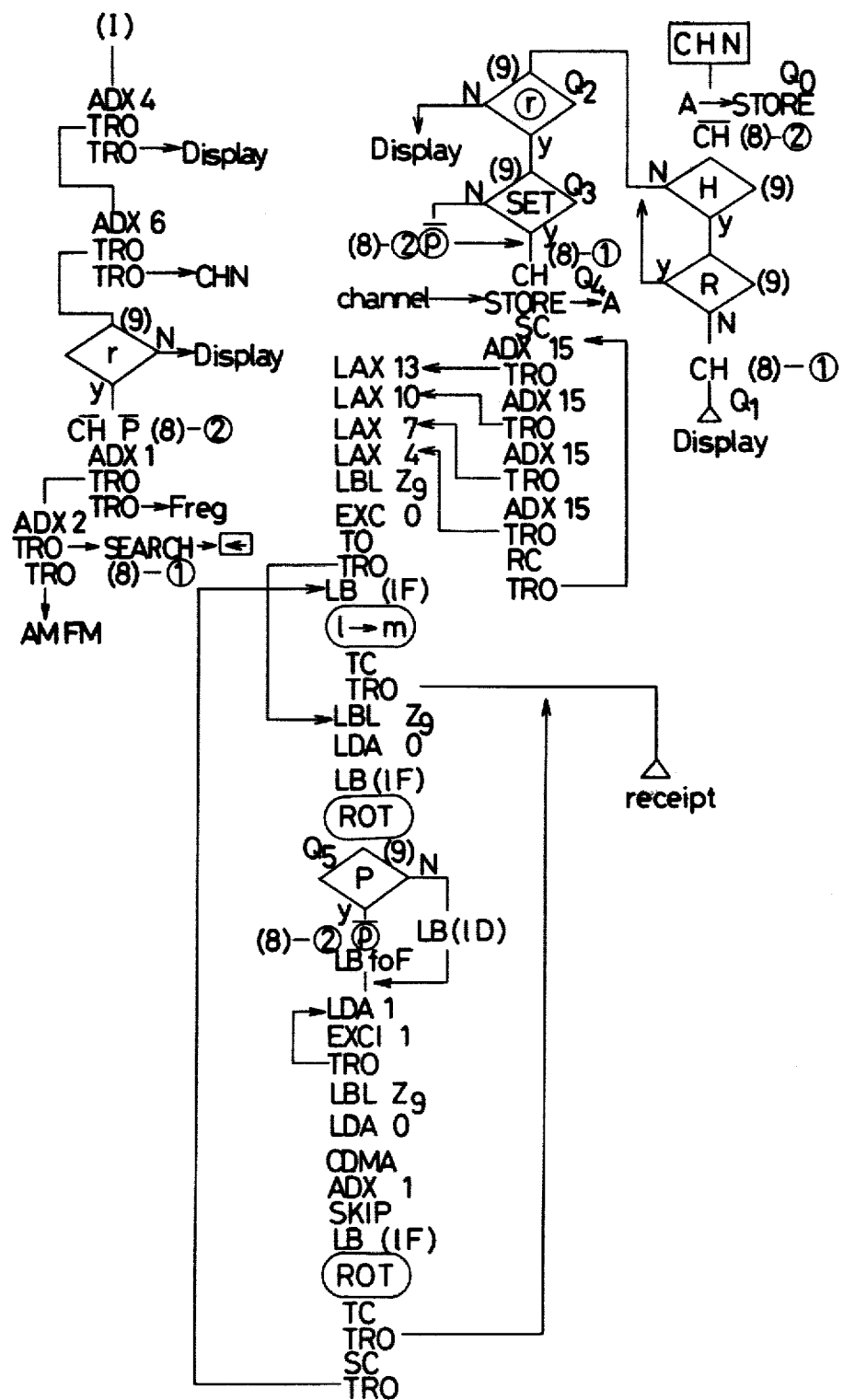
Figure 11B:
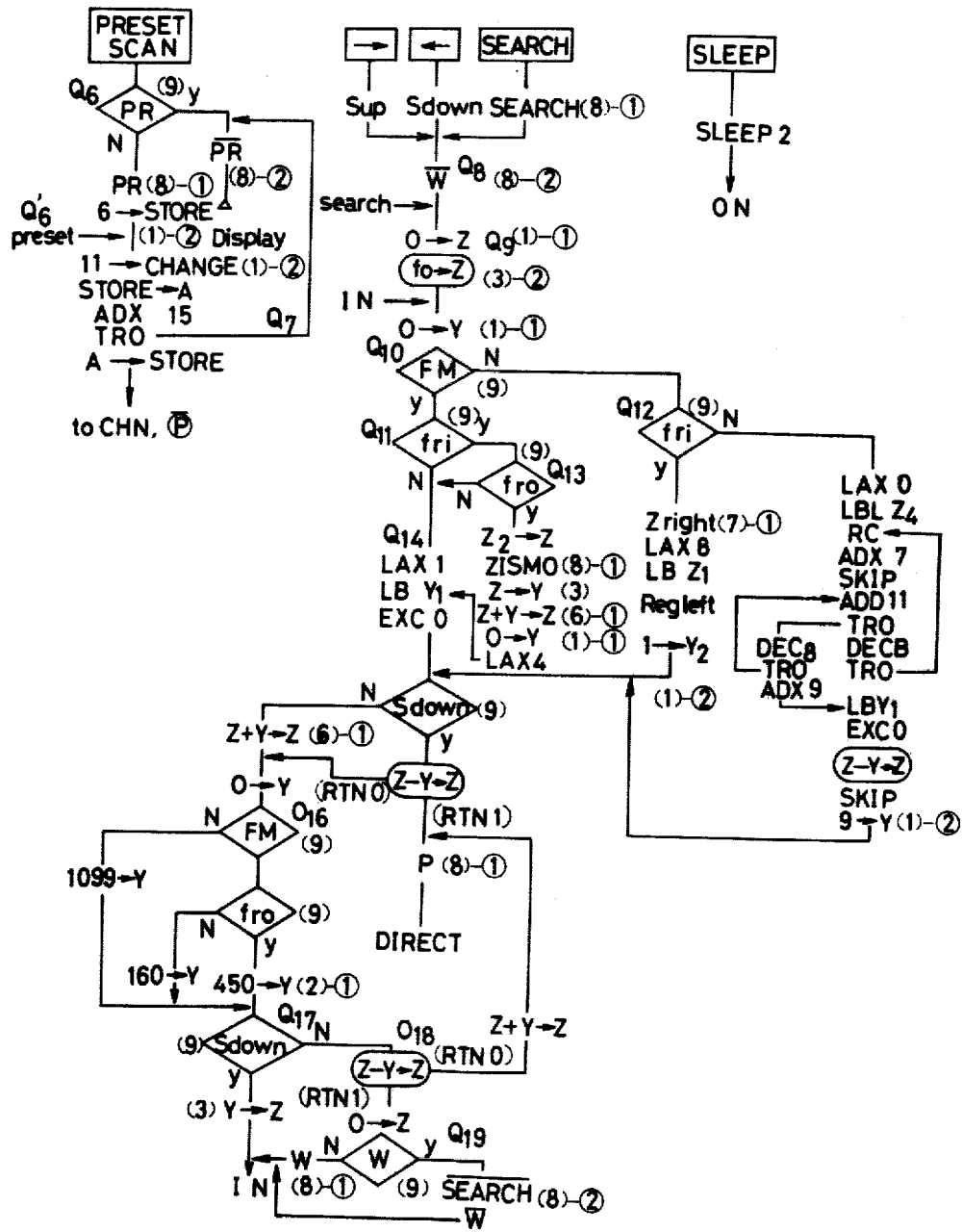
Figure 12A:
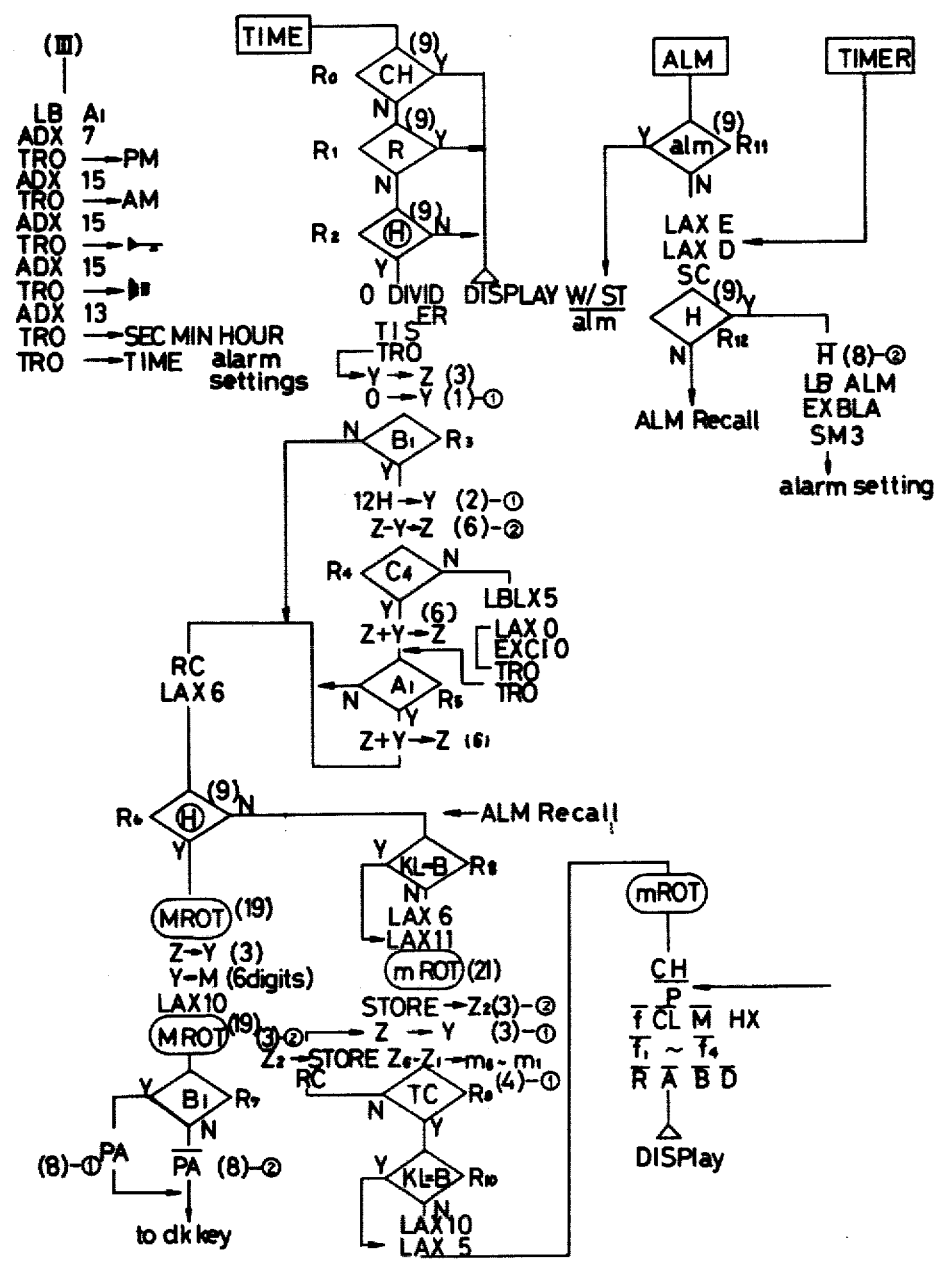
Figure 12B:
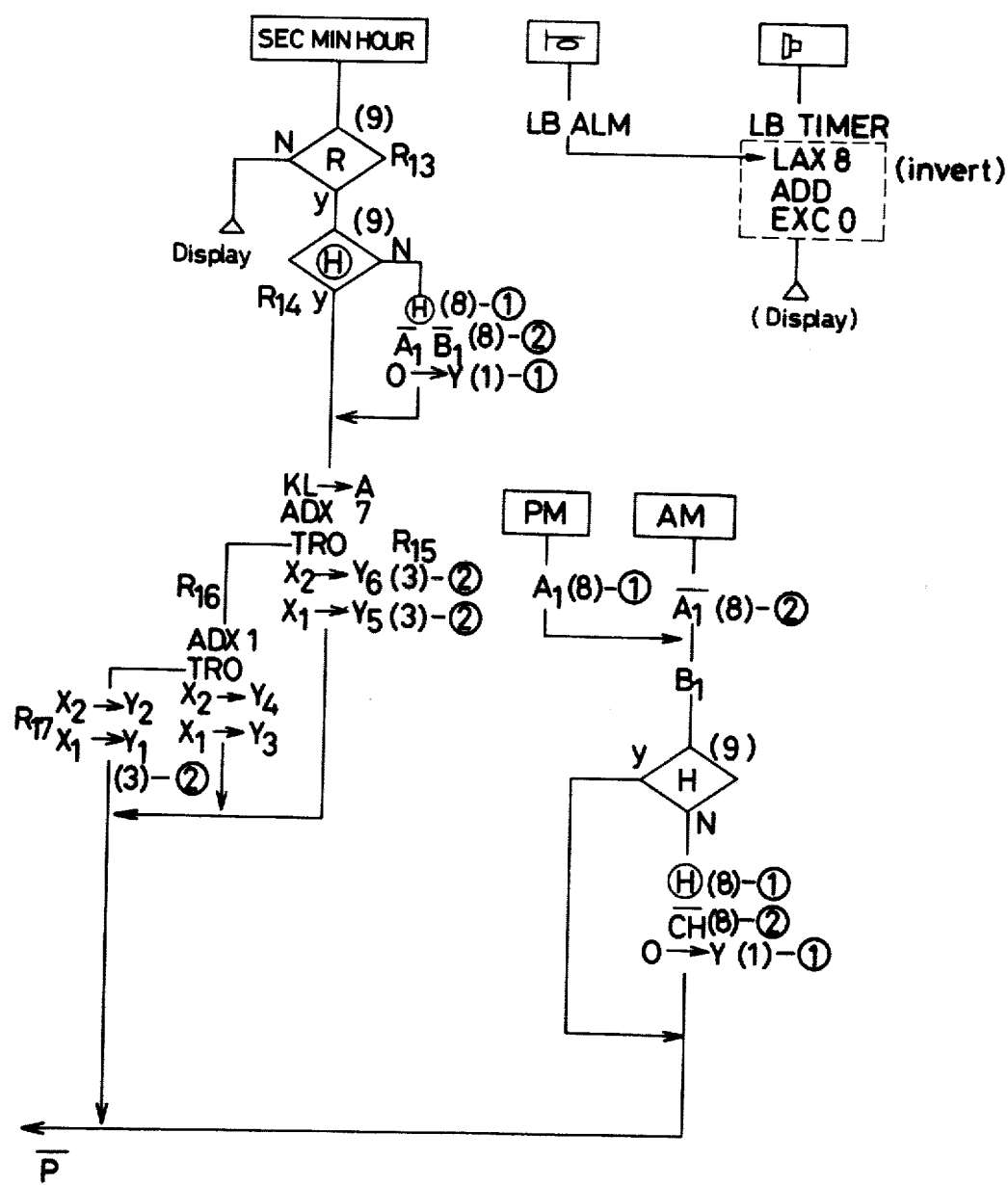

CHANNEL SELECTION AND DISPLAY DURING ALARM TIMER MODE (FIGS. 11A and 11B)

It is possible to specify the broadcasting frequency which is to be enabled when an alarm timer is ON, through the utilization of its associated channel identifying number. Upon the actuation of the channel key the selected channel number is stored into a selected channel storing region STORE of the RAM as shown by the step $Q_0$ of FIG. 11(A). A preset alarm time is displayed as "10-0000AM", for example. Upon the actuation of the [CHN] key that channel number enters into STORE and a CH flag (indicating that the [CH] key is actuated) is set, leading to $Q_0$-$Q_1$ regarding the display routine (FIG. 6A) which monitors the CH flag ($n_8$). The X register is shifted right three times so that the most significant digit position $X_8$ receives the contents of STORE, $X_7$ receives codes for displaying "c" and $X_6$ receives codes for displaying "h", thus providing a display of "3 ch 10-00 AM".

ALARM/TIMER SETTINGS (FIG. 12)

Under the condition where "3ch 10-00AM" is displayed as discussed above, the actuation of the [ALARM] or [TIMER] key sets time or a channel number into the ALM or TIMER region of RAM and sets an ALM or TIMER flag, thus providing a symbol display of or .
The actuation of the alarm or timer key makes [ALM] or [TIMER] of FIGS. 12(A) operative. Following [ALM], $R_{11}$ senses the alarm sound and then interrupts the generation of the alarm sound. When it is desired to set an alarm time, $R_{12}$ is conducted and H is set. If YES during $R_{12}$, ALM or TIMER is set. After the alarm setting is completed, $R_3$-$R_6$ are carried out to convert time representations from the 12 hour system to the 24 hour system. If NO during $R_6$, then $R_8$ decides whether the ALARM key or the TIMER key is actuated the region of RAM which contains ALM time or TIMER time is addressed when the ALARM Key or the TIMER key is sensed, respectively. A preset time and channel number are stored into RAM. Eventually "3ch 10-00AM" is displayed again.

ALARM OR TIMER RECALL

If the [ALM] key or the [TIMER] key is actuated except for the above described settings, then an alarm or timer period is recalled, leading into the step [ALM] or [TIMER] of FIG. 12. Since H remains reset during $R_{12}$ when not in the time setting period, $R_8$ addresses the region of RAM containing the ALM time or TIMER time in response to the actuation of the [ALM] key or the [TIMER] key, respectively. The time contained within the addressed RAM region is recalled into the Y register and the channel number into STORE. Thereafter, flags HX and CH are set to initiate the alarm timer display mode. The time representations in the Y register are changed according to the hour system of the real-time and displayed in the form of "3ch 10-00AM", for example.

CHANNEL FREQUENCY PRESET AND FREQUENCY CHANGE BY CHANNEL KEY (FIG. 11)

There are three alternative ways of presetting channel frequency, for example:

(1) The channel frequency is selected by the digit keys and stores after reception;

(2) It is preset through the auto search operation after reception; and (3) It is preset through the use of the UP or DOWN key.

[CHN] is initiated by the actuation of the [CHN] key. The number indicative of the channel number is loaded into STORE, activating $Q_2$ which determines whether the radio receiver is in the ON or OFF state. Key actuation is treated as invalid when the receiver is OFF (NO answer). ⓟ is executed when not in the SET mode as sensed by $Q_3$. ⓟ is set when the channel frequency is preset. Subsequent to the above procedure (1), (2) or (3), ⓟ is set and the frequency received when the [CHN] key is actuated is preset as the channel frequency. When ⓟ is not set, frequency is recalled. When not in the SET mode, only the frequency recalling operation and the ⓟ are effected. The CH flag is set during the display routine for displaying "ch". $Q_4$ is conducted to recall the channel frequency which is to be received when the alarm timer is ON. When the alarm timer becomes ON, the channel number is unloaded from RAM to STORE.

When ⓟ is set during the step $Q_5$ specifying the RAM region STORE containing the channel frequency. The value N in $f_o$ is stored into the specified RAM region. When ⓟ is not set, the value N is recalled from the channel RAM region to $f_o$. $f_o$ is the location which contains the differential division value N corresponding to the actually received frequency. The radio receiver always is turned according to the value N in $f_o$. Data are transferred between the channel storing RAM region and $f_o$.

After the N value is recalled from the channel storing RAM region into $f_o$ or shifted from fo to the channel storing RAM region, the frequency corresponding to the value N is received.

PRESET SCAN

Preset channels are scanned in sequence from CH6 to CH1 each 5 seconds. All the keys except CHSCAN and ON/OFF are not in effect during the scan operation. The actuation of the CHASCAN key discontinues the scan operation and that of the ON/OFF key turns OFF the radio receiver.

The routine

[PRESET SCAN]

of FIG. 11(B) is selected by the CHSCAN Key. The flag PR is set in the progress of the scan operation, accompanied by the YES answer in $Q_6$. At this time PR is reset and the scan operation stops. If YES during $Q_6$, PR is set and the scan operation goes on.

A number indicative of a first received channel number plus one is stored within the channel storing RAM region STORE. The display changing counter RAM region CHANGE is loaded with "11" and behaves as a 5 sec counter. It is then decided whether the contents of STORE are smaller than the #1 channel number. If it is smaller $Q_7$ is conducted to reset PR and discontinue the scan operation. If the scan operation has not yet advanced up to channel 1, then the contents of STORE are reduced by 1. Then, ⓟ concerning the CHNKEY is effected to select the channel corresponding to the present contents of STORE. After the channel selection and reception, $l_{20}$, $l_{21}$ and $l_{22}$ count a period of 5 seconds when passing through the routine W/ST of FIG. 9. After the lapse of 5 seconds $l_{22}$ provides the YES answer and initiates the preset routine.

Thereafter, a next succeeding channel is searched and received. In this manner, the scan operation goes on from CH6 to CH1 each 5 seconds.

(UP) (DOWN) SEARCH ROUTINE (FIG. 11B)

SEARCH continues with continuously increasing reception frequency from the currently received channel to the next succeeding channel. As viewed from FIG. 8, the search operation is carried out with a saw tooth waveform signal and, when fmax is reached, restarts with f mim and stops with f max.

Figure 17:
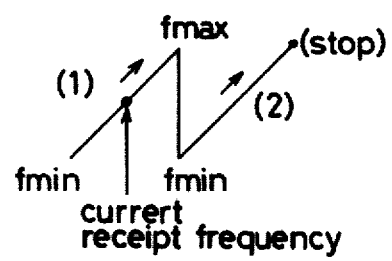
FIG. 17 is a diagram for explanation of broadcasting frequency searching operation.

UP or DOWN increments or decrements the frequency by the channel-to-channel frequency. If the key remains actuated, the frequency is gradually incremented or decremented by the channel-to-channel frequency each 1 second. As noted earlier, the channel-to-channel frequency is different with geometric regions as listed in TABLE 4 and 9 kHz or 10 kHz in the case of AM reception. In the case of FM reception, it is 100 kHz in Japan, 200 kHz in United States and 50 kHz in Europe. The channel-to-channel frequency is established by first selecting the frequency band through $m_2$ and $m_3$ and encoding the same according to TABLE 4 and storing the encoded into RAM. Flags $S_{up}$, $S_{down}$ and SEARCH are set in response to the actuations of the UP →, DOWN ← and SEARCH keys, respectively. "w" is reset during $Q_8$ and disabled when the search operation reaches $f_{max}$ twice. The flag w is set within the region denoted by FIG. 17(A).

During $Q_9$ the value N corresponding to the presently received channel is fetched from $f_o$ and loaded into the Z register. Through $Q_{10}$–$Q_{15}$ the frequency corresponding to the value N is adjusted and brought into exact agreement with any of frequencies available for reception and loaded into the Y register. $Q_{14}$ is selected in the case of FM search in Japan and Europe and $Q_{13}$ in that in United States. The incrementation of the value N by one during $Q_{14}$ implies the increase of frequency by the channel-to-channel frequency. If YES during $Q_{13}$ then the value N should be corrected.

Figure 18:
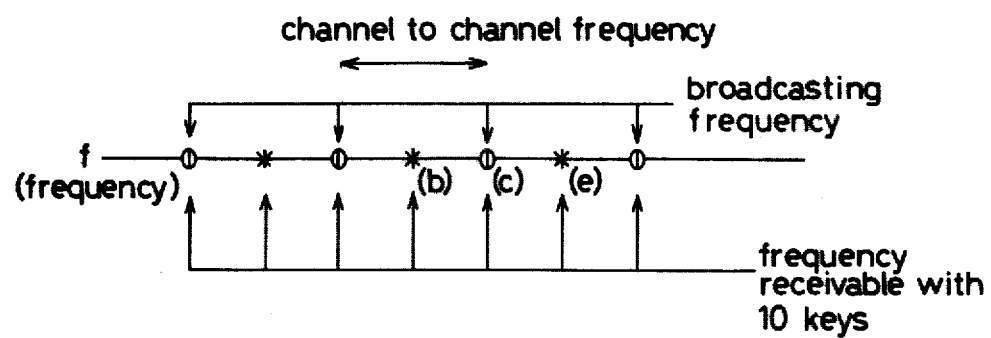
FIG. 18 is a diagram for explanation of reception frequency correcting operation.

Assume now that the presently received frequency appears at (b) in FIG. 18. If the search operation brings the frequency into the position (e), the frequency available for reception is skipped. For this reason the frequency should be corrected into agreement with that frequency. After the correction the value corresponding to the channel-to-channel frequency is loaded is into the Y register.

In the case of AM reception direct settings by the digit keys are scaled in units of the digit keys. If the presently received frequency is not equal to any broadcasting frequency, reception by the search operation is impossible. For this reason the N value corresponding to the presently received frequency should be corrected and the N value corresponding to the channel-to-channel frequency should be loaded into the Y register.

$Q_{15}$ makes decision as to Sdown and the N value corresponding to the channel-to-channel frequency is added or substracted upon the actuation of the DOWN or UP Key, respectively.

The N value indicative of $f_{max}$ is loaded into the Y register via $Q_{16}$ and $Q_{17}$ and compared with the presently received frequency through $Q_{18}$ in response to the actuation of the UP key and during the search operation. If $f_{max}$ is exceeded, $Q_{19}$ is conducted to decide whether w is set. If YES search is reset to thereby complete the search operation.

HOURS, MINUTES AND SECONDS SETTINGS (FIG. 12B)

During the timekeeper correction mode or the alarm or timer setting mode hours, minutes or seconds are selectable through the use of the HOUR, MIN or SEC key. $R_{13}$ of FIG. 12(B) is reached by the actuation of any of the HOURS, MIN and SEC keys, thus deciding whether any digit is introduced. If NO, the HOUR, MIN or SEC key is invalid. $R_{14}$ decides whether ⊕ is set and provides the YES answer in the progress of the setting operation wherein time information is changeable in units of hours, minutes and seconds. When new information is being introduced, the NO answer is provided to adopt the 24 hours system through $A_1$ and $B_1$. Lower two digits of the introduced data are loaded into part of the Y register in units of hours during $R_{15}$, in units of minutes during $R_{16}$ and in units of seconds during $R_{17}$. The introduced data are held in the Y register and displayed through the display steps from $n_{13}$ to $n_6$ and $n_7$.

TIME CORRECTION ROUTINE (FIG. 12A)

After hours, minutes and seconds are set as described above, the TIMER key is actuated. The data held in the Y register are in the form of either the 24 hour system or the 12 hour system and unconditionally changed into the 24 hour system via $R_3$–$R_6$. If NO during $R_3$, the data in the Y register are of the 24 hour system. Contrarily, if YES at $B_1$ the data in the Y register should be changed from the 12 hour system to the 24 hour system.

Thereafter, during the time correction mode $R_6$ answers as YES. The time counter region of RAM is loaded with the data of the 24 hour system. The time display flags are set, returning to the display routine. The data in the time counter region are visually displayed through the steps $n_5$–$n_7$ after the changing of the hour system.

SELECTION OF 12/24 HOUR SYSTEM DURING TIME SETTING (FIG. 12B)

The 12/24 hour system is selectable by the actuation of the |AM| or |PM| key. The 12 hour system is selected in response to the actuations of the |AM| and |PM| keys. Upon the actuation of the |AM| key a flag AM is set and upon that of the |PM| key a flag PM is set.

Figure 19:
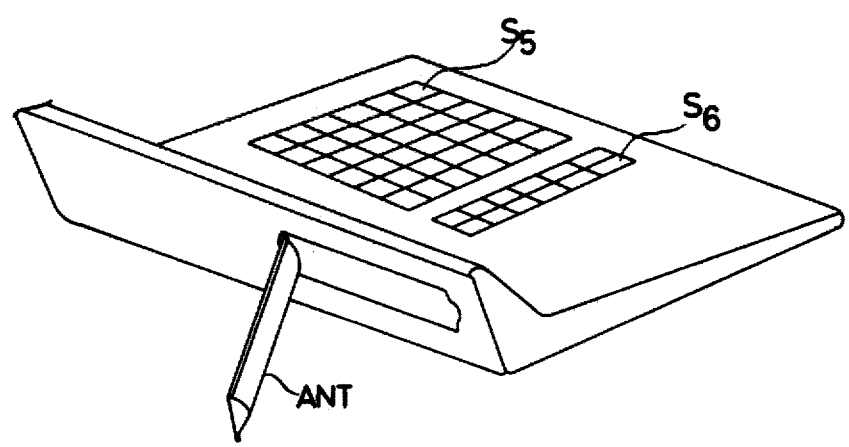
FIG. 19 is a perspective view of an antenna device on the apparatus.

FIG. 19 shows a perspective view of the electronic apparatus according to the present invention. Since the present apparatus has the calculator functions and the electronically tuning radio receiver functions, it is possible for the operator to operate the calculator while listening to the radio receiver. The apparatus is therefore provided with a rotatable antenna device (for example, a ferrite bar antenna) to place the radio receiver in the optimum condition without moving the apparatus per se.

Figure 20A:
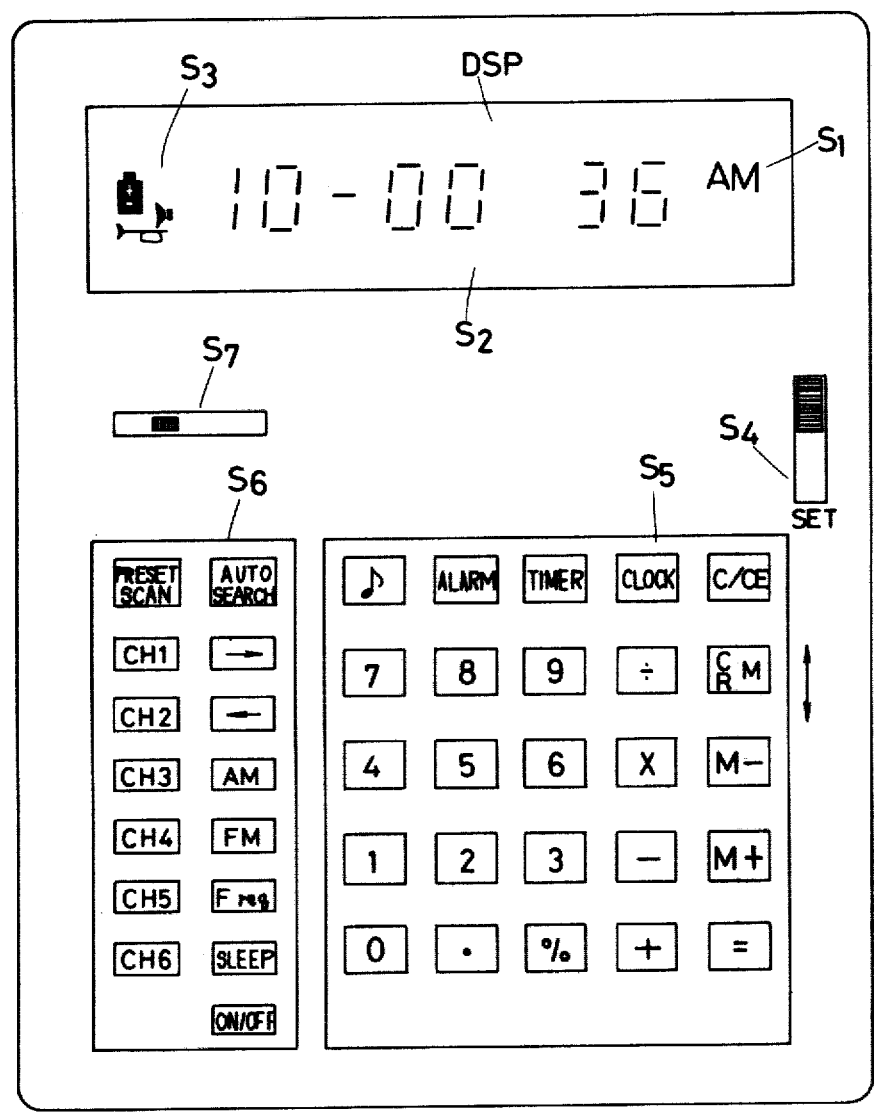
FIGS. 20(A) and 20(B) are plan views of a keyboard on the apparatus in the calculator mode and the timekeeper mode, respectively.
Figure 20B:
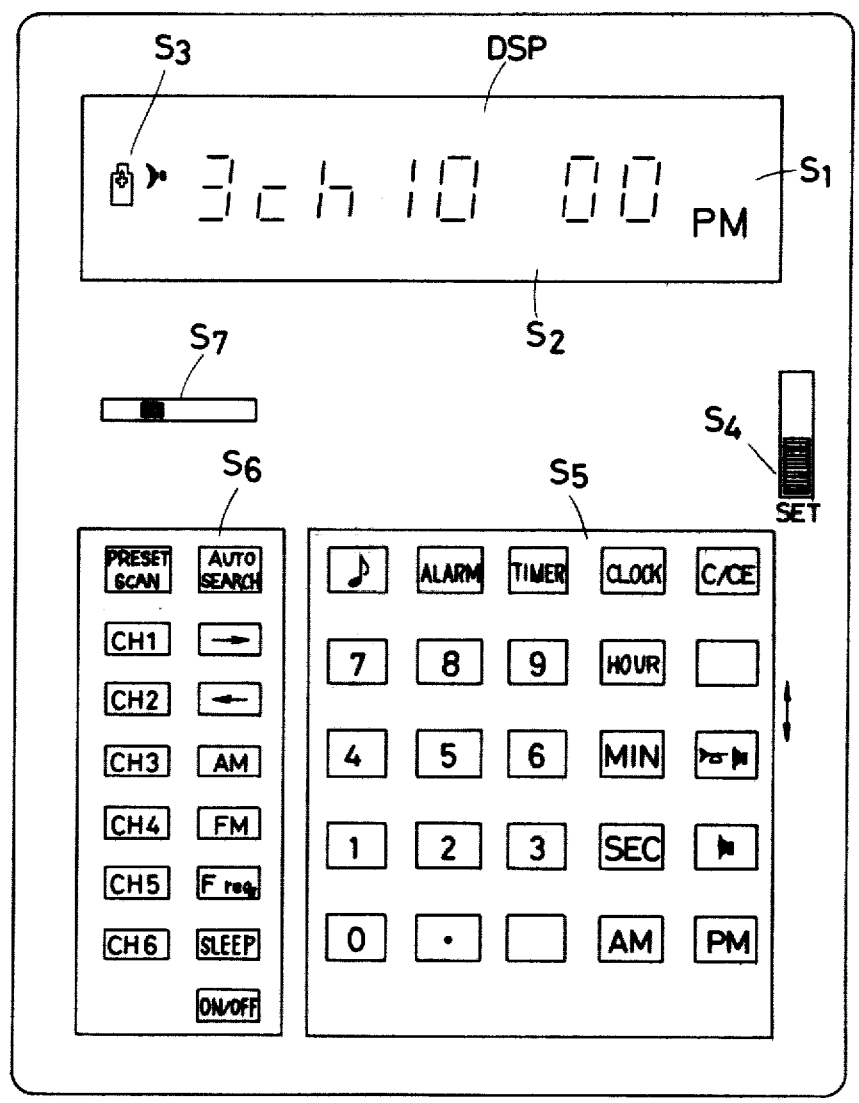

FIG. 20 is a plan view of another example of the operational board of the apparatus according to the present invention, which relies upon the use of a slidable key marking sheet. In association of the movement of the mode selector switch $S_4$ key markings are changed between the calculator mode (FIG. 20A) and the timekeeper mode (FIG. 20B) with changing their definitions.

Figure 21:
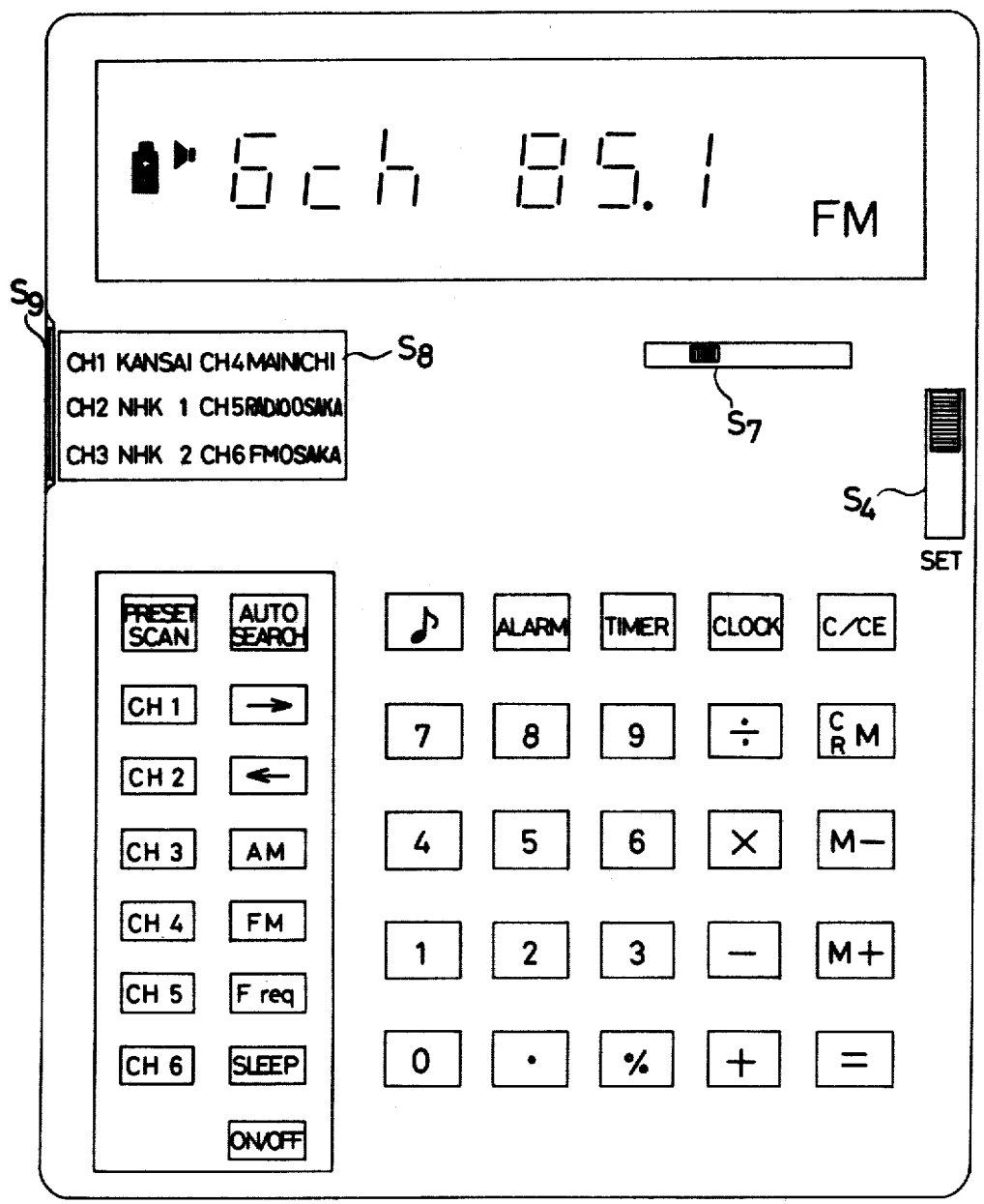
FIG. 21 is a plan view of another example of the keyboard.

An example shown in FIG. 21 has a slot $S_9$ wherein a card $S_8$ carrying channel numbers and broadcasting station names in insertable. Of course, the card can carry any other information. Although the present invention has been disclosed and illustrated in terms of the combined calculator and also receiver, the radio receiver governed by the microprocessor and the PLL circuitry per se is considered as new and effective in many aspects.

Whereas the present invention has been described with respect to specific embodiments thereof, it will be understood that various changes and modifications will be suggested to one skilled in the art, and it is intended to encompass such changes and modifications as fall within the scope of the appended claims.

We claim:

1. An electronic information handling means comprising:
   input means for providing data;
   calculator means fo performing arithmetic operations on said data, said calculator means including processor means for performing arithmetic calculations on said data and storage means for storing necessary information including said input data and results of said arithmetic calculations;
   a radio receiver means for receiving radio frequency waves and for converting said waves into audio waves, said radio receiver means including automatic channel selection means, said automatic channel selection means utilizing said processor means to perform necessary calculations for the selection of desired radio stations;
   said processor means thereby being selectively used as part of said calculator means or for performing necessary calculations for said automatic channel selection means.

2. The information handling means of claim 1 wherein said processor means is a microprocessor.

3. The information handling means of claim 1 wherein said calculator means and radio receiver means are simultaneously operable.

4. The electronic information handling means of claim 1 further comprising an alarm timepiece having an output indicative of time of day, said alarm timepiece utilizing said processor means to perform the timepiece alarm operations.

5. The electronic information handling means of claim 4 wherein said radio receiver means may be selectively energized and de-energized in response to the timepiece alarm operations at the same time said calculator is performing arithmetic operations.

6. The electronic information handling means of claim 5 wherein said automatic channel selection means sequentially receives information from said storage means during the selection of a desired channel.

7. The electronic information handling means of claim 6 wherein said radio receiver means includes:
   antenna means for receiving said radio frequency waves and for producing a radio frequency signal; and
   mixer means for converting said radio frequency signal into an intermediate frequency signal, said mixer means receiving a mixing frequency from said automatic channel selection means;
   said mixing frequency being calculated by said processor means from information provided from said memory means, said mixing frequency being varied to sequentially scan said radio frequency waves to select a desired radio station.

8. The electronic information handling means of claim 7 wherein said storage means includes:
   a read only memory (ROM); and
   a random access memory (RAM);
   wherein said read only memory is used for storage of instructions therein; and
   wherein said random access memory is used for storage of intermediate calculation results and input information;
   said read only memory and said random access memory functioning as the only memories for said calculator means and said automatic channel selection means.

9. The electronic information handling means of claim 7 wherein the frequency of said desired radio station is digitally selectable by the user through the entry of digital data using said input means.

10. The electronic information handling means of claim 9 wherein the frequency of said desired radio station may be displayed on a display.

11. The electronic information handling means of claim 10 wherein the calculation results may also be displayed on the display.

12. The electronic information handling means of claim 11 wherein the display includes a plurality of characters, the same characters being used to display the output of said alarm timepiece, said calculator means, and the frequency of said desired radio station.

13. The electronic information handling means of claim 10 wherein alarm times may be stored in said storage means; and
   wherein the arithmetic operations being performed by said calculator means may be completed before an alarm time is displayed.

14. The electronic information handling means of claim 9 wherein mixing frequencies produced by said processor means are restricted to frequencies in which receipt of a desired radio station is possible, the selection of other frequencies causing an error indication to be produced.

15. The electronic information handling means of claim 14 wherein said storage means stores data corresponding to a plurality of preselected channels; and
   wherein said preselected channel data may be recalled by the user to produce a mixing frequency corresponding to the preselected channel selected to thus select the radio station corresponding to said preselected channel data.

16. The electronic information handling means of claim 15 wherein said automatic channel selection means may scan said preselected channels.

17. The electronic information handling means of claim 14 wherein said automatic channel selection means scans from the lowest unrestricted frequency to the highest unrestricted frequency by searching each serviceable broadcasting frequency therebetween.

18. The electronic information handling means of claim 17 wherein the serviceable frequencies searched by said automatic channel selection means may be varied to correspond to those frequencies actually used in the geographical area in which said information handling means is to be used.

19. The electronic information handling means of claim 4 wherein the alarm timepiece includes means for terminating operation of said calculation means after a predetermined period where no arithmetic operations are performed.

20. The electronic information handling means of claim 19 wherein the output of said alarm timepiece is displayed when the operation of said calculator means is terminated by said means for terminating.

21. The electronic information handling means of claim 19 wherein one timepiece alarm operation performed by said alarm timepiece and said processor means energizes said radio receiver means after a predetermined time duration.

22. The electronic information handling means of claim 21 wherein said timepiece alarm operations furlther include a sleep function wherein said radio receiver means may be de-energized after a predetermined time duration which is operator selectable.

* * * * *